United States Patent
Tsai et al.

(10) Patent No.: US 12,199,084 B2
(45) Date of Patent: Jan. 14, 2025

(54) FAN-OUT PACKAGE WITH CAVITY SUBSTRATE

(71) Applicant: Taiwan Semiconductor Manufacturing Co., Ltd., Hsinchu (TW)

(72) Inventors: Po-Hao Tsai, Taoyuan (TW); Techi Wong, Zhubei (TW); Po-Yao Chuang, Hsinchu (TW); Shin-Puu Jeng, Hsinchu (TW); Meng-Wei Chou, Zhubei (TW); Meng-Liang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/525,976

(22) Filed: Dec. 1, 2023

(65) Prior Publication Data

US 2024/0105705 A1    Mar. 28, 2024

Related U.S. Application Data

(63) Continuation of application No. 17/808,621, filed on Jun. 24, 2022, now Pat. No. 11,855,059, which is a
(Continued)

(51) Int. Cl.
*H01L 25/18* (2023.01)
*H01L 21/56* (2006.01)
(Continued)

(52) U.S. Cl.
CPC .......... *H01L 25/18* (2013.01); *H01L 21/566* (2013.01); *H01L 23/3114* (2013.01); *H01L 23/3128* (2013.01); *H01L 24/09* (2013.01); *H01L 24/17* (2013.01); *H01L 24/32* (2013.01); *H01L 24/73* (2013.01); *H01L 2224/0231* (2013.01); *H01L 2224/02379* (2013.01); *H01L 2224/0401* (2013.01)

(58) Field of Classification Search
None
See application file for complete search history.

(56) References Cited

U.S. PATENT DOCUMENTS 6,709,898 B1    3/2004   Ma et al.
7,242,092 B2    7/2007   Hsu
(Continued)

FOREIGN PATENT DOCUMENTS

CN    106469656 A    3/2017
CN    106992170 A    7/2017
(Continued)

*Primary Examiner* — Kyoung Lee
(74) *Attorney, Agent, or Firm* — Slater Matsil, LLP

(57) ABSTRACT

Structures and methods of forming fan-out packages are provided. The packages described herein may include a cavity substrate, one or more semiconductor devices located in a cavity of the cavity substrate, and one or more redistribution structures. Embodiments include a cavity preformed in a cavity substrate. Various devices, such as integrated circuit dies, packages, or the like, may be placed in the cavity. Redistribution structures may also be formed.

20 Claims, 47 Drawing Sheets

Related U.S. Application Data continuation of application No. 17/068,026, filed on Oct. 12, 2020, now Pat. No. 11,380,666, which is a continuation of application No. 16/193,358, filed on Nov. 16, 2018, now Pat. No. 10,804,254.

(60) Provisional application No. 62/691,899, filed on Jun. 29, 2018.

(51) Int. Cl.
*H01L 23/00* (2006.01)
*H01L 23/31* (2006.01)

(56) References Cited

U.S. PATENT DOCUMENTS

| | | |
|---|---|---|
| 8,350,377 B2 | 1/2013 | Yang |
| 9,812,381 B1 | 11/2017 | Wu et al. |
| 9,991,219 B2 | 6/2018 | Seol et al. |
| 2006/0186536 A1 | 8/2006 | Hsu |
| 2007/0289127 A1 | 12/2007 | Hurwitz et al. |
| 2008/0142946 A1 | 6/2008 | Yang et al. |
| 2012/0056312 A1 | 3/2012 | Pagaila et al. |
| 2013/0001770 A1 | 1/2013 | Liu |
| 2015/0145142 A1* | 5/2015 | Lin ............... H01L 23/481 257/774 |
| 2018/0076158 A1 | 3/2018 | Fang et al. |
| 2018/0096927 A1 | 4/2018 | Kim et al. |
| 2020/0027852 A1 | 1/2020 | Chen et al. |

FOREIGN PATENT DOCUMENTS

| | | |
|---|---|---|
| CN | 107665887 A | 2/2018 |
| TW | 201813020 A | 4/2018 |
| TW | 201814861 A | 4/2018 |
| WO | 2016069112 A1 | 5/2016 |

* cited by examiner

FAN-OUT PACKAGE WITH CAVITY SUBSTRATE

PRIORITY CLAIM

This application is a continuation of U.S. patent application Ser. No. 17/808,621, filed on Jun. 24, 2022, which is a continuation of U.S. patent application Ser. No. 17/068,026, filed on Oct. 12, 2020, now U.S. Pat. No. 11,380,666 issued on Jul. 5, 2022, which is a continuation of U.S. patent application Ser. No. 16/193,358, filed on Nov. 16, 2018, now U.S. Pat. No. 10,804,254 issued Oct. 13, 2020, which claims the benefit of U.S. Provisional Application No. 62/691,899, filed on Jun. 29, 2018, each application is hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high-performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 80A through 84A illustrate cross-sectional views of intermediate steps for forming integrated packages, in accordance with some embodiments.

DETAILED DESCRIPTION

Figure 1:
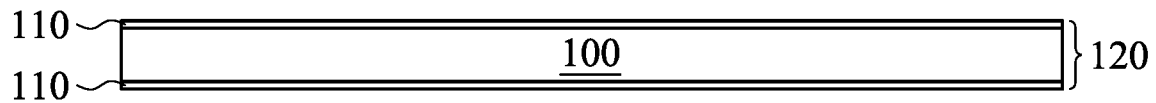
FIGS. 1 through 18 illustrate cross-sectional views of forming integrated fan-out packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed below provide an InFO-type package using a heterogeneous substrate. Generally, integrated circuits are encapsulated in a heterogeneous substrate, wherein the heterogeneous substrate may include a pre-formed or laminated structure in combination with an encapsulating material such as a molding compound. Cavities may be formed in the heterogeneous substrate to reduce an overall height of the package. Additionally, the cavities may extend through the heterogeneous substrate in order to provide greater flexibility in the dimensions of the integrated circuits while maintaining a smaller overall height. Furthermore, the heterogeneous substrate may include metallization layers providing a redistribution of signals per requirements for a particular design. Redistribution structures may further be formed on either or both sides of the integrated circuits and the heterogeneous substrate.

FIGS. 1 through 18 illustrate cross-sectional views of intermediate steps of forming structures using InFO packages having cavity substrates, in accordance with some embodiments.

Referring first to FIG. 1 there is shown a substrate 120 including an insulation layer 100 with conductive layers 110 on both sides of the insulation layer 100, in accordance with some embodiments. In some embodiments, substrate 120 is a double-sided copper clad laminate (CCL). The insulation layer 100 may be a pre-impregnated composite fiber (prepreg), ajinomoto build-up film (ABF), paper, glass fiber, non-woven glass fabric, other insulating materials or combinations thereof. The conductive layers no may be one or more layers of copper, nickel, aluminum, other conductive materials or combination thereof laminated or formed onto opposing sides of the insulation layer 100.

Figure 2:
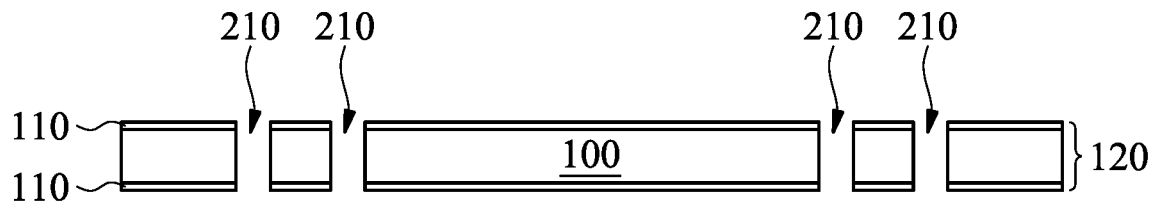

Referring to FIG. 2, openings 210 are formed in the substrate 120. In some embodiments, the openings 210 are formed by laser drilling. Other processes, e.g., mechanical drilling, etching, or the like, may also be used. The top-view shape of openings 210 may be rectangular, circular, or any other shape.

Figure 3:
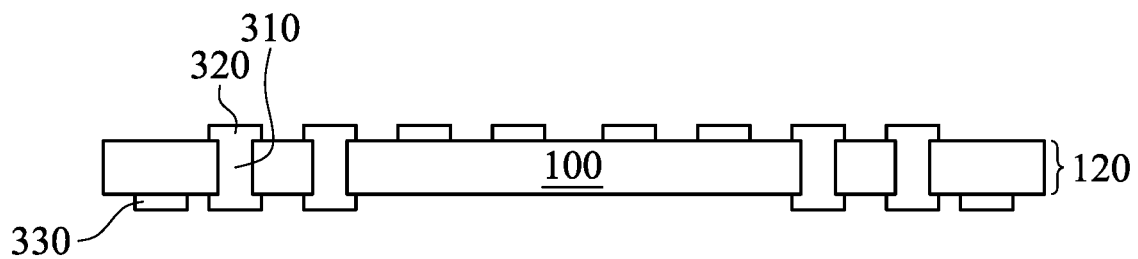

Referring to FIG. 3, the openings 210 (see FIG. 2) are filled to form conductive plugs 310 and conductive traces 320 and 330, in accordance with some embodiments. Conductive traces, such as conductive traces 320 and 330, can be used to form routing lines to redistribute electrical signals or as die connector pads to which die connectors may be attached. Prior to depositing conductive material within the openings 210, a surface preparation process may be performed. The surface preparation process may include cleaning the exposed surfaces of the substrate 120 (e.g., surfaces of conductive layers no and of the insulation layer 100 in openings 210) with one or more cleaning solutions (e.g., sulfuric acid, chromic acid, neutralizing alkaline solution, water rinse etc.) to remove or reduce soil, oils, and/or native oxide films. A desmear process may be performed to clean the area near the openings 210, which may have been smeared with the material of the insulation layer 100 that was removed to form the openings 210. The desmearing may be accomplished mechanically (e.g., blasting with a fine abrasive in a wet slurry), chemically (e.g., rinsing with a combination of organic solvents, permanganate etc.), or by a combination of mechanical and chemical desmearing. Following cleaning, treatment with a chemical conditioner, which facilitates adsorption of an activator used during subsequent electroless plating, may be used. In some embodiments, the conditioning step may be followed by micro-etching conductive layers no to micro-roughen the conductive surface for better bonding between the metal foil and the later deposited conductive material.

Forming the conductive plugs 310 and the conductive traces 320 and 330 may include forming a patterned mask layer and selectively depositing conductive materials (e.g., copper, other metals, metal alloys, or the like) in the openings in the patterned mask layer using a metal electroless plating technique. The patterned mask layer may be formed by coating the surface with a photoresist layer, exposing the photoresist layer to an optical pattern, and developing the exposed photoresist layer to form openings in the photoresist layer that define a pattern of the region where conductive material may be selectively deposited.

After forming the conductive traces 320 and 330, the patterned mask layer (e.g., the photoresist) may be stripped. Portions of the conductive layers no that were covered by the patterned mask layer may be removed using a suitable etching process. Removal of the unwanted portions of the conductive layers no prevents unwanted electrical shorts between the conductive features formed in the regions that were exposed by the patterned mask layer. Conductive plugs 310 and patterned conductive traces 320 and 330 are formed in this manner on both sides of the wafer. The cross-sectional view shown in FIG. 3 illustrates the state of the wafer after the conductive layers no have been etched as described above.

As discussed in greater detail below, the substrate 120 will act as a base for forming a cavity substrate. In FIG. 3, the conductive traces 330 are formed on the side of the insulating layer 100 in which the cavity is formed during subsequent processing steps. In accordance with some embodiments conductive traces 330 may be omitted from the region in which the cavity may be subsequently formed, e.g., the region between the innermost conductive plugs 310 in this example.

Although not shown in this example, it is understood that the method of using a metal-clad laminate, forming openings extending through the metal-clad laminate, forming a patterned conductive trace layer (e.g., using electroless deposition, or electroplating, or the like), and removing unwanted metal cladding may be performed repeatedly to vertically stack multiple alternating layers of insulation material and conductive traces with conductive plugs for connecting vertically adjacent layers of conductive traces.

Figure 4:
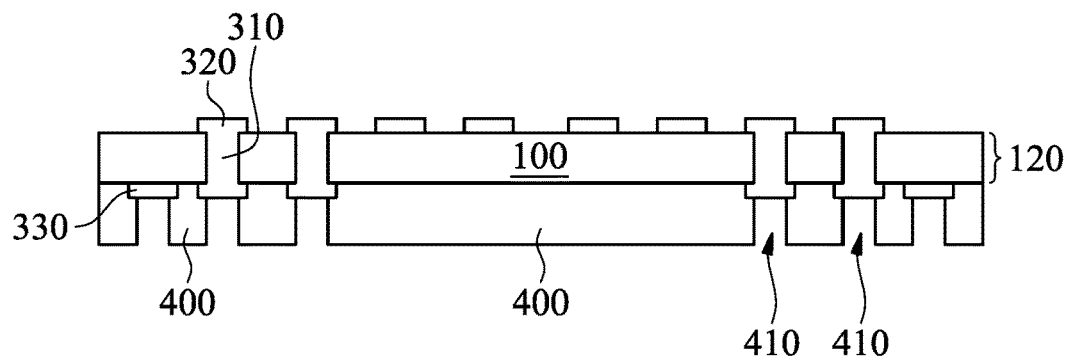

Referring now to FIG. 4, a dielectric layer 400 is placed on a side of the substrate 120 in accordance with some embodiments. Layer 400 may be used as a masking layer and may be removed in subsequent processing steps in some embodiments. In the description of embodiments in this document, layer 400 may also be referred to as sacrificial layer 400 although in some embodiments layer 400 is retained in the structure. As will be discussed in greater detail below, conductive pillars will be formed over one side of the substrate 120 and a cavity will be formed on the same side of the substrate 120. The sacrificial layer 400 is formed on the side of the substrate 120 on which the conductive pillars and the cavity are to be formed. In some embodiments, the sacrificial layer 400 is formed of ABF and is laminated onto the substrate 120. Other materials, such as a prepreg material, may also be used. Additionally, a material, such as a polymer, photoresist, a dielectric (e.g., silicon oxide, silicon nitride, or the like) may also be deposited to form the sacrificial layer 400.

Openings 410 are formed in sacrificial layer 400 by, for example, laser drilling to expose conductive traces 330 to which electrical connections are be made, as discussed in greater detail below. Other methods, such as mechanical drilling, wet or dry etching techniques, photolithography techniques, or the like, may also be used to form the openings 410.

Figure 5:
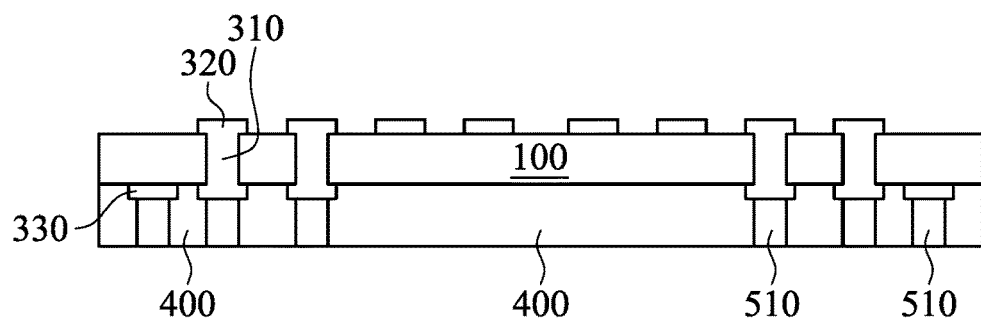

Next, as illustrated in FIG. 5, the openings 410 (shown in FIG. 4) are filled by depositing a conductive material, thereby forming conductive plugs 510. The conductive plugs 510 may be formed of a metal (e.g., copper), a metal alloy, or the like, using, e.g., electroless plating, or electroplating, or any other suitable process, or a combination thereof. A planarization process, such as chemical mechanical polish (CMP) or grinding, may be used to remove excess materials if needed.

Figure 6:
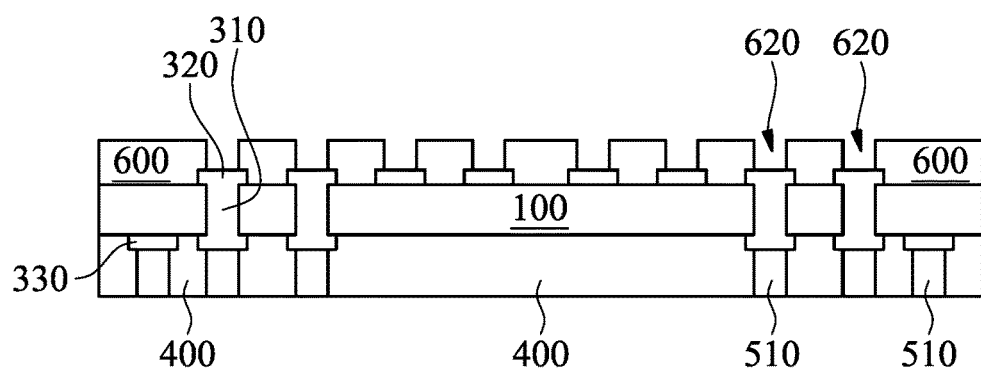

Referring now to FIG. 6, in some embodiments, a protective layer 600 (e.g., solder resist) is formed over the conductive traces 320 to protect areas of the insulation layer 100 from external damage. In some embodiments, the protective layer 600 is formed by depositing a layer of photosensitive material, exposing the layer with an optical pattern, and developing the exposed layer to form openings 620. In other embodiments, protective layer 600 may be formed by depositing a non-photosensitive dielectric layer (e.g., silicon oxide, or silicon nitride, or the like), forming a patterned photoresist mask over the dielectric layer using photolithography techniques, and etching the dielectric to form openings 620 using a suitable etching process (e.g., dry etching). Other processes and materials may also be used. Openings 620 expose underlying portions of conductive traces 320 that may be used as die connector pads to which die connectors can be attached.

Figure 7:
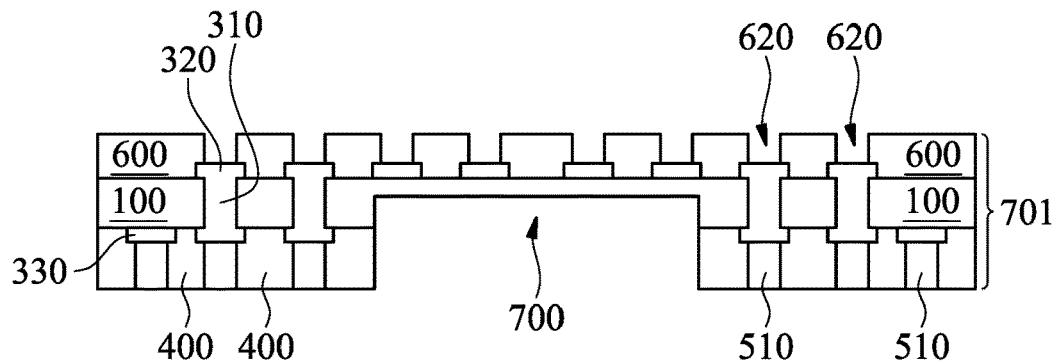

In FIG. 7 a cavity 700 is formed by removing a portion of the sacrificial layer 400 and insulation layer 100 in accordance with some embodiments. Removal of a portion of the insulation layer 100 does not affect the conductive traces 330 located on the same side of the insulation layer 100 that is recessed by this removal process. As mentioned above with reference to FIG. 3, the patterned mask used to form conductive traces 330 may be designed to exclude conductive traces 330 from being formed over a portion of the insulating layer 100 where the cavity 700 is formed. Removal of material to form the cavity 700 may be performed by a computer numeric control (CNC) machining process where material is removed by a mechanical drill whose position is precisely controlled by computer software to within ±20 nm. As illustrated in FIG. 7, the resulting structure is a cavity substrate 701, wherein the depth of the cavity may be from about 70 microns to about 500 microns in accordance with some embodiments. In some embodiments, a thickness from about 20 microns to about 50 microns of the insulation layer 100 remains along a bottom of the cavity 700. Other processes may also be used to form the cavity 700, such as laser drilling, etching, and/or the like.

Figure 8:
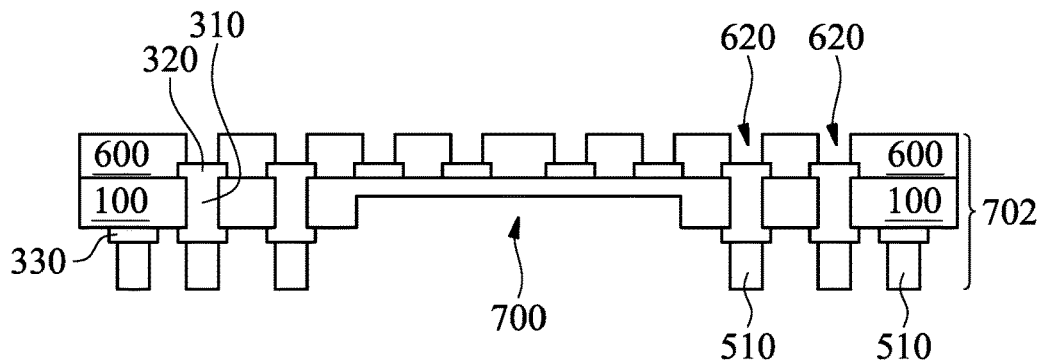

As illustrated in FIG. 8, the remaining sacrificial layer 400 may be removed after forming cavity 700 to form a cavity substrate 702, in accordance with some embodiments. The sacrificial layer 400 may be removed by a suitable etching technique, such as plasma etching. The process gas may include $SF_6$, $CF_4$, Ar, $O_2$, or other suitable gases, or mixtures thereof, as etchants.

Figure 9:
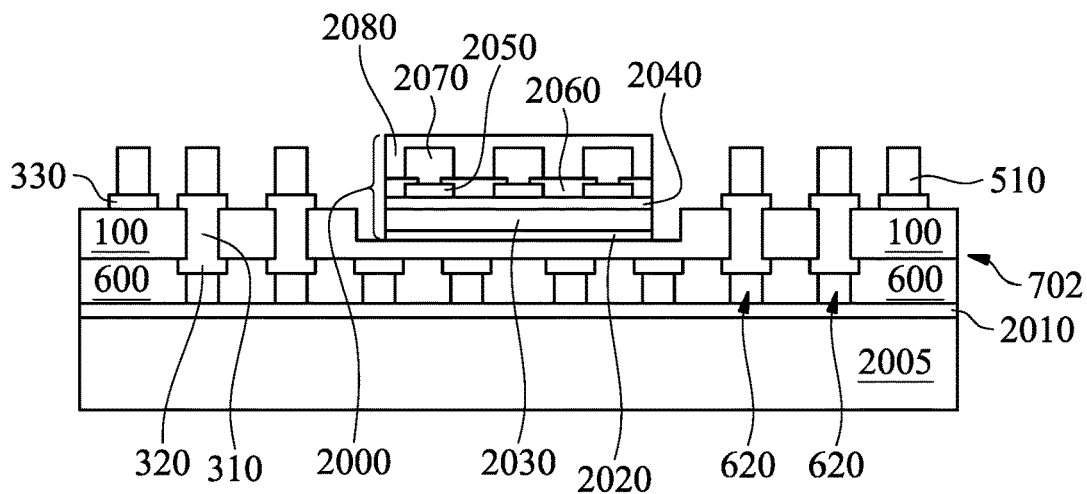

Referring now to FIG. 9, there is shown the cavity substrate 702 placed over a carrier substrate 2005 with a release layer 2010 formed on its surface, in accordance with some embodiments. As illustrated in FIG. 9, the cavity substrate 702 may be attached to the carrier substrate 2005 using a release layer 2010 such that the cavity 700 (see FIG. 8) is located opposite the release layer 2010. The carrier substrate 2005 may be a glass carrier substrate, a ceramic carrier substrate, or the like. The release layer 2010 may be a polymer-based material, an epoxy-based thermal-release material such as a light-to-heat-conversion (LTHC) release coating, or ultra-violet (UV) glue (a glue which loses its adhesive property when exposed to UV light). The release layer 2010 may aid in the removal of the carrier substrate 2005 during subsequent processing. Additionally, the release layer 2010 may be removed along with the carrier substrate 2005 during subsequent processing.

A device 2000 may be placed inside the cavity 700 (shown in FIG. 8) of the cavity substrate 702 using a pick-and-place (PnP) tool. The device 2000 may be an integrated circuit die, a packaged die, an integrated passive device (IPD), an interposer, an antenna-in-package (AIP), a micro-electro-mechanical system (MEMS) package, or the like. In some embodiments, device 2000 is adhered to the insulation layer 100 by an adhesive 2020, as illustrated in FIG. 9. Although FIG. 9 illustrates one device 2000 placed in cavity 700, it should be appreciated that multiple dies may also be placed in cavity 700 of cavity substrate 702. For example, in some embodiments, the device 2000 may be a plurality of devices placed laterally adjacent one another and/or stacked upon each other, wherein the multiple devices may have the same or different sizes.

In the example illustrated in FIG. 9, device 2000 is a semiconductor device, e.g., an integrated circuit die such as, a logic die (e.g., microprocessor, microcontroller, etc.), a memory die (e.g., dynamic random access memory (DRAM), static random access memory (SRAM), etc.), a system-on-a-chip (SoC) die (e.g., power management integrated circuit (PMIC), mixed signal integrated circuit, etc.), a radio frequency integrated circuit (RFIC) die, a digital signal processing (DSP) die, the like, or a combination thereof. Before being placed onto the cavity substrate 702, the device 2000 may be processed according to applicable manufacturing processes to form the respective device structure. For example, in FIG. 9, device 2000 may have been processed to form integrated circuits within the device 2000. As illustrated in FIG. 9, the device 2000 is shown including a semiconductor substrate 2030, interconnect structures (represented by element 2040), pads 2050, a passivation layer 2060, die connectors 2070, and an encapsulation layer 2080.

The semiconductor substrate 2030 may be a bulk substrate or an active layer of a semiconductor-on-insulator (SOI) substrate and may include a group-IV semiconductor such as silicon and germanium, a compound semiconductor, and/or an alloy semiconductor; doped or undoped. Devices, such as transistors, diodes, capacitors, resistors, etc., may be formed in and/or on the semiconductor substrate 2030. The interconnect structures 2040 may include, for example, metallization patterns in one or more dielectric layers formed on the semiconductor substrate 2030 to interconnect the devices formed in and/or semiconductor substrate 2030 to form an integrated circuit. The pads 2050 of device 2000 may be conductive pads (e.g., aluminum pads, or copper pads, or the like) to which external connections are made. Passivation films 2060 are formed on a dielectric layer of the interconnect structure 2040 and on portions of the pads 2050. Die connectors 2070, such as conductive pillars (e.g., including a metal such as copper), extend through the passivation films 2060 and are mechanically and electrically coupled to the respective pads 2050. The die connectors 2070 may be formed by, for example, plating, or the like. An encapsulation layer 2080 of dielectric material is formed on the passivation films 2060 and the die connectors 2070. The dielectric material of the encapsulation layer 2080 laterally encapsulates the die connectors 2070, and the encapsulation layer 2080 may extend laterally to the edges of the device 2000. The dielectric material of encapsulation layer 2080 may be a polymer such as polybenzoxazole (PBO), benzocyclobutene (BCB) based polymer, polyimide, or the like; a nitride such as silicon nitride or the like; an oxide such as silicon oxide, PSG, BSG, BPSG, or the like; the like, or combinations thereof, and may be formed, for example, by spin coating, lamination, CVD, or the like. In FIG. 9 the die connectors 2070 of the singulated device 2000 are shown covered by the encapsulation layer 2080, in accordance with some embodiments. In some other embodiments, the die connectors 2070 of the singulated device 2000 may have an exposed top conductive surface prior to singulation. The side of device 2000 where pads 2050, a passivation layer 2060, die connectors 2070, and an encapsulation layer 2080 are located may be referred to as the active side of the device 2000 and the side opposite the active side may be referred to as the backside of the device 2000.

The adhesive 2020 on a backside of the device 2000 can attach the device 2000 to the insulation layer 100. The adhesive 2020 may be any suitable adhesive, epoxy, die attach film (DAF), or the like. The adhesive 2020 may be applied to a backside of the device 2000, such as to a backside of the respective semiconductor wafer prior to singulation. The device 2000 may be singulated, such as by sawing or dicing, and adhered to the dielectric layer 100 by the adhesive 2020 using, for example, PnP tool. In some embodiments, the adhesive 2020 may be attached to the device 2000 or the cavity substrate 702 prior to placing the device 2000 in the cavity 700.

Figure 10:
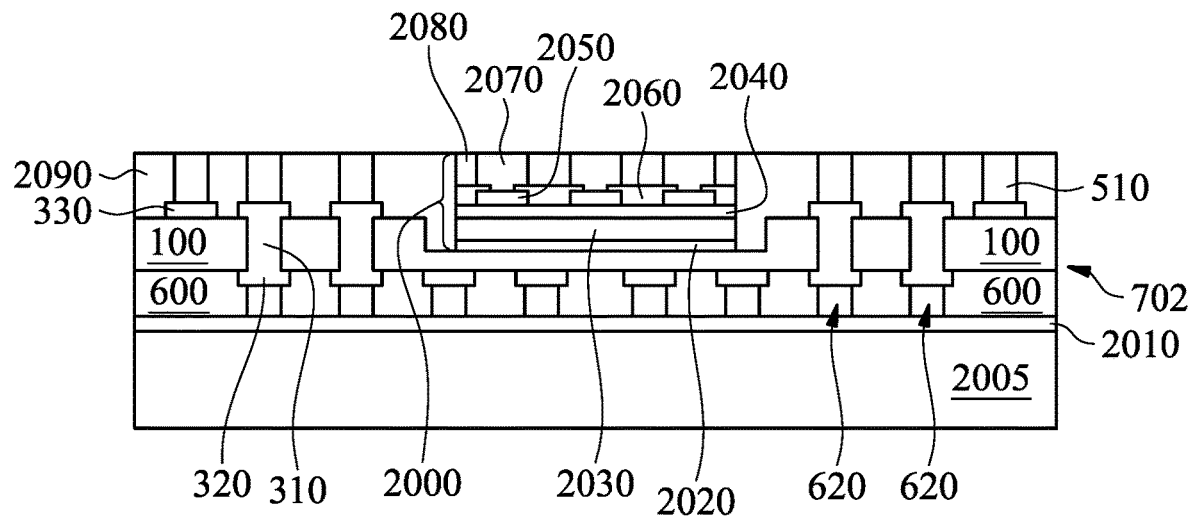

In FIG. 10, an encapsulant 2090 is formed on the various components in accordance with some embodiments. The encapsulant 2090 may be formed over the carrier substrate 2005 such that the conductive plugs 510 and the die connectors 2070 of the device 2000 are covered. The encapsulant 2090 may be then cured and a planarization process may be performed on the encapsulant 2090 to expose the conductive plugs 510 and the die connectors 2070. The planarization process may also grind the dielectric material 2080. The encapsulant 2090 may be a molding compound, epoxy, or the like, and may be applied by compression molding, transfer molding, or the like. Top surfaces of the conductive plugs 510, die connectors 2070, dielectric material 2080, and encapsulant 2090 may be substantially coplanar within process variations after the planarization process. The planarization process may be, for example, a chemical-mechanical polish (CMP), a grinding process, or the like.

As illustrated in FIG. 10, a portion of the device 2000 resides within the cavity 700 (see FIGS. 7-9) of the cavity substrate 702. The portion of the cavity unoccupied by the device 2000 is filled by the encapsulant 2090. Since the encapsulant 2090 fills the portion of the recess in the insulation layer 100 outside the device 2000, a topmost surface of the insulating layer 100 is higher than a bottommost surface of the encapsulant 2090. The bases of the conductive pillars 510 are positioned above the topmost surface of the insulating layer 100 which is higher than the backside of the device 2000. The top surfaces of the conductive pillars 510 are coplanar with the top surface of device 2000. Accordingly, as shown in FIG. 10, the height of the conductive pillars 510 is less than the height of the device 2000. Encapsulant 2090 also fills the space in between the conductive pillars 510 and the space between the device 2000 and the adjacent conductive pillars 510. The amount of encapsulant 2090 used depends on the depth of the cavity 700 relative to the height of the device 2000. The thickness of the encapsulant 2090 in the cavity substrate 702 may be non-uniform. For example, a portion of the encapsulant 2090 adjacent the device 2000 has a thickness greater than another portion of the encapsulant adjacent the conductive pillars 510.

FIGS. 11 through 14 illustrate the formation of an active-side redistribution structure 2100 over the die connectors 2070 on the active side of the encapsulated device 2000, in accordance with some embodiments. Redistribution structure 2100 includes a vertical stack of alternating layers of dielectric and conductive traces. Each layer of conductive traces is separated from vertically adjacent layers of conductive traces by a dielectric layer. The conductive traces extend through underlying dielectric layers to form conductive vias used to interconnect vertically adjacent conductive traces. The layers of conductive traces formed in the cavity substrate 702, such as layers 320 and 330, which are connected to each other by conductive plugs 310, may be electrically connected to the active-side redistribution structure 2100 by conductive plugs 510.

Figure 11:
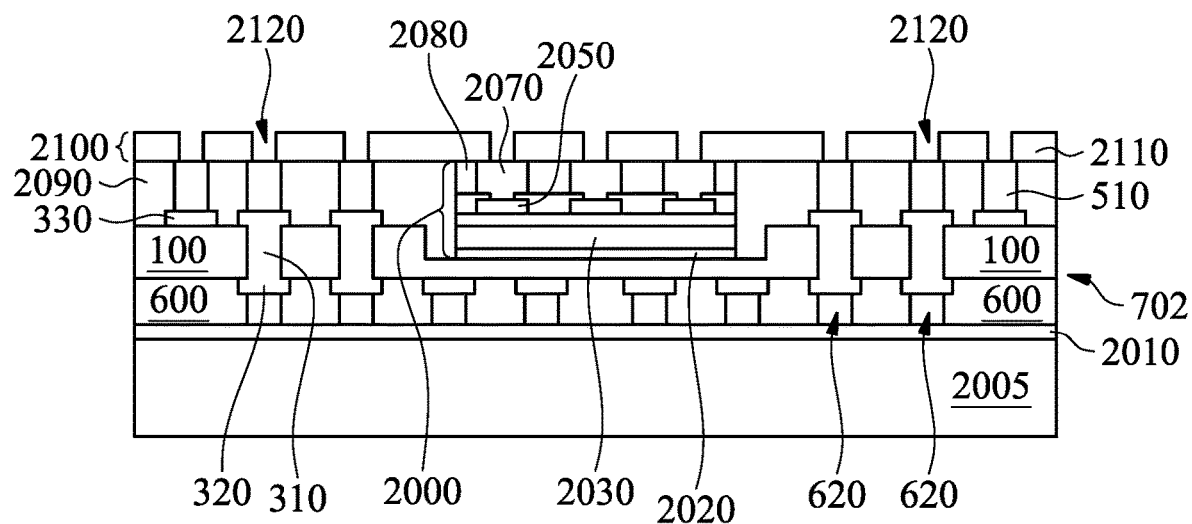

In FIG. 11 a dielectric layer 2110 is formed over the encapsulant 2090 and the device 2000. In some embodiments, the dielectric layer 2110 is formed of a polymer, which may be a photo-sensitive material such as PBO, polyimide, BCB, or the like, that may be patterned using a lithography mask. The dielectric layer 2110 may be formed by spin coating, lamination, chemical vapor deposition (CVD), the like, or a combination thereof. The dielectric layer 2110 is patterned to form openings 2120 to expose portions of the conductive die connectors 2070 and conductive plugs 510. The patterning may be done by exposing the dielectric layer 2110 to light when the dielectric layer 2110 is a photo-sensitive material. The dielectric layer 2110 may also be formed of materials which are not photo-sensitive such as silicon nitride, silicon oxide, phosphosilicate glass (PSG), borophosphosilicate glass (BPSG), or the like. Materials that are not photosensitive may be patterned by etching with a suitable etching process (e.g., anisotropic reactive ion etching) through a patterned photoresist mask.

Figure 12:
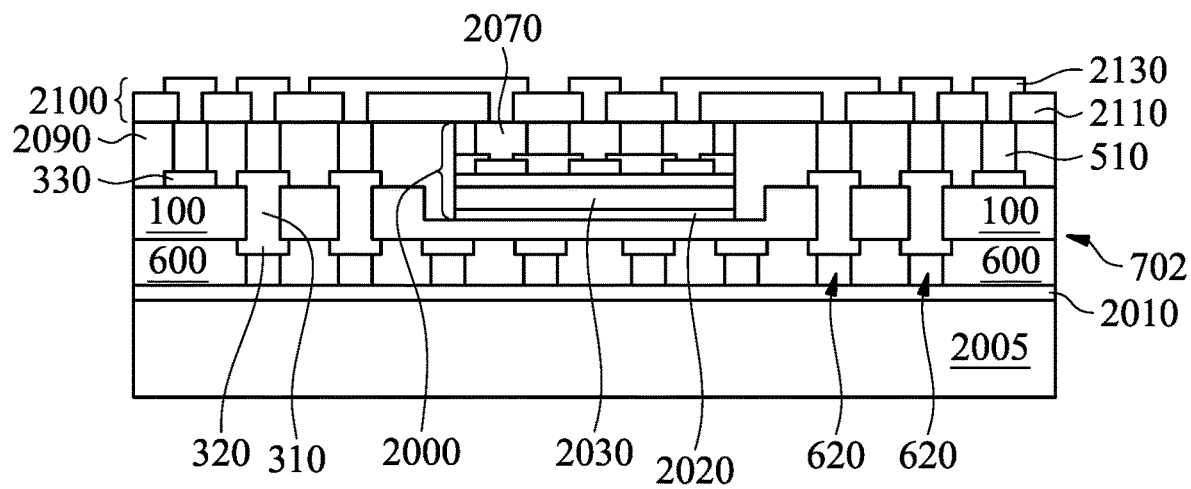

FIG. 12 shows a metallization pattern 2130 formed on and extending through the patterned dielectric layer 2110. In some embodiments the metallization pattern 2130 is formed by first forming a metallic seed layer (not shown) over the dielectric layer 2110, the sidewalls in the openings 2120 (shown in FIG. 11) through the dielectric layer 2110, and over exposed portions of the metallic patterns of die connectors 2070 and conductive plugs 510 at the bottom of openings 2120. The seed layer may include one or more layers of conductive materials, such as a copper layer or a composite layer of a titanium layer and a copper layer over the titanium layer. A layer of some other conductive material or a composite layer of several other conductive materials, or the like may also be used to form a seed layer. Any suitable deposition process (e.g., physical vapor deposition (PVD), CVD, or the like) may be used to form the seed layer. A patterned mask layer, such as a patterned photoresist masking layer (not shown), is then formed over the seed layer to expose portions of the seed layer through openings in the photoresist masking layer. The metallization pattern 2130 may be formed on the exposed portions of the seed layer in the openings of the photoresist. The material used to form metallization pattern 2130 may include a metal such as copper, titanium, tungsten, aluminum, or the like, and may be deposited using a suitable deposition process, such as electroplating or electroless plating, or the like. After the deposition process to form metallization pattern 2130 is completed, the photoresist is stripped using an acceptable process such as ashing, or exposing to oxygen plasma, or the like. Stripping the photoresist pattern exposes portions of the seed layer over which the material deposited using the photoresist mask was not formed. These exposed portions of the seed layer are removed using any acceptable chemical etching process (e.g., wet chemical etching or plasma etching, or the like). The remaining portions of the seed layer are included in the metallization pattern 2130. Metallization pattern 2130 includes conductive traces formed along the top surface of the dielectric layer 2110 and conductive vias through the dielectric layer 2110. The vias connect conductive traces of metallization 2130 electrically and physically to the metal pattern directly below the dielectric 2110 (e.g., the pattern comprising die connectors 2070 and conductive plugs 510).

The method of forming the patterned dielectric layer 2110 (shown in FIG. 11) and conductive traces and vias of metallization pattern 2130 (shown in FIG. 12) is described as an example. It should be appreciated that the processes for forming the dielectric and metallization patterns (layers 2110 and 2130, respectively) may be varied based on the specifications of the design, e.g., the desired minimum dimensions of the patterns. For example, in some embodiments a damascene process (single or dual damascene process) may be utilized. The redistribution structure 2100 may be built up by vertically stacking more of dielectric and metallization patterns.

Figure 13:
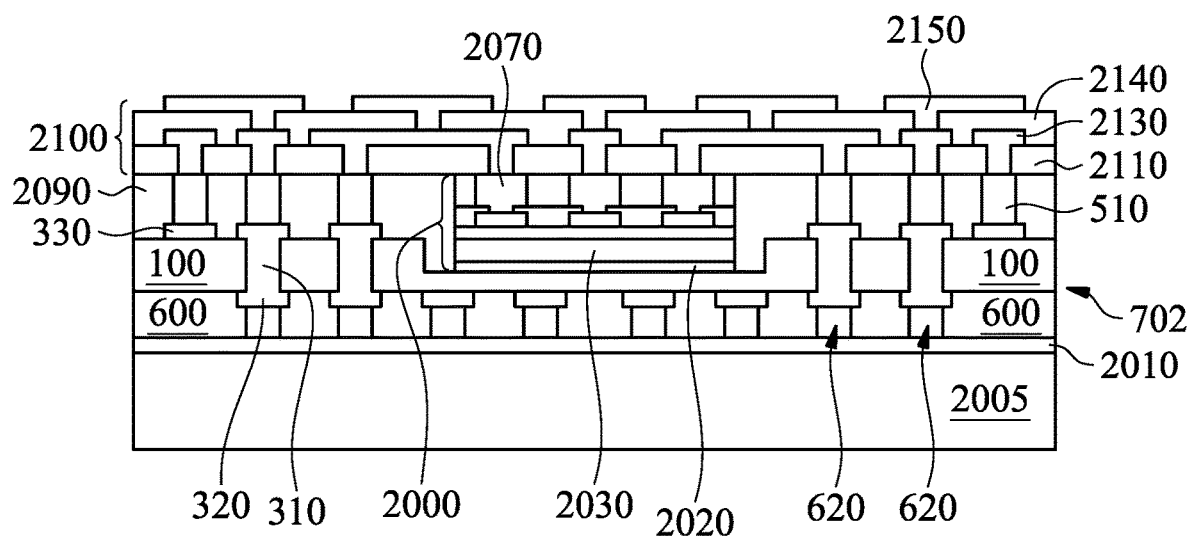

FIG. 13 illustrates a patterned dielectric layer 2140 formed over a top surface of dielectric layer 2110 and metallization layer 2130. Also shown in FIG. 13 is metallization pattern 2150. Metallization pattern 2150 includes conductive traces formed along the top surface of the dielectric layer 2140 and conductive vias through the dielectric layer 2140. The vias of metallization layer 2150 connect conductive traces of metallization 2150 electrically and physically to the metal pattern directly below the dielectric 2140 (e.g., the metallization pattern 2130). The processes and materials used to form dielectric layer 2110 and metallization pattern 2130 may be repeated to form dielectric layer 2140 and metallization pattern 2150.

More or fewer dielectric layers and metallization patterns may be formed in the front-side redistribution structure 2100. If fewer dielectric layers and metallization patterns are to be formed, steps and process discussed above may be omitted. If more dielectric layers and metallization patterns are to be formed, steps and processes discussed above may be repeated.

Figure 14:
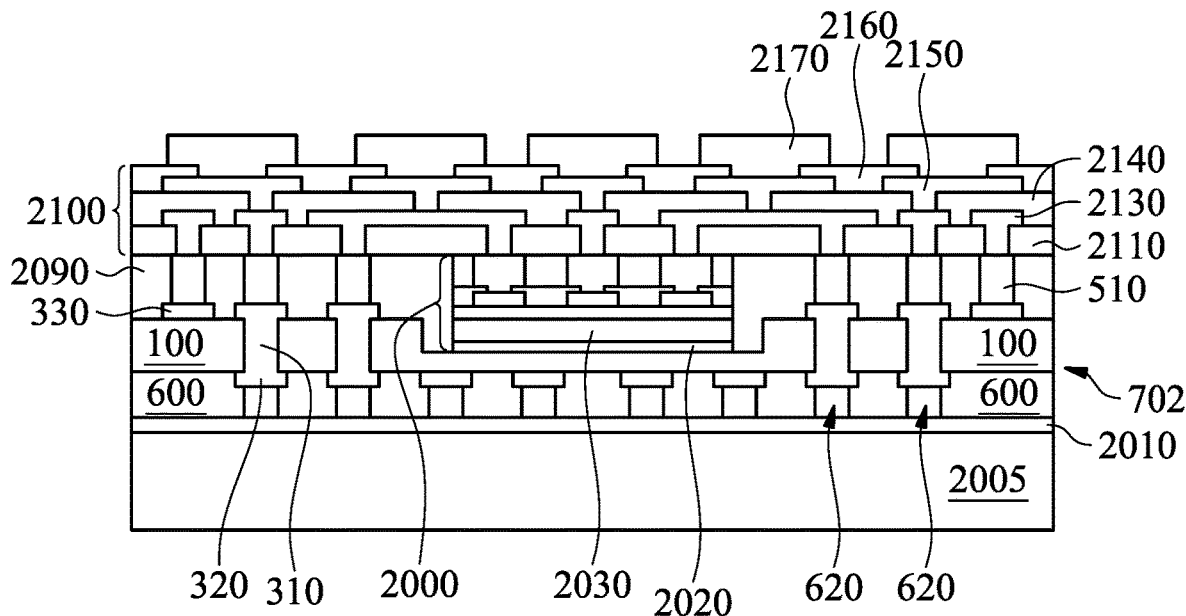

Also shown in FIG. 14 are under-bump metallizations (UBMs) 2170 extending through an uppermost patterned dielectric layer 2160 of the redistribution structure 2100. UBMs 2170 have a solderable metal surface that can serve as an interface between a solder bump and the redistribution structure 2100. In FIG. 14, conductive traces of the metallization pattern 2150 connect electrically and physically to respective UBMs 2170 through respective vias in the dielectric layer 2160. The patterned dielectric layer 2160 and UBMs 2170 may be formed using processes and materials similar to those used to form dielectric layer 2140 and metallization pattern 2150.

Figure 15:
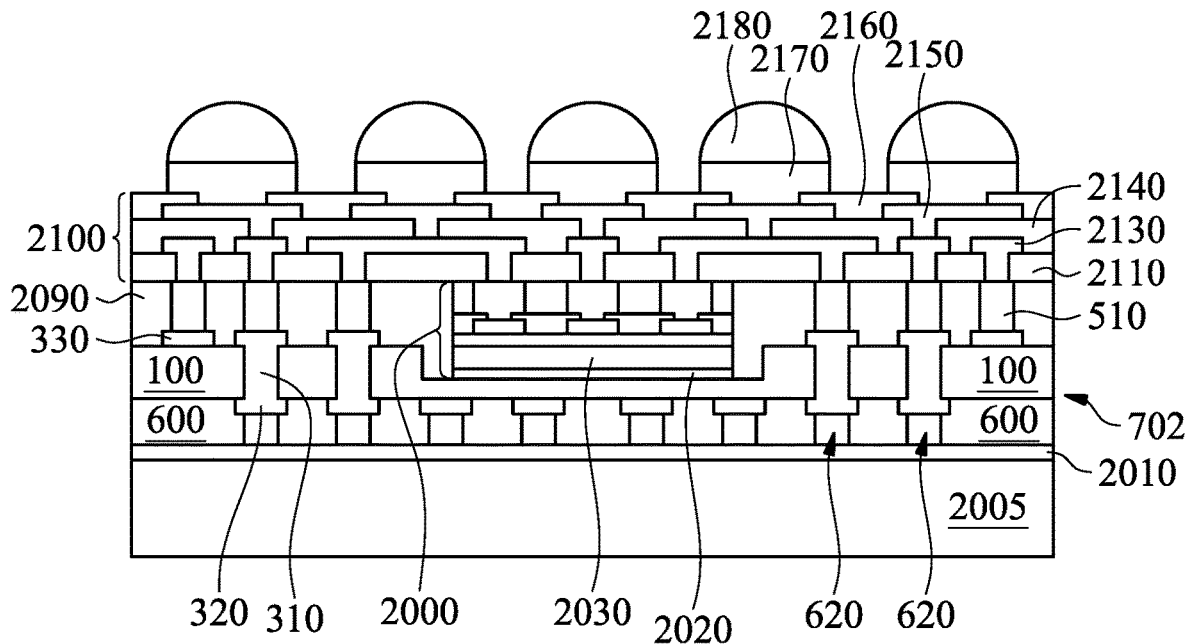

In FIG. 15, conductive connectors 2180 are formed on the UBMs 2170. The conductive connectors 2180 may be ball grid array (BGA) connectors, solder balls, conductive pillars, controlled collapse chip connection (C4) bumps, micro bumps, electroless nickel-electroless palladium-immersion gold technique (ENEPIG) formed bumps, or the like. The conductive connectors 2180 may include a conductive material such as solder, copper, aluminum, gold, nickel, silver, palladium, tin, the like, or a combination thereof. In some embodiments, the conductive connectors 2180 are formed by initially forming a layer of solder through such as evaporation, electroplating, printing, solder transfer, ball placement, or the like. Once a layer of solder has been formed on the structure, a reflow may be performed in order to shape the material into the desired bump shapes. In another embodiment, the conductive connectors 2180 are conductive pillars (such as a copper pillar) formed by a sputtering, printing, electro plating, electroless plating, CVD, or the like. The conductive pillars may be solder free and have substantially vertical sidewalls. In some embodiments, a metal cap layer (not shown) is formed on the top of the conductive pillars. The metal cap layer may include nickel, tin, tin-lead, gold, silver, palladium, indium, nickel-palladium-gold, nickel-gold, the like, or a combination thereof and may be formed by a plating process.

Figure 16:
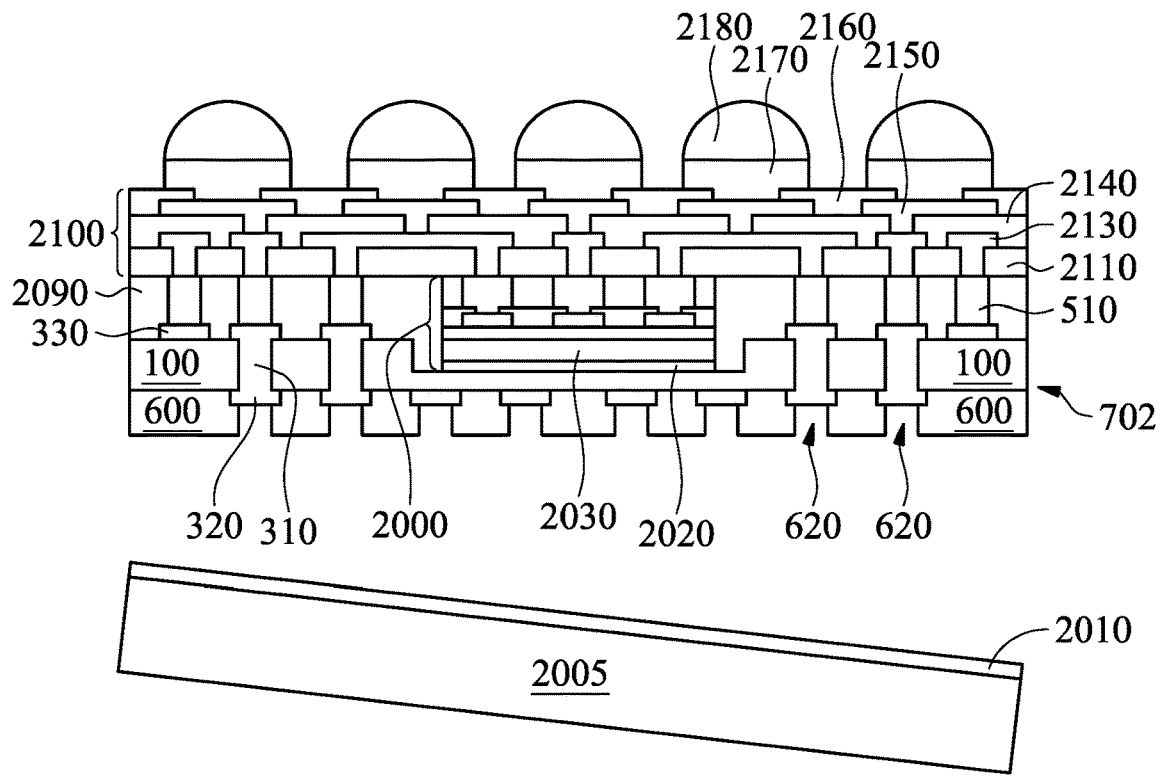

In FIG. 16, a carrier substrate de-bonding process is performed to detach (de-bond) the carrier substrate 2005 from the protective layer 600 of cavity substrate 702, in accordance with some embodiments. In embodiments in which the release layer 2010 is a light-sensitive adhesive, the de-bonding may be performed by projecting a light such as a laser light or an UV light on the release layer 2010 so that the release layer 2010 decomposes and the carrier substrate 2005 can be removed. A cleaning process may be performed to remove residue of the release layer 2010 from the protective layer 600. Detaching the carrier substrate 2005 exposes the protective layer 600 and the openings 620 therein.

Figure 17:
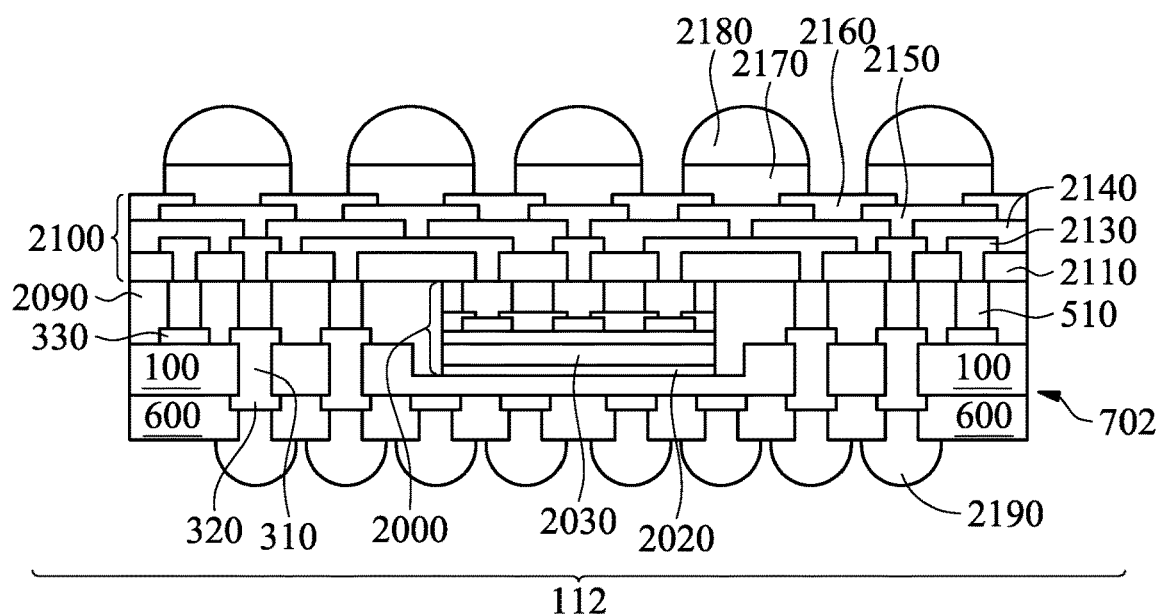

FIG. 17 illustrates that after exposing the protective layer 600, in some embodiments, die connectors 2190 may be formed in selected regions over protective layer 600 and may extend through the openings 620 in protective layer 600 to provide an external connection to respective die connector pads 320 of cavity substrate 702. Die connectors 2190 may be formed using processing techniques similar to those used to form conductive connectors 2180. The structure shown in FIG. 17, after die connectors 2190 are formed, is an InFO package die 112 including cavity substrate 702, device 2000, active-side redistribution structure 2100, conductive connectors 2180, and die connectors 2190.

The above processes may be performed on a wafer, such that multiple InFO package die 112 may be formed on a package wafer. In these embodiments, a singulation process may be performed by sawing along scribe line regions between adjacent InFO packages. The sawing singulates the InFO packages 112 from other packages on the package wafer. The singulation process may be performed either before or after other packages or substrates (not shown) are attached vertically to the InFO packages 112.

Figure 18:
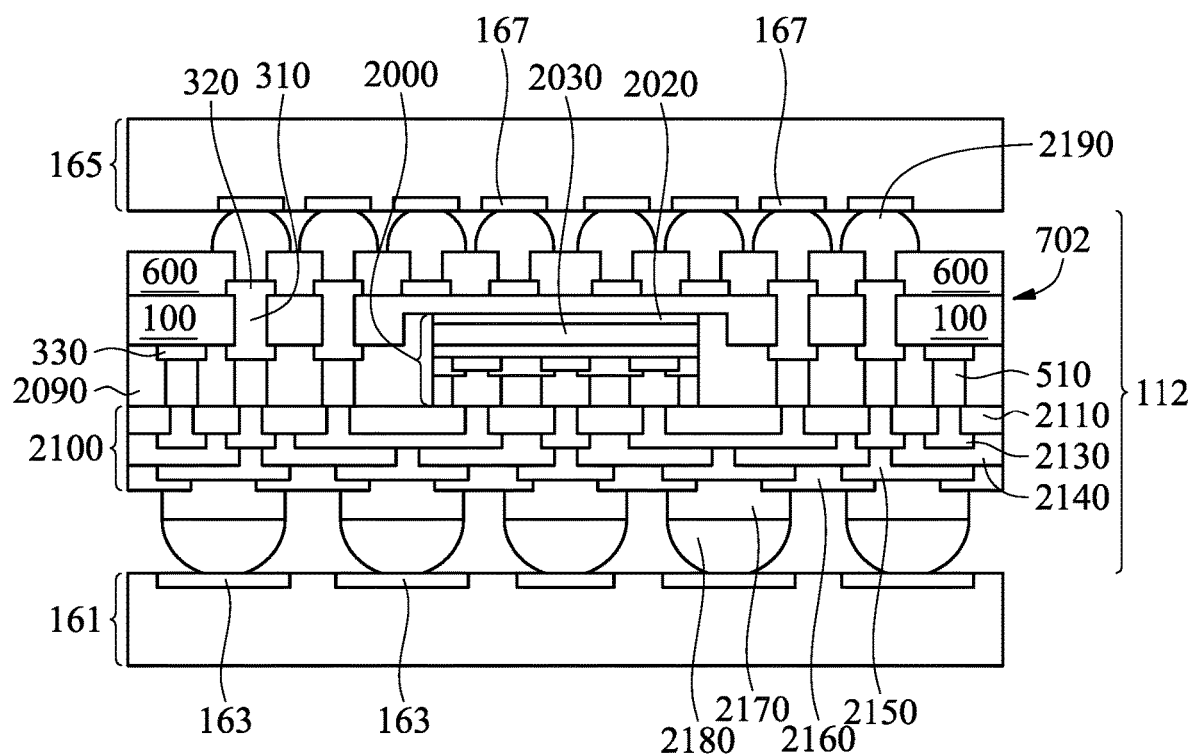

FIG. 18 illustrates a singulated InFO package 112 mounted to a substrate 161 using the conductive connectors 2180, in accordance with some embodiments. The substrate 161 may be made of a semiconductor material, such as silicon, germanium, a compound semiconductor, or an alloy semiconductor; doped or undoped; or an active layer of a semiconductor-on-insulator (SOI) substrate. The substrate 161 may include a die, a package, a packaging substrate, an interposer, PCB, or the like. For example, the substrate 161 may be a PCB based on an insulating core such as a fiberglass reinforced resin core. One example core material that may be used for the substrate 161 is fiberglass resin, such as FR4, bismaleimide-triazine BT resin, other PCB materials or films, build up films such as ABF, other laminates, or the like, or combinations thereof.

The substrate 161 may include active and passive devices (not shown). A wide variety of devices such as transistors, capacitors, resistors, combinations of these, and the like may be used to generate the structural and functional requirements of the integrated circuits included in InFO package 112 or any other package connected to InFO package 112 to form a multi-chip module. The devices may be formed using any suitable methods.

The substrate 161 may also include metallization layers and vias (not shown) and bond pads 163 over the metallization layers and vias. The metallization layers may be formed over the active and passive devices and are designed to connect the various devices to form functional circuitry.

The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The electronic devices and the interconnect system may be formed using any suitable methods.

In some embodiments, the substrate 161 may be an integrated circuit, such as a memory integrated circuit, a PMIC, a digital logic integrated circuit, an RFIC, and the like.

The conductive connectors 2180 electrically and/or physically couple the InFO package 112 to substrate 161, including metallization layers in the substrate 161. In some embodiments, the conductive connectors 2180 are reflowed to attach the InFO package 112 to the bond pads 163 of substrate 161. In some embodiments, substrate 161 has conductive connectors (not shown) that may be attached to the conductive connectors 2180 of InFO package 112 to electrically couple substrate 161 to the InFO package 112. The conductive connectors 2180 may have an epoxy flux (not shown) formed thereon before they are reflowed with at least some of the epoxy portion of the epoxy flux remaining after the InFO package 112 is attached to the substrate 161. This remaining epoxy portion may act as an underfill to reduce stress and protect the joints resulting from the reflowing the conductive connectors 2180. In some embodiments, an underfill (not shown) may be formed between the InFO package 112 and the substrate 161 and surrounding the conductive connectors 2180. The underfill may be formed by a capillary flow process after the InFO package 112 is attached or may be formed by a suitable deposition method before the InFO package 112 is attached.

As shown in FIG. 18, die connectors 2190 may be used to attach additional packages or substrates to InFO package 112. A second substrate 165 (similar to substrate 161) is shown attached to the die connectors 2190 of InFO package 112 located on the opposite side of InFO package 112 relative to die connectors 2180. In some embodiments, substrate 165 may be coupled electrically to InFO package 112 by attaching bond pads 167 of substrate 165 to die connectors 2190 of InFO package 112. In some embodiments, the second substrate 165 has conductive connectors (not shown) that may be attached to die connectors 2190 of InFO package 112 to electrically couple second substrate 165 to the InFO package 112.

Figure 19:
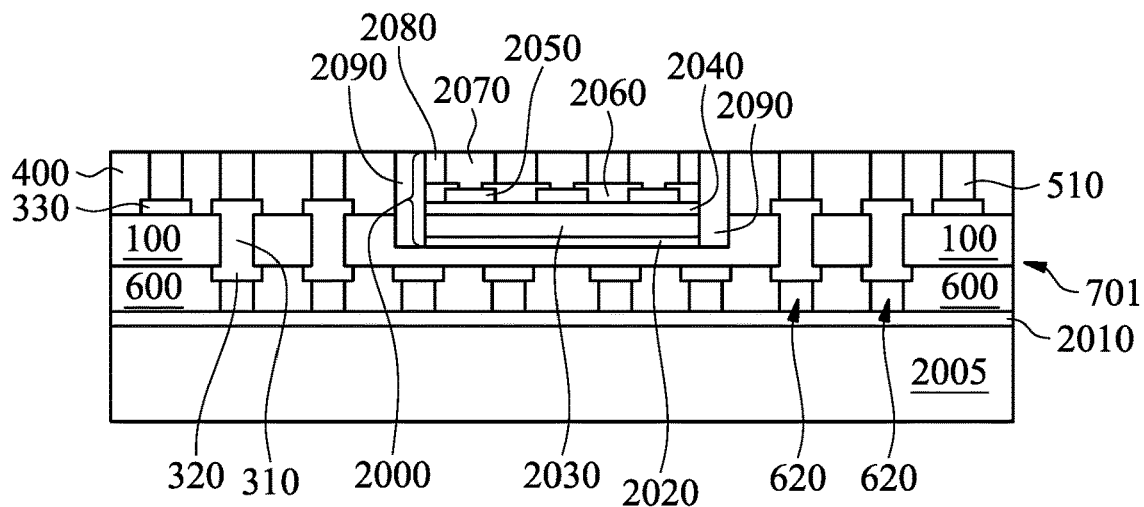
FIGS. 19 through 21B illustrate cross-sectional views of intermediate steps of forming integrated fan-out packages, in accordance with some embodiments.
Figure 20:
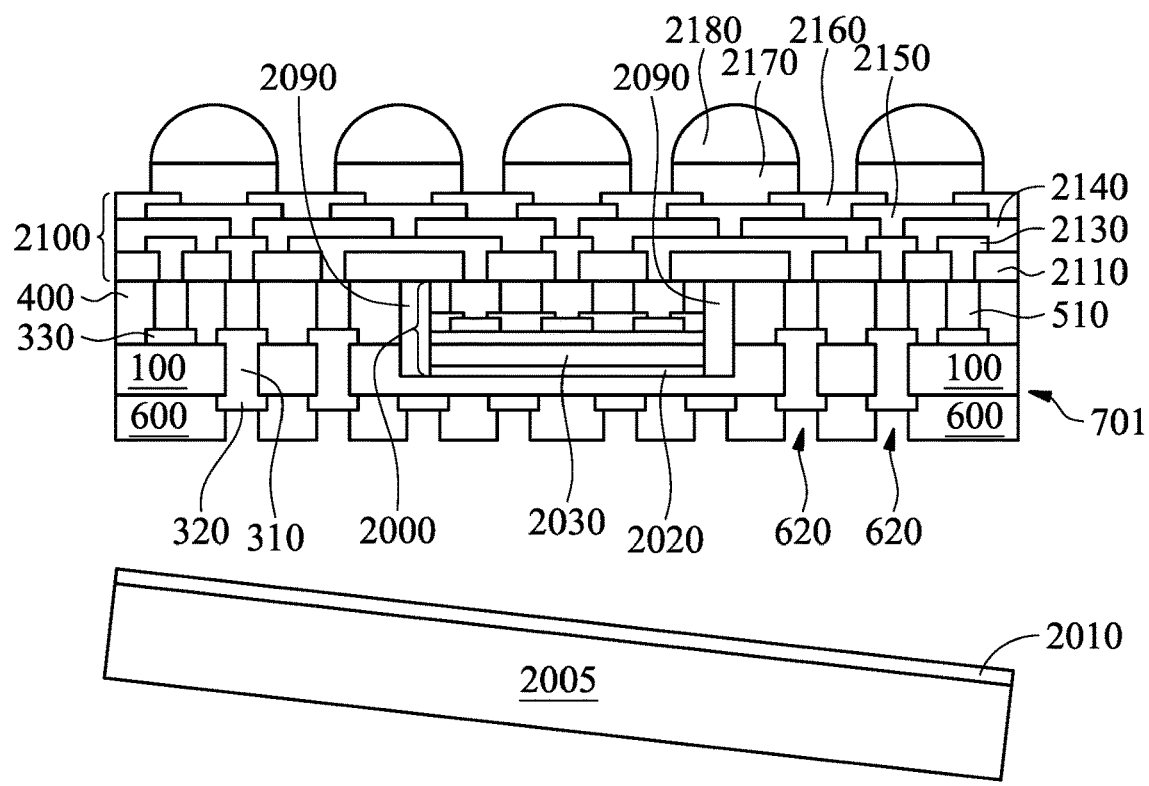

FIGS. 19 through 21 illustrate cross-sectional views of forming an InFO package in accordance with some embodiments. The process illustrated in FIGS. 19-21 assumes that the process discussed above with reference to FIGS. 1-7 are performed first. Accordingly, referring first to FIG. 19, the cavity substrate 701 illustrated in FIG. 7 is attached to the carrier substrate 2005 using the release layer 2010. Accordingly, the sacrificial layer 400, which was removed in FIG. 9, remains in the embodiment illustrated in FIGS. 19 through 21.

As illustrated in FIG. 19 the device 2000 is placed in the cavity 700 of the cavity substrate 701 illustrated in FIG. 7 using the adhesive 2020 using, for example, a process such as that discussed above with reference to FIG. 9. FIG. 19 further shows the encapsulant 2090 formed between sidewalls of the cavity 700 (see FIG. 7) and the respective sides of device 2000. The encapsulant 2090 may be formed and planarized using similar processes and materials as discussed above with reference to FIG. 10. However, the process parameters in processing steps after the encapsulant 2090 is applied may be adjusted to account for the difference in the structure illustrated in FIG. 19 relative to the structure illustrated in FIG. 10.

FIG. 19 illustrates that the space occupied by encapsulant 2090 in cavity substrate 701 may differ from the space occupied by encapsulant 2090 in a corresponding cavity substrate 702, as illustrated in FIG. 10. In FIG. 19 the sacrificial layer 400 remains in the cavity substrate 701 and the encapsulant 2090 fills the space between device 2000 and the cavity walls of cavity substrate 701. In contrast, in FIG. 10, the sacrificial layer 400 was removed from cavity substrate 702 and replaced by the encapsulant 2090. In InFO packages using the cavity substrate 701 (e.g., InFO package 114 illustrated in FIG. 21A) the encapsulant 2090 forms a ring around the device 2000 and is surrounded by the sidewalls of the insulation layer 100 and the sacrificial layer 400, as illustrated in FIG. 19. The thickness of the encapsulant 2090 is uniform and substantially equal to the combined heights of the device 2000 and the adhesive layer 2020. Thickness of the conductive pillar 510 is less than the thickness of the encapsulant or the height of the device 2000.

FIG. 20 illustrates the structure of FIG. 19 after forming the active-side redistribution structure 2100 and conductive die connectors 2180, and removing the carrier substrate 2005, in accordance with some embodiments. Processes and materials similar to those discussed above with reference to FIGS. 11-16 may be used to form the active-side redistribution structure 2100 and the conductive die connectors 2180 of the structure of FIG. 20, and to de-bond carrier substrate 2005 from cavity substrate 701.

Figure 21A:
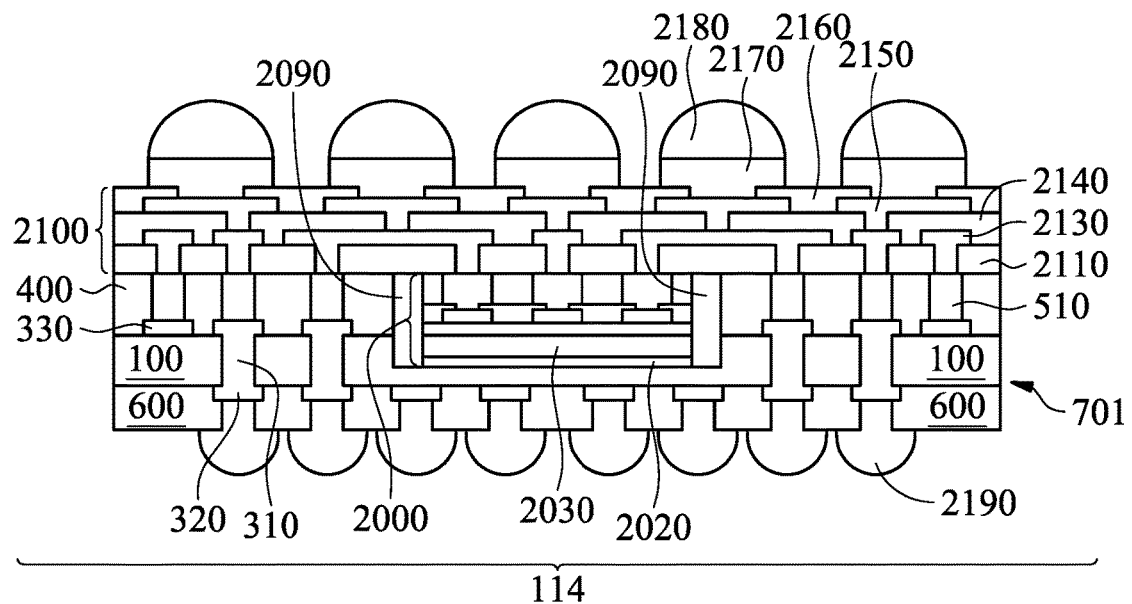

FIG. 21A illustrates that, after detaching the carrier substrate 2005, die connectors 2190 may be attached to respective die connector pads 320 of cavity substrate 701, in accordance with some embodiments. Die connectors 2190 may be formed using processes and materials similar to those discussed above with reference to FIG. 17. The structure shown in FIG. 21A may be referred to as an InFO package 114 including cavity substrate 701, device 2000, active-side redistribution structure 2100, conductive connectors 2180, and die connectors 2190.

Figure 21B:
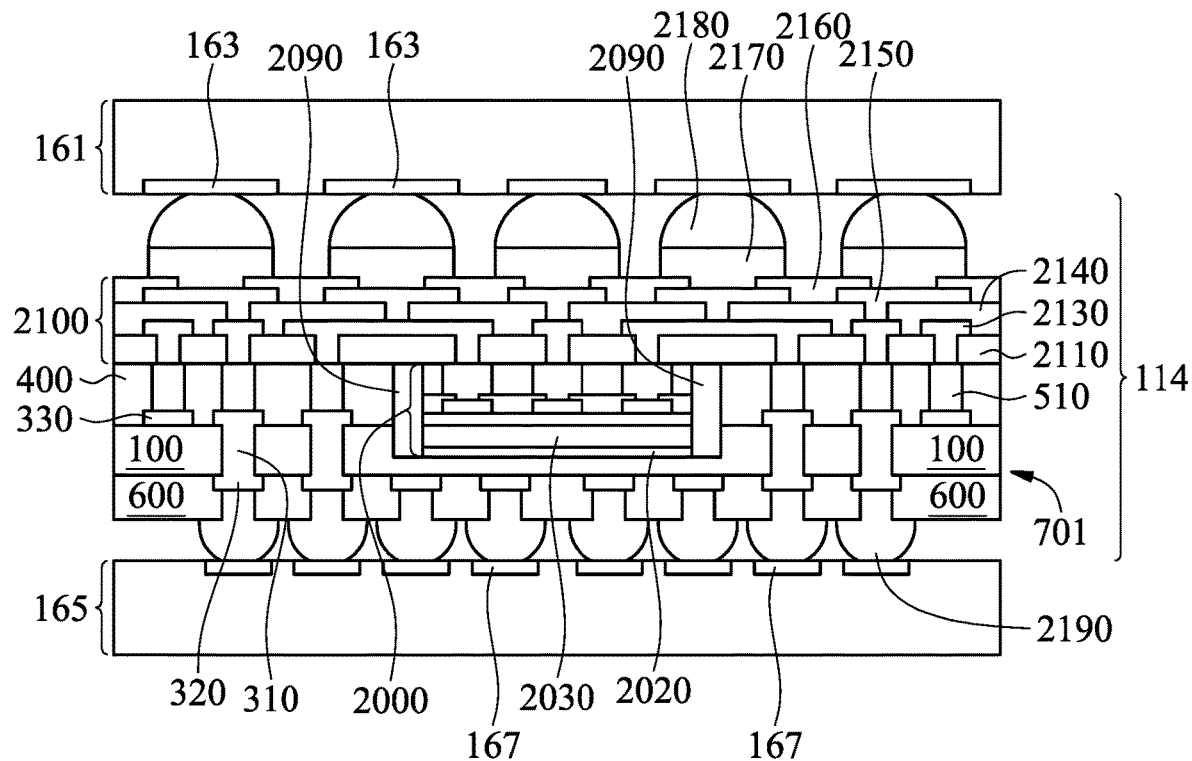

FIG. 21B illustrates a singulated InFO package 114 mounted to a substrate 161 using the conductive connectors 2180 and a second substrate 165 (similar to substrate 161) attached to the die connectors 2190 of InFO package 114.

The planar dimensions (width and length) of the cavity (e.g., cavity 700 of cavity substrate 701 and 702) are determined by the dimensions of the device 2000 to be accommodated within the cavity. In some embodiments, a distance between a sidewall of the device 2000 and sidewalls of the cavity is between 5 microns and 50 microns, thereby allowing sufficient space to flow the encapsulant.

FIGS. 22 through 28B illustrate cross-sectional views of forming an InFO package in accordance with some embodiments. The processes illustrated in FIGS. 22 through 28B assume that the processes discussed above with reference to FIGS. 1 through 3, wherein like reference numerals refer to like elements, are performed first.

Figure 22A:
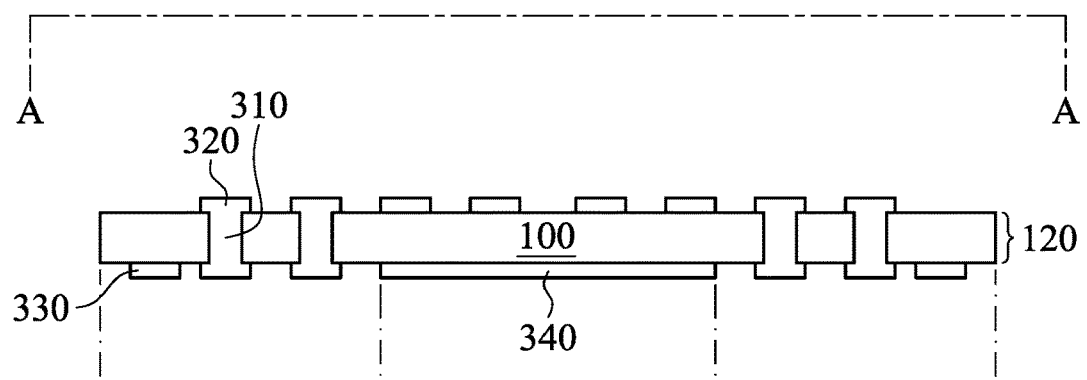
FIGS. 22A through 28B illustrate cross-sectional views of intermediate steps of forming integrated fan-out packages, in accordance with some embodiments.
Figure 22B:
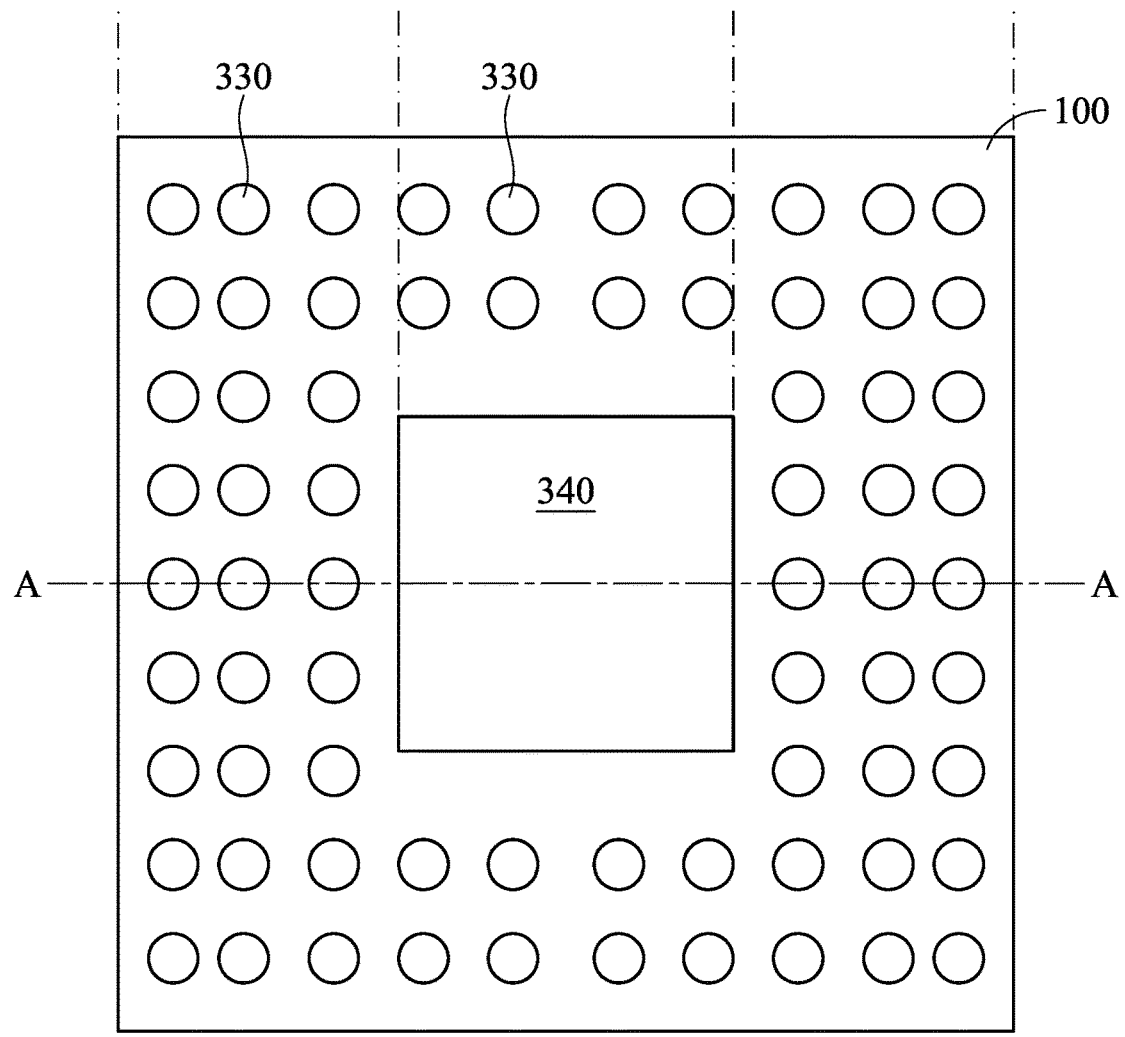

Referring to FIG. 22A, it is shown that a conductive trace 340 is formed over an area that is coincident with the location where a cavity is formed in a subsequent processing step. Conductive traces 330 and 340 are formed simultaneously and on the same side of the insulation layer 100 as the side over which the cavity opening is formed subsequently. A top view of the conductive trace 340, illustrated in FIG. 22B, indicates the region where the cavity opening would be formed. The line A-A indicates the axis corresponding to the cross-sectional view illustrated in FIG. 22A. As discussed in greater detail below, the conductive trace 340 may be removed when forming the cavity. In some embodiments, the use of the conductive trace 340 may provide better accuracy in forming the cavity in subsequent processing steps. The structure illustrated in FIGS. 22A and 22B may be formed using materials and processes similar to those discussed above with reference to FIGS. 1 through 3.

Figure 23:
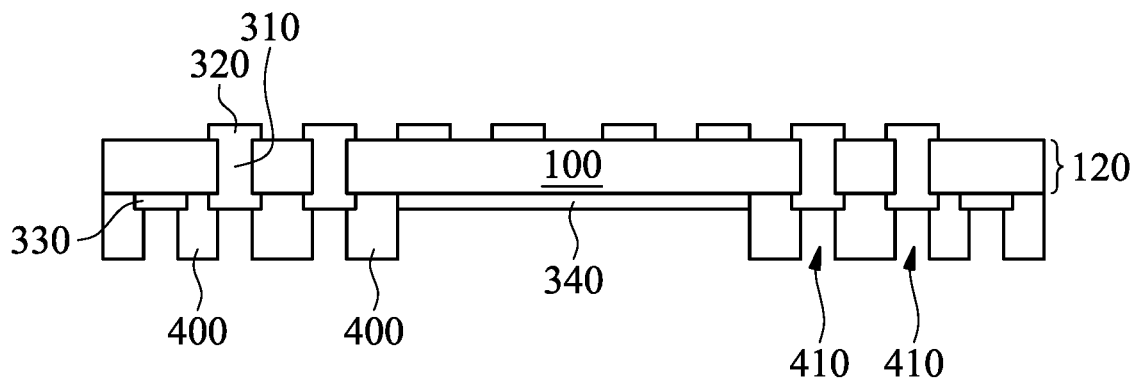

Referring now to FIG. 23, a sacrificial layer 400 is placed on a side of the substrate 120 and patterned to form openings 410 to expose portions of conductive traces 330. The sacrificial layer 400 may be formed using similar materials and processes as described above in the context of FIG. 4. In FIG. 23, however, the conductive trace 340 is exposed which is over the region where a cavity is to be formed in the substrate 120.

Figure 24:
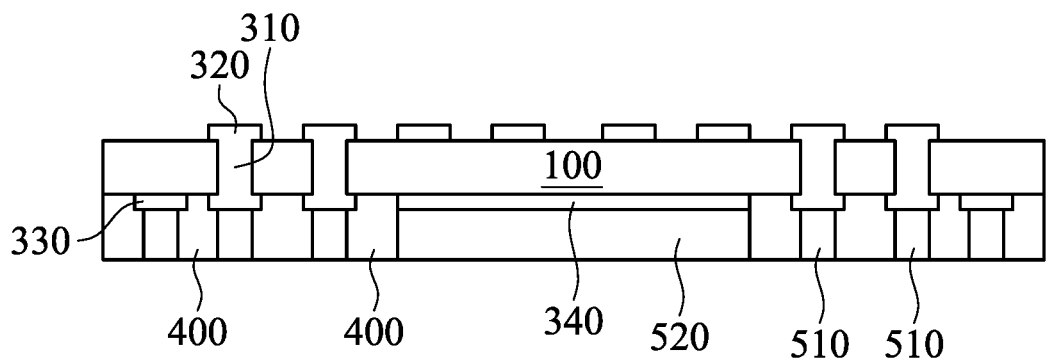

Next, as illustrated in FIG. 24, conductive plugs 510 are formed in the openings 410 (shown in FIG. 23) using, for example, materials and techniques described earlier in the context of FIG. 5. The conductive plug 520 (formed simultaneously with conductive plugs 510) over conductive trace 340 is removed during a subsequent processing step, as described below.

Figure 25:
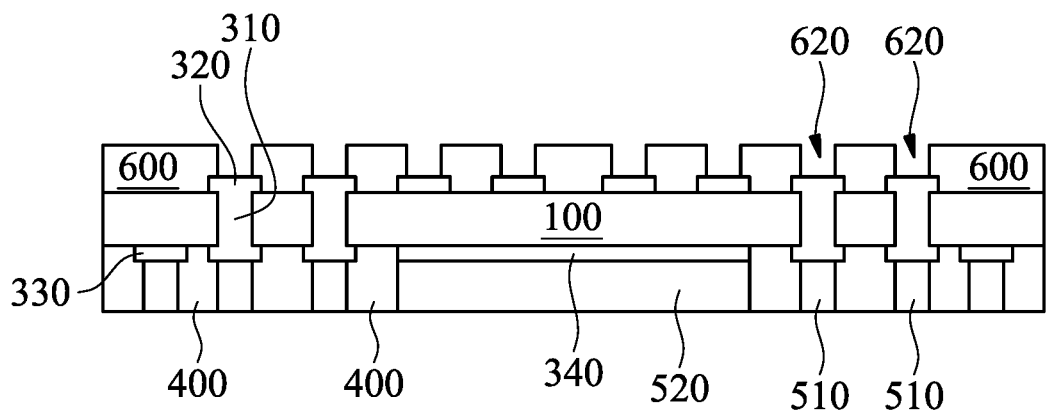

Referring now to FIG. 25, in some embodiments, a patterned protective layer 600 (e.g., solder resist) with openings 620 are formed over the conductive traces 320 to protect areas of the insulation layer 100 from external damage. Openings 620 expose underlying portions of selected conductive traces 320 that may be used as die connector pads to which die connectors can be attached. The protective layer 600 and openings 620 may be formed using, for example, similar materials and processing techniques described earlier in the context of FIG. 6.

Figure 26:
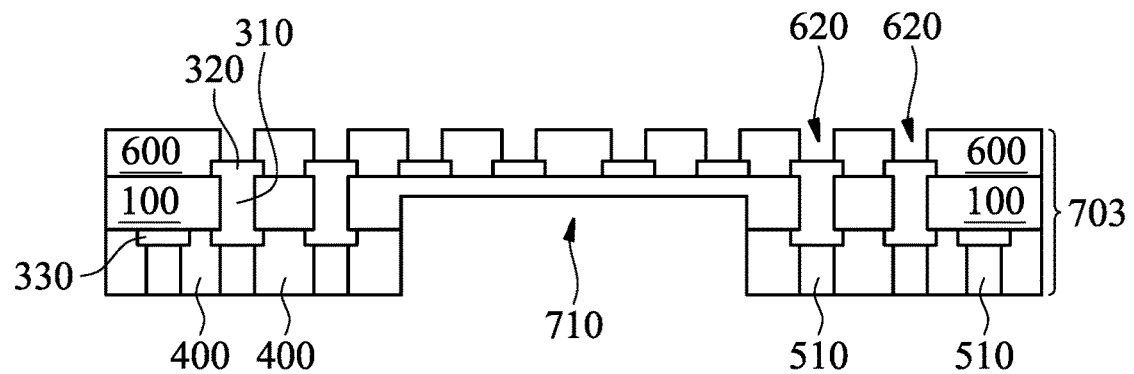

In FIG. 26, a cavity 710 is formed by selectively removing the conductive plug 520, conductive trace 340, and a portion of the insulation layer 100. In some embodiments, a patterned mask (such as a patterned photoresist mask) is formed using suitable photolithography techniques to selectively expose the surface of conductive plug 520 (see FIG. 25) while covering the conductive plugs 510. The conductive plug 520 and the conductive trace 340 may be removed by, for example, wet chemical etching techniques used in conjunction with the patterned photoresist mask to form cavity 710. In this example, the conductive material of plug 520 and trace 340 may include copper which may be removed by chemicals such as, cupric chloride etchant, ammoniacal etchant, phosphoric acid solution with water and $H_2O_2$, and/or the like. After removing the conductive material (e.g., Cu), a portion of the insulation layer 100 may be removed using laser drill, chemical etch, and/or the like. As illustrated in FIG. 26, the resulting structure is a cavity substrate 703, in accordance with some embodiments.

Figure 27:
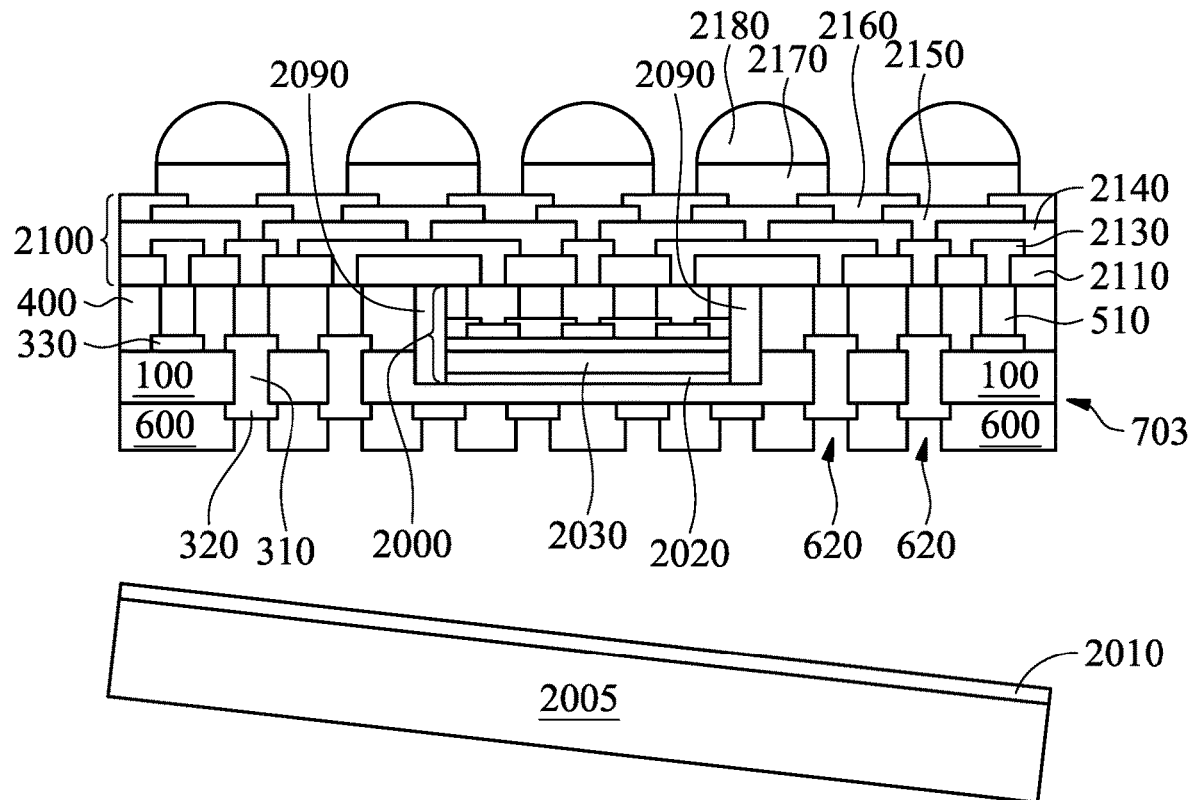

FIG. 27 illustrates that several processing steps may be performed after cavity substrate 703 is formed. In some embodiments, similar processes as those discussed above with reference to FIGS. 19 and 20 may be performed to obtain the structure illustrated in FIG. 27. For example, the cavity substrate 703 (see FIG. 26) may be attached to a carrier substrate 2005 and a device 2000 placed in the cavity 710 (see FIG. 26) of the cavity substrate 703 as discussed above with reference to FIG. 19. The device 2000 may be encapsulated using encapsulant 2090 may also be formed between the device 2000 and the cavity substrate 703 as discussed above with reference to FIG. 19. Additionally, a redistribution structure 2100 may be formed over the cavity substrate 703 and the device 2000, conductive die connectors 2180 formed on the UBMs 2170, and the carrier substrate 2005 detached from the cavity substrate 703 as discussed above with reference to FIG. 20.

Figure 28A:
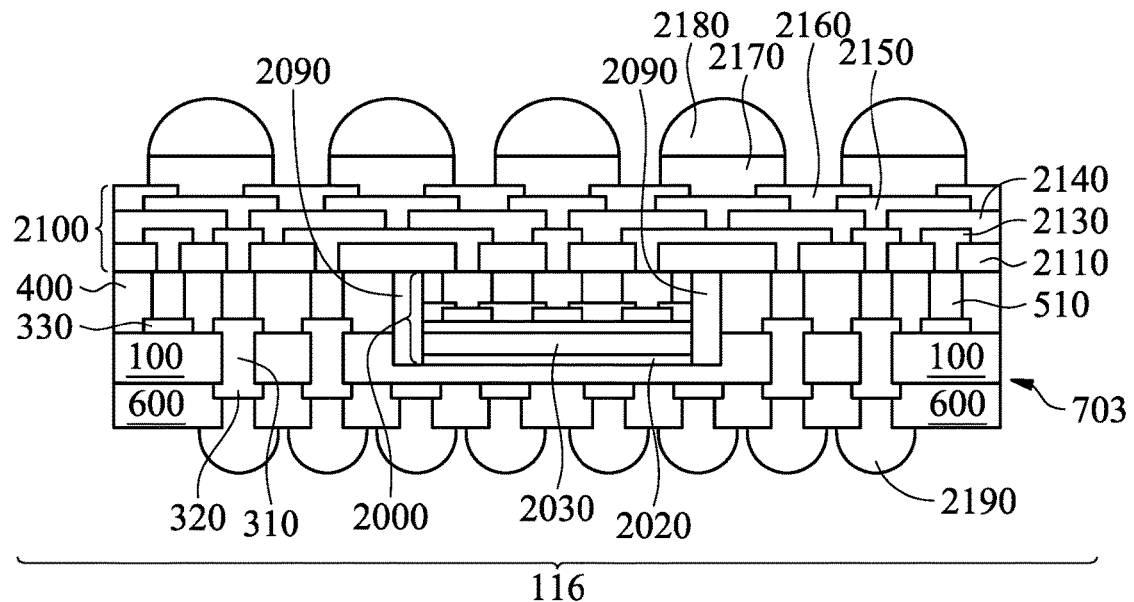

FIG. 28A illustrates that, after detaching the carrier substrate 2005, die connectors 2190 have been attached to respective die connector pads 320 of cavity substrate 703, in accordance with some embodiments. Die connectors 2190 may be formed using processes and materials similar to those discussed above with reference to FIG. 17. The structure shown in FIG. 28A may be referred to as an InFO package die 116 including cavity substrate 703, device 2000, active-side redistribution structure 2100, conductive connectors 2180, and die connectors 2190.

Figure 28B:
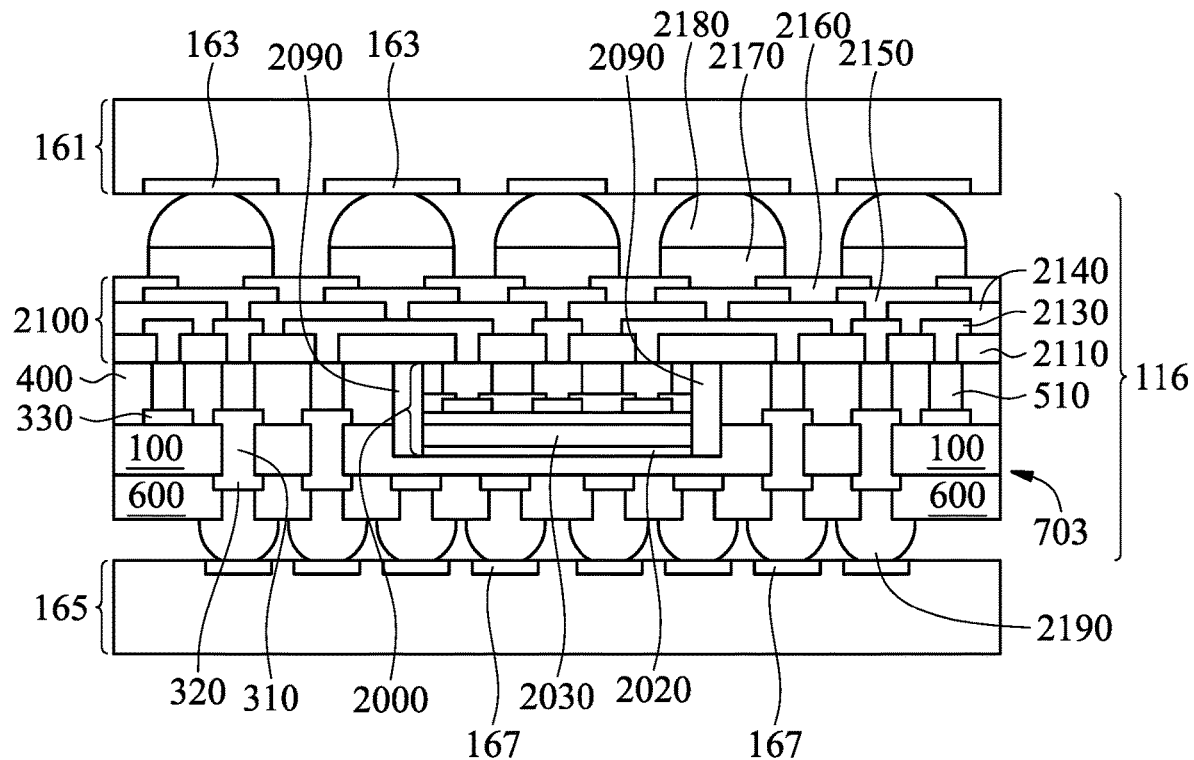

FIG. 28B illustrates a singulated InFO package 116 mounted to a substrate 161 using the conductive connectors 2180 and a second substrate 165 (similar to substrate 161) attached to the die connectors 2190 of InFO package 116.

Figure 29:
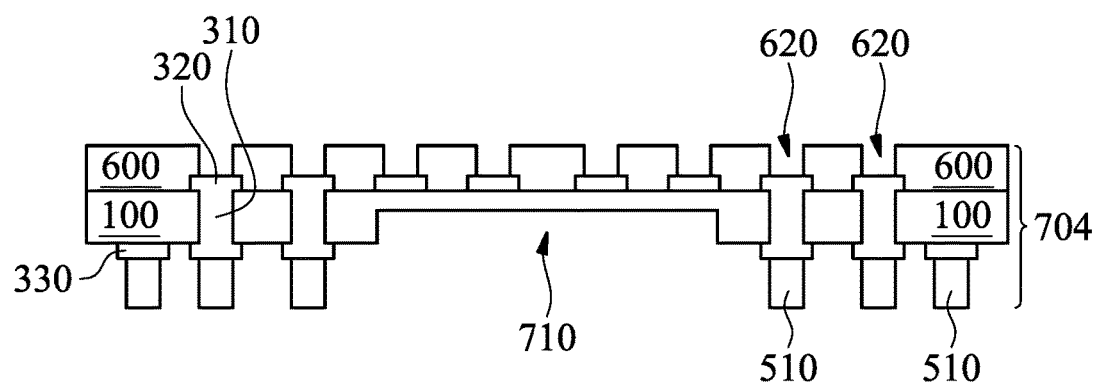
FIGS. 29 through 31B illustrate cross-sectional views of intermediate steps of forming integrated fan-out packages, in accordance with some embodiments.

FIGS. 29-31B illustrate cross-sectional views of forming an InFO package, in accordance with some embodiments. The process illustrated in FIGS. 29-31 assume the process discussed above with reference to FIGS. 22-26, wherein like reference numerals refer to like elements, are performed first. Thereafter, as illustrated in FIG. 29, the sacrificial layer 400 (see FIG. 26) is removed to form cavity substrate 704. The structures illustrated in FIG. 29 may be formed using similar materials and processes as those discussed above with reference to FIG. 22-26. The sacrificial layer 400 may be removed, for example, using techniques described above with reference to FIG. 8.

Figure 30:
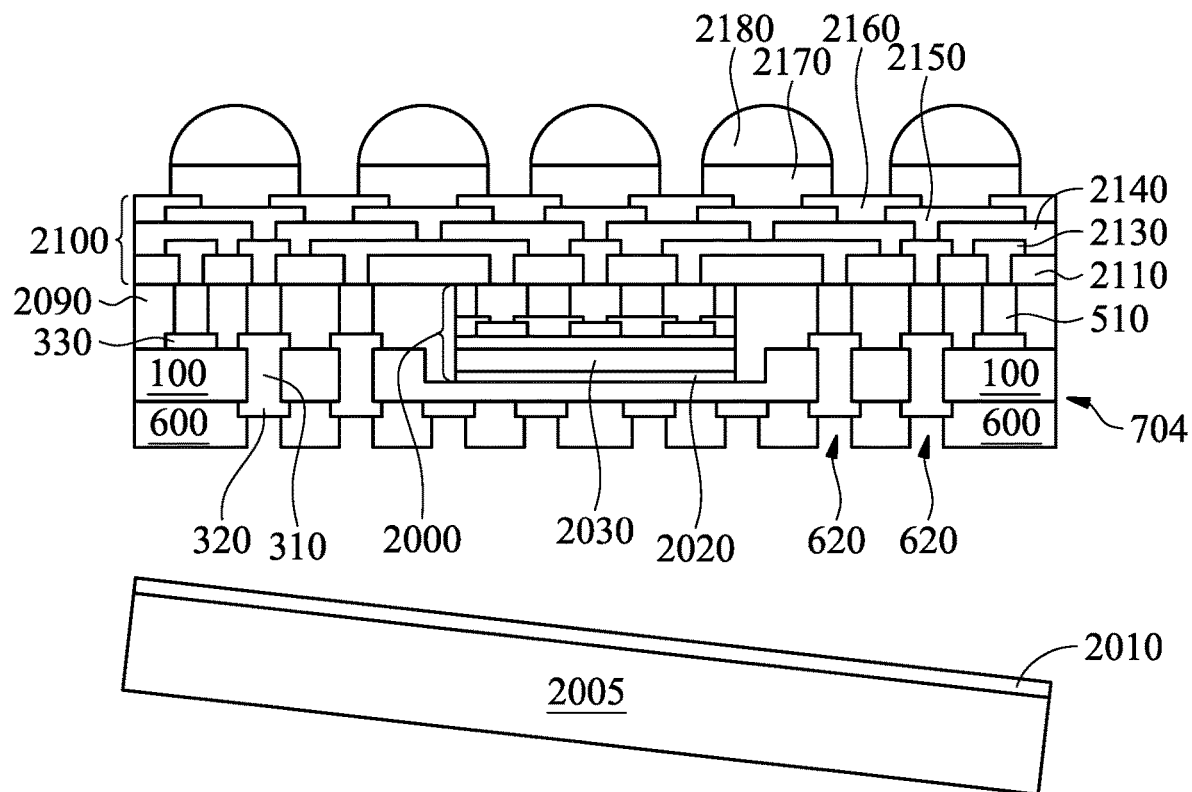

FIG. 30 illustrates that several processing steps may be performed after cavity substrate 704 is formed. In some embodiments, similar processes as those discussed above with reference to FIGS. 9-16 may be performed to obtain the structure illustrated in FIG. 30. For example, the cavity substrate 704 (see FIG. 29) may be attached to a carrier substrate 2005 and a device 2000 placed in the cavity 710 (see FIG. 29) of the cavity substrate 704 as discussed above with reference to FIG. 9. The device 2000 may be encapsulated using encapsulant 2090 as discussed above with reference to FIG. 10. Additionally, a redistribution structure 2100 may be formed over the cavity substrate 703 and the device 2000, conductive die connectors 2180 formed on the UBMs 2170, and the carrier substrate 2005 detached from the cavity substrate 703 as discussed above with reference to FIG. 11-16.

Figure 31A:
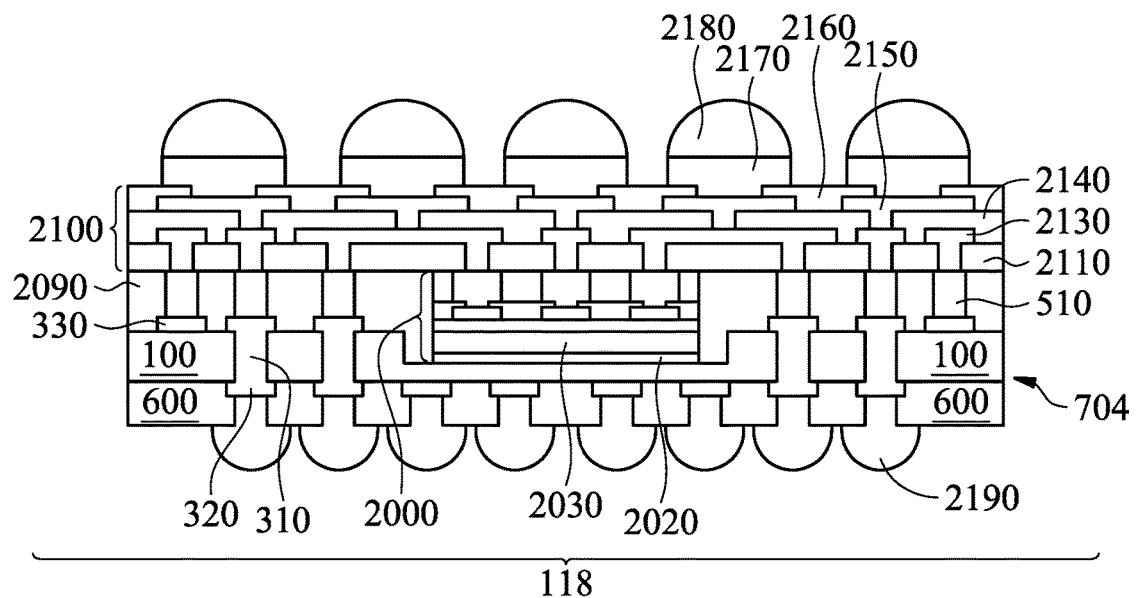

FIG. 31A illustrates that, after detaching the carrier substrate 2005, die connectors 2190 have been attached to respective die connector pads 320 of cavity substrate 704, in accordance with some embodiments. Die connectors 2190 may be formed using processes and materials similar to those discussed above with reference to FIG. 17. The structure shown in FIG. 31A may be referred to as an InFO package die 118 including cavity substrate 704, device 2000, active-side redistribution structure 2100, conductive connectors 2180, and die connectors 2190.

Figure 31B:
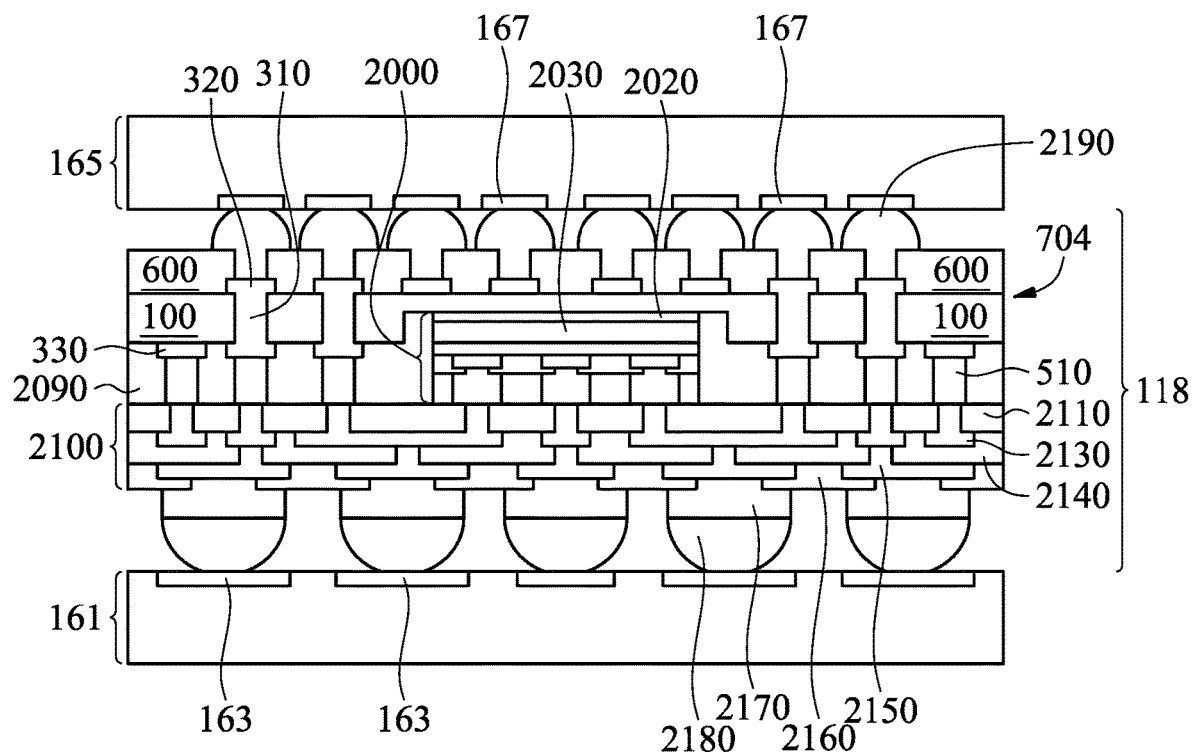

FIG. 31B illustrates a singulated InFO package 118 mounted to a substrate 161 using the conductive connectors 2180 and a second substrate 165 (similar to substrate 161) attached to the die connectors 2190 of InFO package 118.

Figure 32:
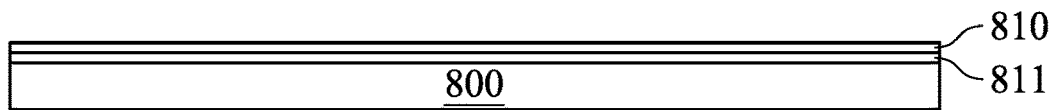
FIGS. 32 through 44B illustrate cross-sectional views of intermediate steps of for forming integrated fan-out packages, in accordance with some embodiments.

FIGS. 32-44 illustrate cross-sectional views of forming an InFO package in accordance with some embodiments. Referring first to FIG. 32, there is shown a carrier substrate 800 having a release layer 811 formed on a top surface of the carrier substrate 800. A conductive seed layer 810 is shown covering the top surface of carrier substrate 800 (over the release layer). The carrier substrate 800 may be detached (with the release layer) from the conductive seed layer 810 during subsequent processing.

The carrier substrate 800 may be a glass carrier substrate, a ceramic carrier substrate, or the like; and the release layer 811 may be a polymer-based material, an epoxy-based thermal-release material such as a light-to-heat-conversion (LTHC) release coating, or ultra-violet (UV) glue (a glue which loses its adhesive property when exposed to UV light).

The seed layer 810 may include a copper layer or a composite layer of a titanium layer and a copper layer over the titanium layer. Any suitable deposition process (e.g., physical vapor deposition (PVD), CVD, lamination, or the like) may be used to form the seed layer.

Figure 33:
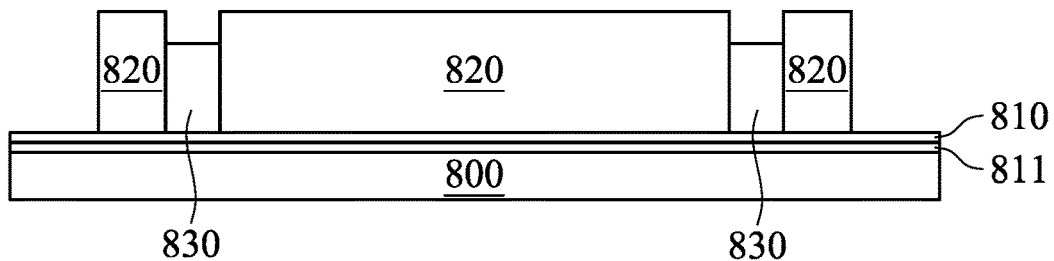
Figure 34:
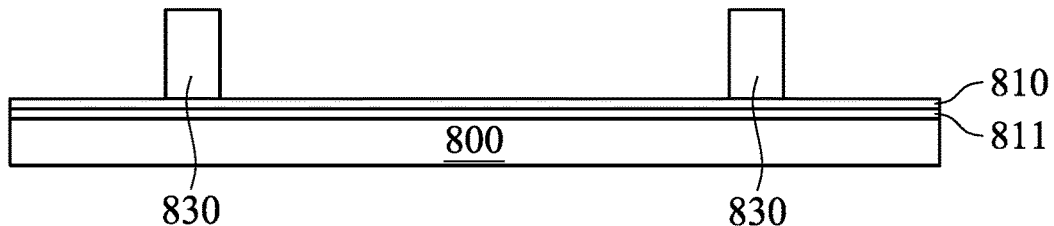

As illustrated in FIGS. 33 and 34, conductive pillars 830 may be formed over the seed layer 810 using, for example, a metal pattern electroplating technique. Referring first to FIG. 33 the seed layer 810 is deposited, a patterned mask 820 (e.g., a patterned photoresist) is formed over the surface of the seed layer 810. In some embodiments, the patterned mask 820 is formed by depositing a photoresist on the surface of the seed layer 810, exposing the photoresist to an optical pattern, and developing the photoresist to expose a portion of the seed layer 810, as defined by the optical pattern. In some embodiments, the photoresist may be a dry film photoresist (DFR). Other processes and materials may be used.

The conductive pillars 830 may be selectively deposited over the exposed portions of the seed layer 810 using pattern electroplating. The process parameters of the pattern electroplating technique may be selected to be such that the deposited thickness of the conductive pillars 830 is less than the thickness of the patterned mask 820.

FIG. 34 illustrates the conductive pillars 830 remaining attached to seed layer 810 after the patterned mask 820 is removed. The patterned mask 820 may be removed using any suitable etching technique (e.g., an oxygen plasma ash, organic solvents, or a sodium hydroxide solution (to strip DFR)).

Figure 35:
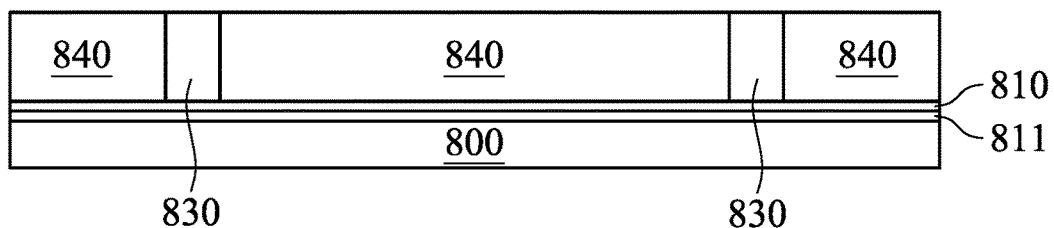

Referring now to FIG. 35, the conductive pillars 830 may be embedded in an insulating layer 840 by, for example, laminating a build-up film such as, ABF, or a prepreg, or the like, and using an etchback or planarizing process, such as CMP, or grinding, or the like, to expose a top conductive surface of patterned conductive layer 830. In some embodiments, the layer 840 can be liquid molding compound molded onto the substrate around the conductors 830. Layer 840 may be used as a masking layer and may be removed in subsequent processing steps in some embodiments. In the description of embodiments in this document, layer 400 may also be referred to as sacrificial layer 400 although in some embodiments layer 400 is retained in the structure.

Figure 36A:
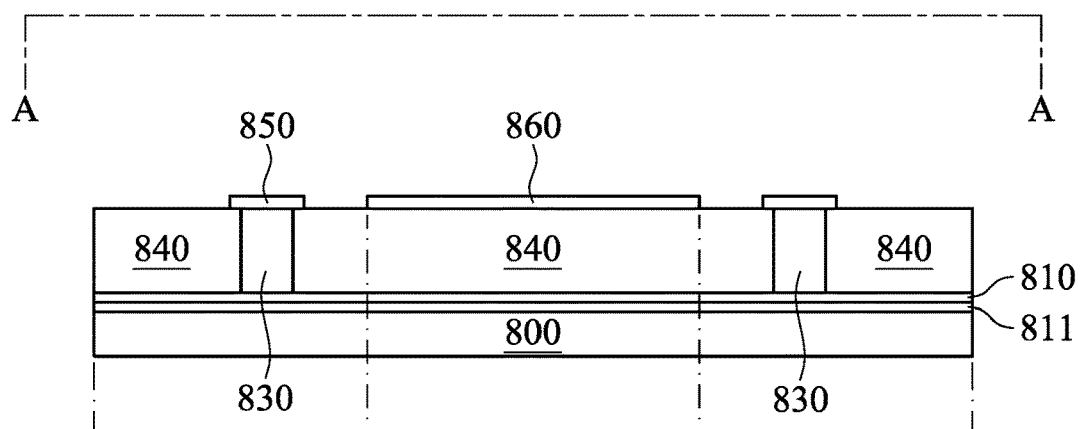
Figure 36B:
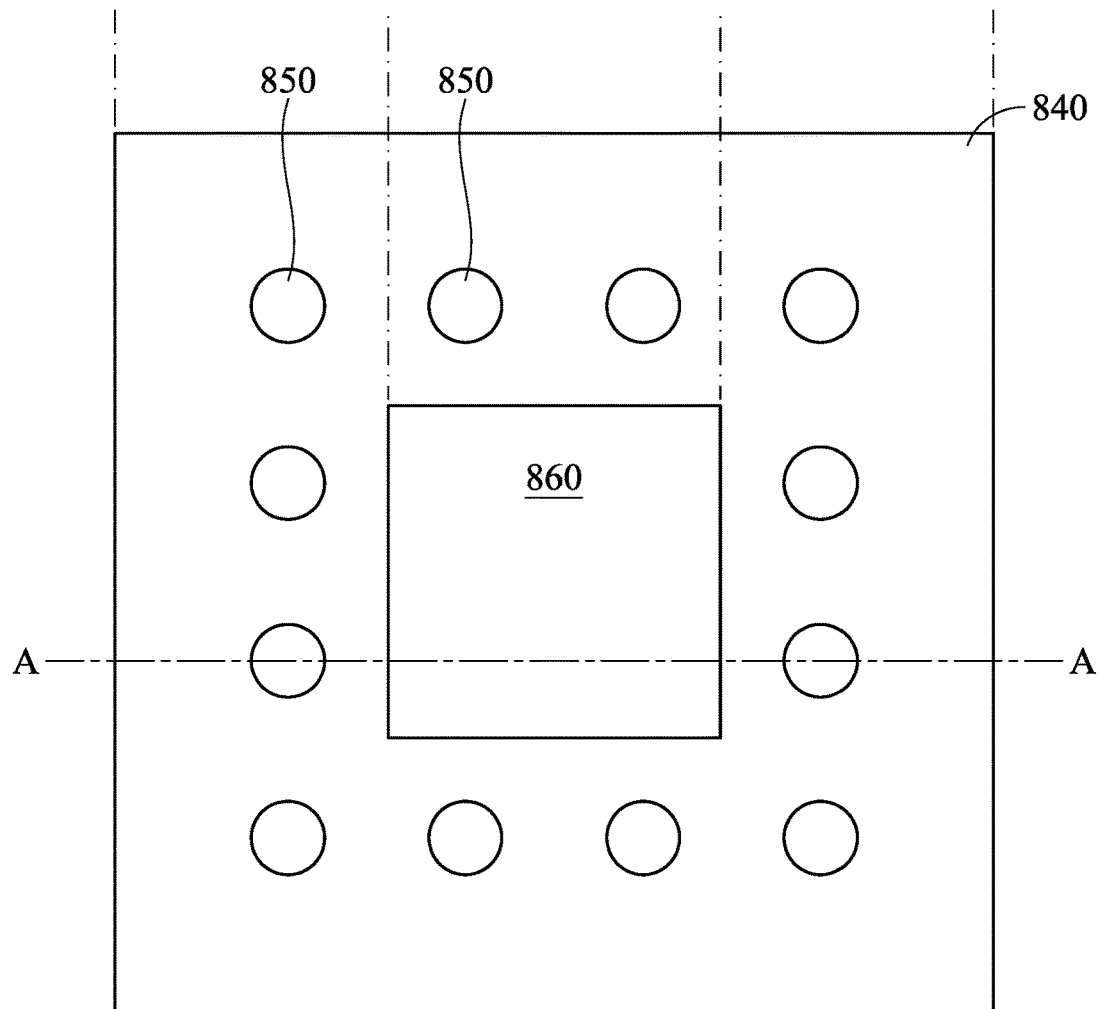

FIG. 36A illustrates conductive traces 850 and 860 (e.g., Cu traces) formed simultaneously over the conductive pillars 830 and portions of insulating sacrificial build-up layer 840 selected by openings in a patterned masking layer (e.g., a patterned photoresist layer). Conductive trace 860 is henceforth referred to as etch-stop conductive trace 860 because it may be used as an etch-stop layer during a subsequent etching step to form a cavity, as described in greater detail below. As shown in FIG. 36, the etch-stop conductive trace 860 covers the region over insulation sacrificial build-up layer 840 intended for subsequent formation of a cavity and placement of a device. A top view of the etch-stop conductive trace 860, illustrated in FIG. 36B, indicates the region where the cavity opening would be formed. The line A-A indicates the axis corresponding to the cross-sectional view illustrated in FIG. 36A. The patterned conductive layer 850 (including the etch-stop conductive trace 860) may be formed using, for example, similar processes and techniques described above with reference to forming the patterned metallization layer 2130 as illustrated in FIG. 12, wherein a seed layer is deposited, a patterned mask is formed over the seed layer, a plating process is performed to form the metallization pattern, the patterned mask is removed, and unused portions of the seed layer are removed.

Figure 37:
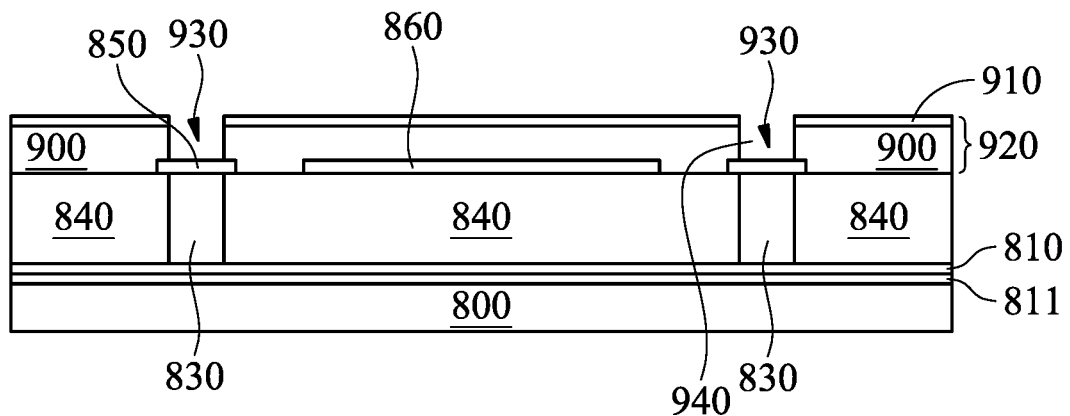

Referring now to FIG. 37, a single-sided metal-clad laminate 920 is laminated over the conductive traces 850 and 860. In some embodiments, single-sided metal-clad laminate 920 includes an insulation layer 900 (e.g., a prepreg) and a metal foil (e.g., a Cu foil) 910 attached to one surface of the insulation layer 900. In some embodiments, the single-sided metal-clad laminate 920 is similar to substrate 120 discussed above with reference to FIG. 1, except the metal cladding is laminated on a single side in FIG. 37, rather than two sides as illustrated in FIG. 1.

The single-sided metal-clad laminate 920 is oriented such that the surface of the metal foil 910 is exposed. Openings 930 in single-sided metal-clad laminate 920 are formed to expose a portion of the metal surface of selective traces of layer 850, which are physically connected to and located directly over the conductive pillars 830. In some embodiments, a laser drilling process or a mechanical drilling process with computer numeric control (CNC) may be used to form openings 930. Also, as shown in FIG. 37, the single-sided metal-clad laminate 920 covers the etch-stop conductive trace 860.

Figure 38:
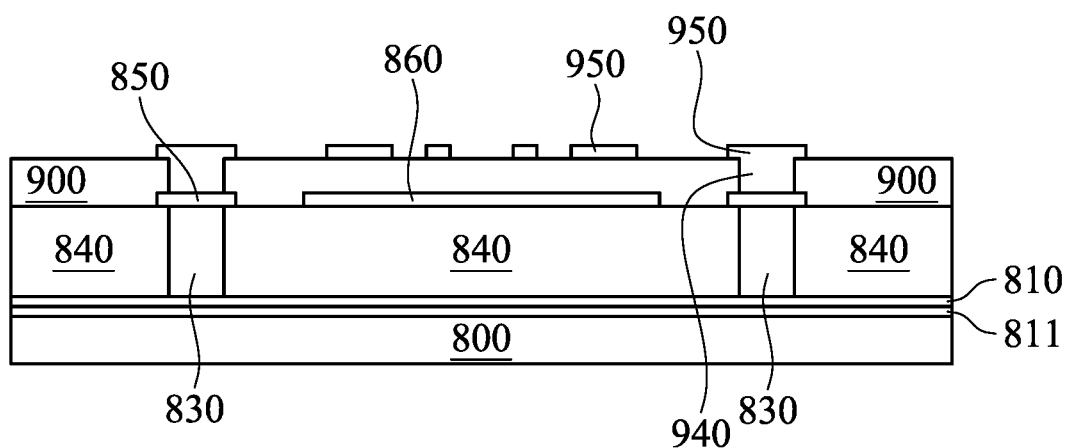

FIG. 38 illustrates conductive plugs 940 and conductive traces 950 in accordance with some embodiments. In some embodiments, the conductive plugs 940 and conductive traces 950 may be formed using, for example, similar process and materials as used to form the conductive traces 320 and conductive plugs 310 discussed above with reference to FIGS. 2 and 3. In some embodiments, portions of the conductive traces 950 are formed laterally over the etch-stop conductive trace 860, as illustrated in FIG. 38.

Figure 39:
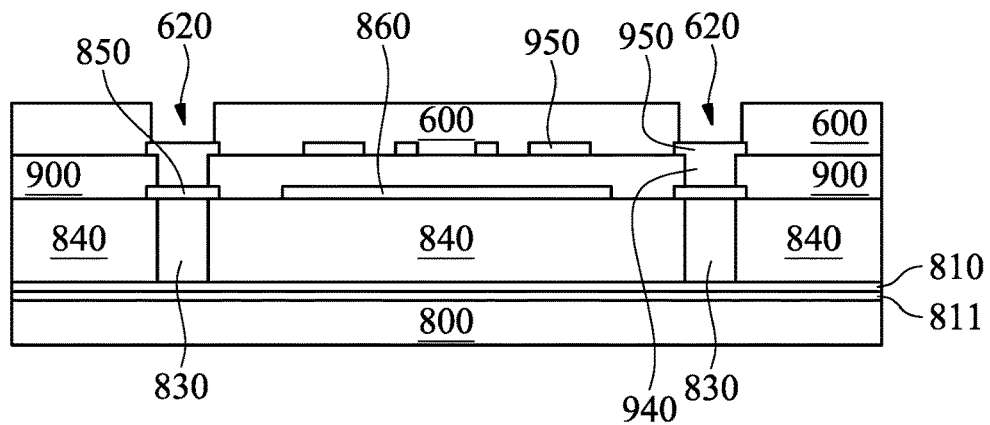

Referring now to FIG. 39, in some embodiments, a patterned protective layer 600 (e.g., solder resist) with openings 620 are formed over the conductive traces 950 to protect areas of the insulation layer 900 from external damage. Openings 620 expose underlying portions of selected conductive traces 950 that may be used as die connector pads to which die connectors can be attached. The protective layer 600 and openings 620 may be formed using, for example, similar materials and processing techniques described above with reference to FIG. 6.

Figure 40:
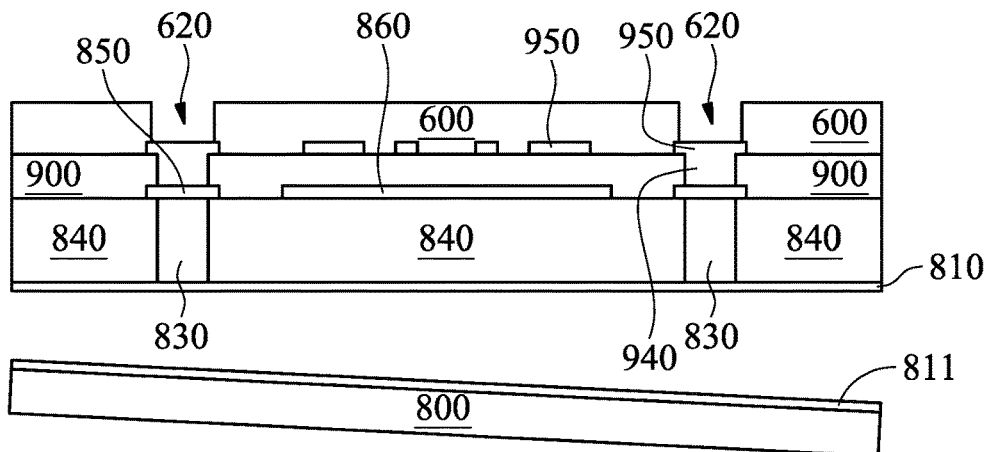

Next, as illustrated in FIG. 40, the carrier substrate 800 may be detached from the seed layer 810. In embodiments in which the release layer 811 is a light-sensitive adhesive, the de-bonding may be performed by projecting a light such as a laser light or an UV light on the release layer so that the release layer decomposes and the carrier substrate 800 can be removed thereby exposing the conductive seed layer 810. A cleaning process may be performed to remove any residue of the release layer from the conductive seed layer 810.

Figure 41:
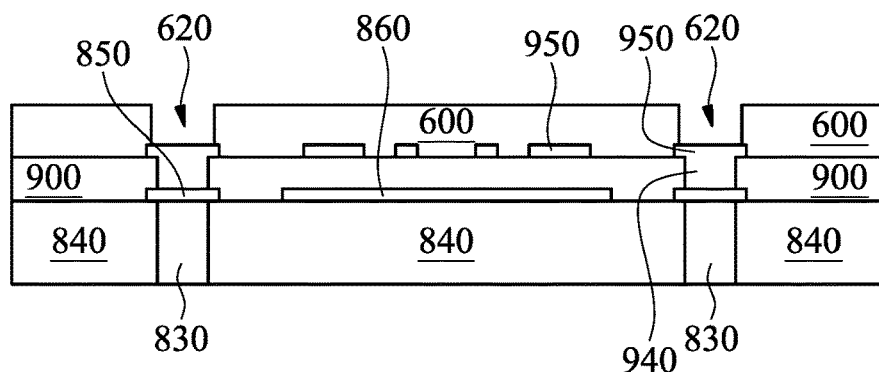

The seed layer 810 forms unwanted metal shorts between adjacent conductive pillars 830, as illustrated in FIG. 40. In FIG. 41 it is shown that the seed layer 810 may be removed, for example, by dissolving the unwanted metal using a wet chemical solvent such as, $H_3PO_4$, $H_2O_2$, and/or the like, or by dry etching, or a combination thereof, or by any other suitable etching technique. In some embodiments, the wet chemical can be applied by using $H_3PO_4$, $H_2O_2$, and the like.

Figure 42:
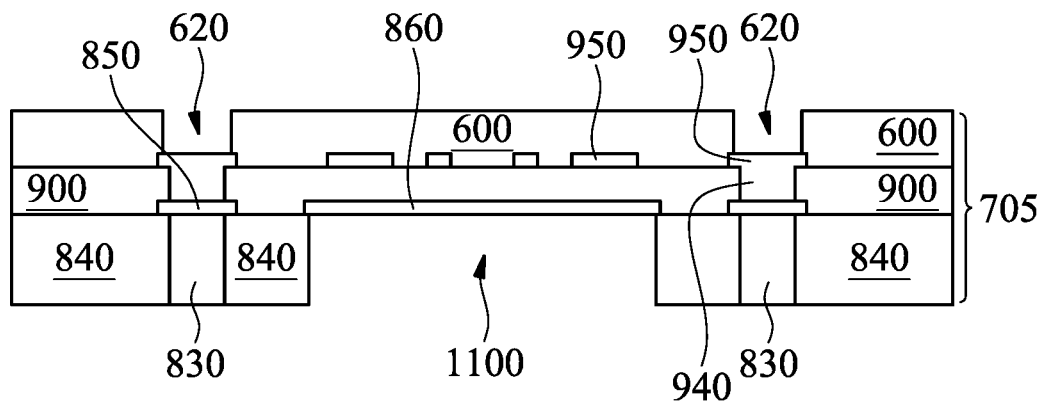

In FIG. 42 a cavity 1100 is formed by removing a portion of the insulating sacrificial build-up layer 840 that is vertically adjacent to conductive trace 860. Removal of portions of insulating sacrificial build-up layer 840 to form cavity 1100 may be performed by a laser drilling process wherein the conductive trace 860 may be used as an etch stop layer. The edges of the conductive trace 860 define the position of the edges of the cavity 1100. The planar dimensions of the cavity 1100 may be designed to be larger than the size of any device to be placed within the cavity 1100. As illustrated in FIG. 42, the edges of the conductive trace 860 extends beyond the edges of the opening 1100. This allows some margin for misalignment, thereby ensuring that the conductive trace etch stop layer 860 is present over the entire region exposed to the drilling process. The depth of the cavity and the thickness of the insulating sacrificial build-up layer 840 may be approximately equal. The resulting structure is a cavity substrate 705, in accordance with some embodiments.

Figure 43:
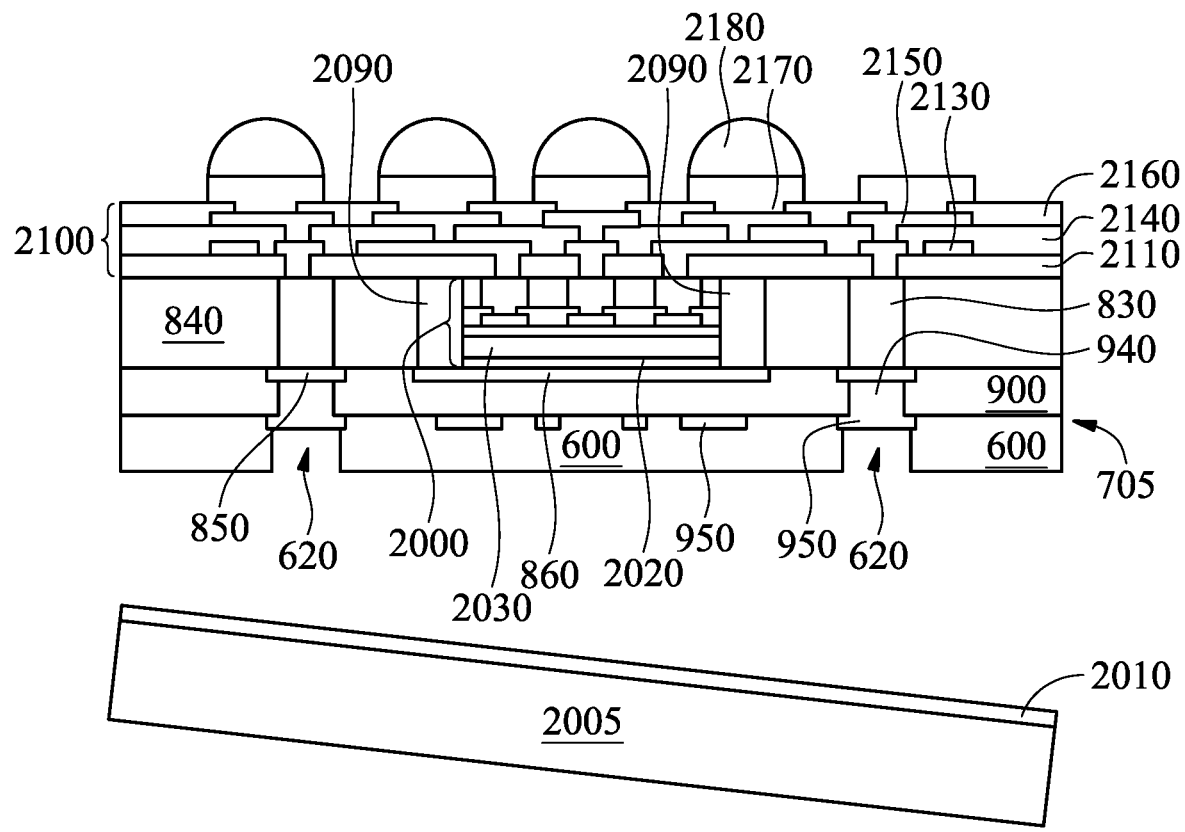

FIG. 43 illustrates that several processing steps may be performed after cavity substrate 705 is formed. The cavity substrate 705 (see FIG. 42) may be attached to a carrier substrate 2005, a device 2000 placed in the cavity 1100 (see FIG. 42) of the cavity substrate 705, the device 2000 encapsulated using encapsulant 2090, a redistribution structure 2100 formed over the cavity substrate 705 and the device 2000, conductive die connectors 2180 formed on the UBMs 2170, and the carrier substrate 2005 detached from the cavity substrate 705, in accordance with some embodiments. The structure illustrated in FIG. 43 may be formed using processes and materials similar to those discussed above with reference to FIGS. 9-16.

FIG. 43 illustrates that several processing steps may be performed after cavity substrate 705 is formed. In some embodiments, similar processes as those discussed above with reference to FIGS. 19 and 20 may be performed to obtain the structure illustrated in FIG. 43. For example, the cavity substrate 705 (see FIG. 42) may be attached to a carrier substrate 2005 and a device 2000 placed in the cavity 1100 (see FIG. 42) of the cavity substrate 705 as discussed above with reference to FIG. 19. The device 2000 may be encapsulated using encapsulant 2090 may also be formed between the device 2000 and the cavity substrate 705 as discussed above with reference to FIG. 19. Additionally, a redistribution structure 2100 may be formed over the cavity substrate 705 and the device 2000, conductive die connectors 2180 formed on the UBMs 2170, and the carrier substrate 2005 detached from the cavity substrate 703 as discussed above with reference to FIG. 20.

Figure 44A:
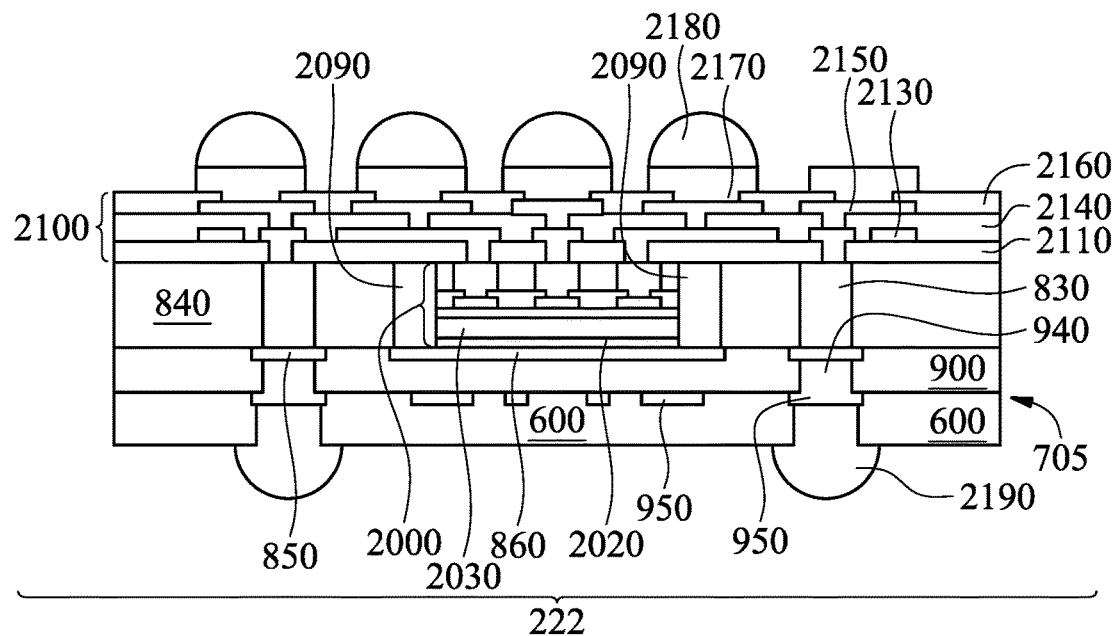

FIG. 44A illustrates that, after detaching the carrier substrate 2005, die connectors 2190 have been attached to respective die connector pads 950 of cavity substrate 705, in accordance with some embodiments. Die connectors 2190 may be formed using processes and materials similar to those discussed above with reference to FIG. 17. The structure shown in FIG. 44A may be referred to as an InFO package die 222 including cavity substrate 705, device 2000, active-side redistribution structure 2100, conductive connectors 2180, and die connectors 2190.

Figure 44B:
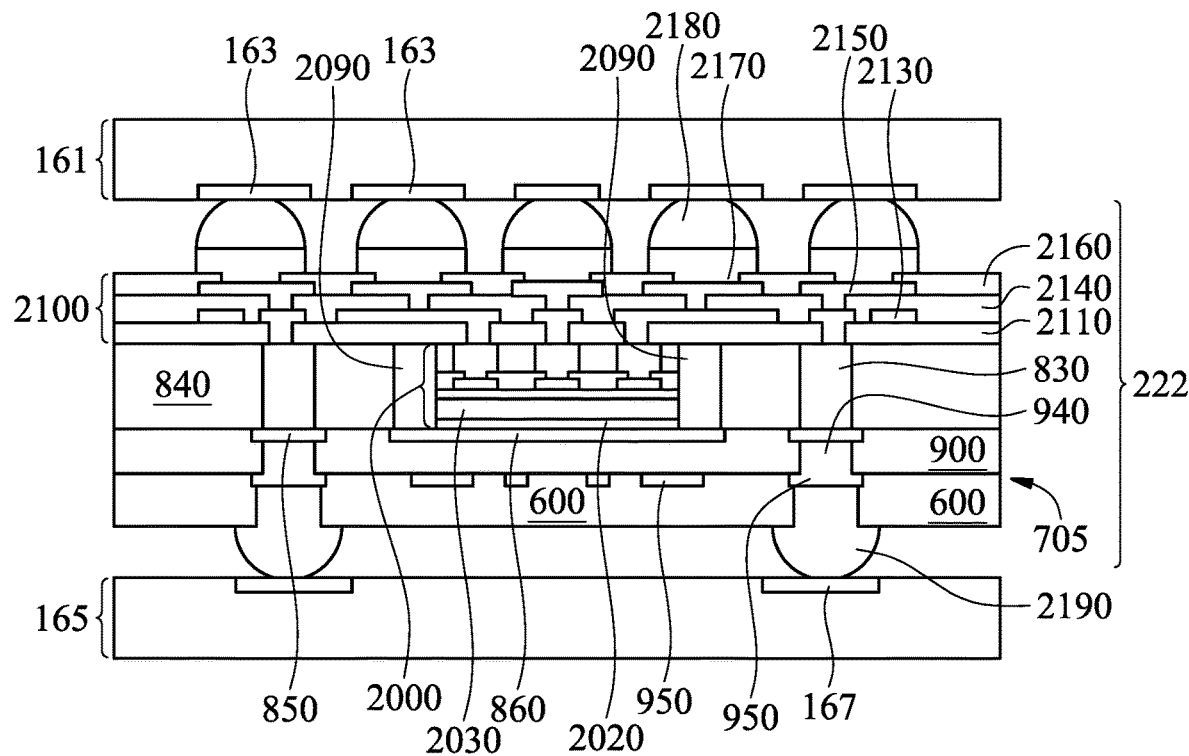

FIG. 44B illustrates a singulated InFO package 222 mounted to a substrate 161 using the conductive connectors 2180 and a second substrate 165 (similar to substrate 161) attached to the die connectors 2190 of InFO package 222.

Figure 45:
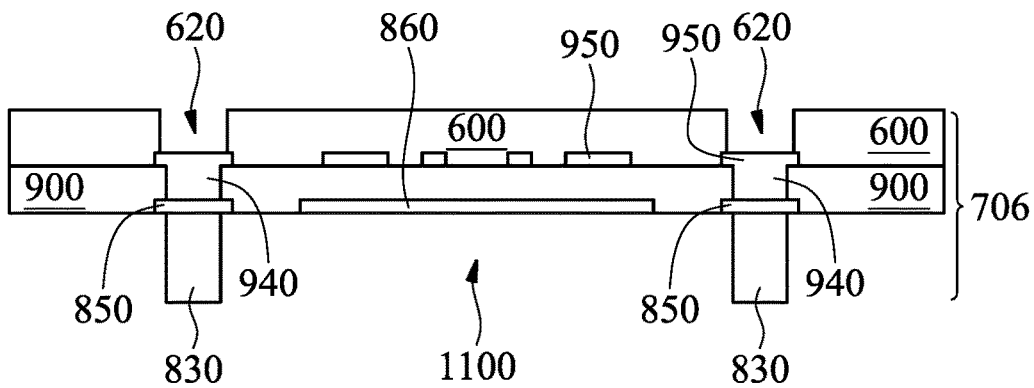
FIGS. 45 through 47B illustrate cross-sectional views of intermediate steps of forming integrated fan-out packages, in accordance with some embodiments.

FIGS. 45-47B illustrate cross-sectional views of forming an InFO package in accordance with some embodiments. The process illustrated in FIGS. 45-47B assume the process discussed above with reference to FIGS. 32-42, wherein like reference numerals refer to like elements, are performed first. Thereafter, as illustrated in FIG. 45, the sacrificial layer 840 (see FIG. 42) is removed to form cavity substrate 706.

The sacrificial layer 840 may be removed, for example, using techniques described above with reference to FIG. 8.

Figure 46:
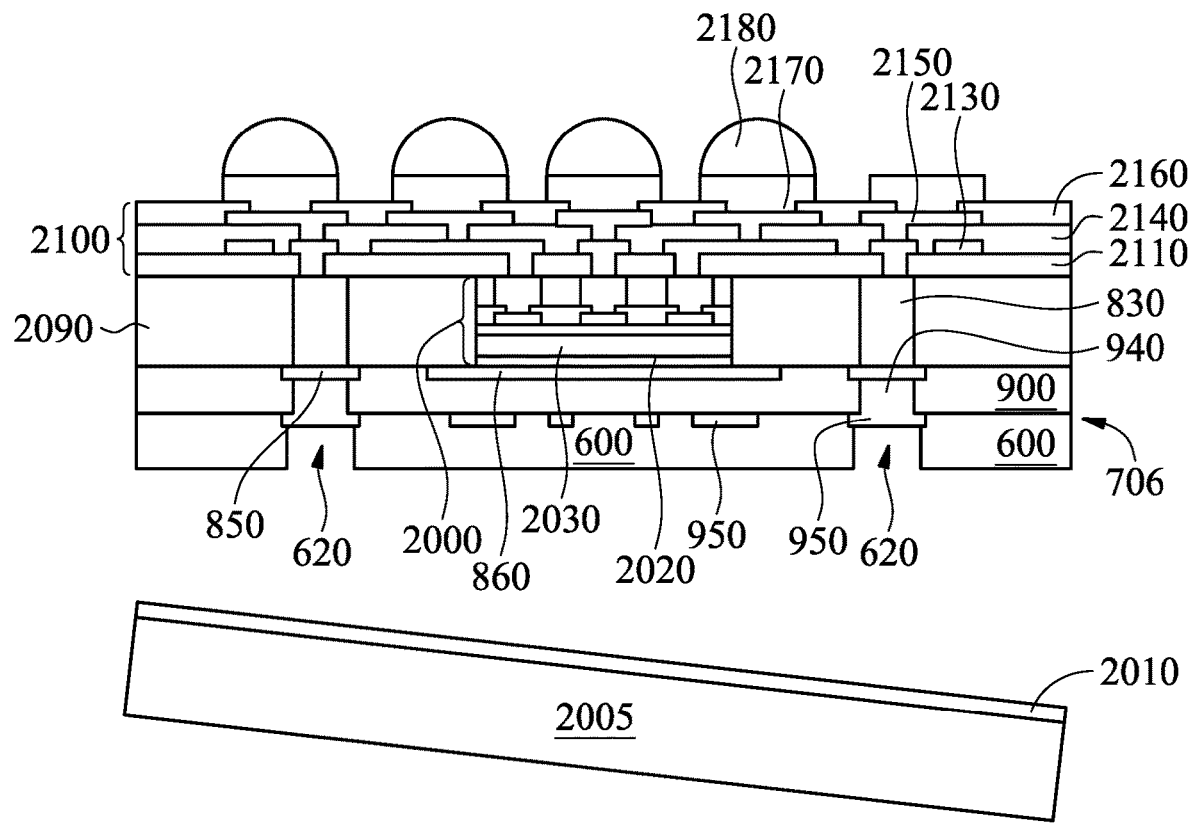

FIG. 46 illustrates that several processing steps may be performed after cavity substrate 706 is formed. In some embodiments, similar processes as those discussed above with reference to FIGS. 9-16 may be performed to obtain the structure illustrated in FIG. 46. For example, the cavity substrate 706 (see FIG. 45) may be attached to a carrier substrate 2005 and a device 2000 placed in the cavity 1100 (see FIG. 45) of the cavity substrate 706 as discussed above with reference to FIG. 9. The device 2000 may be encapsulated using encapsulant 2090 as discussed above with reference to FIG. 10. Additionally, a redistribution structure 2100 may be formed over the cavity substrate 706 and the device 2000, conductive die connectors 2180 formed on the UBMs 2170, and the carrier substrate 2005 detached from the cavity substrate 706 as discussed above with reference to FIG. 11-16.

Figure 47A:
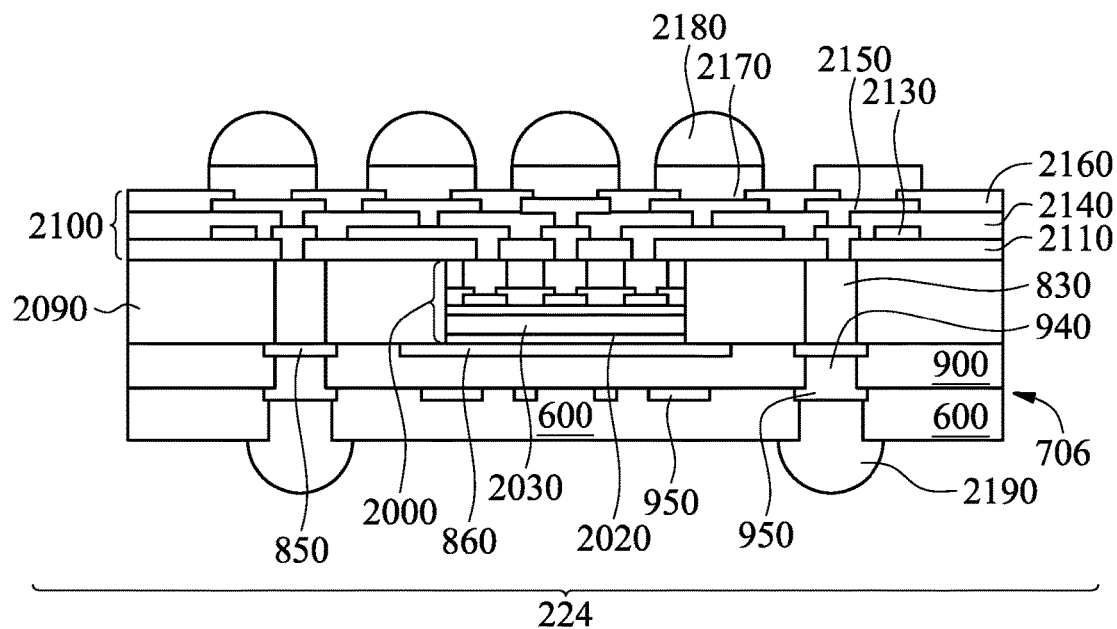

FIG. 47A illustrates that, after detaching the carrier substrate 2005, die connectors 2190 have been attached to respective die connector pads 950 of cavity substrate 706, in accordance with some embodiments. Die connectors 2190 may be formed using processes and materials similar to those discussed above with reference to FIG. 17. The structure shown in FIG. 47A may be referred to as an InFO package die 224 including cavity substrate 706, device 2000, active-side redistribution structure 2100, conductive connectors 2180, and die connectors 2190.

Figure 47B:
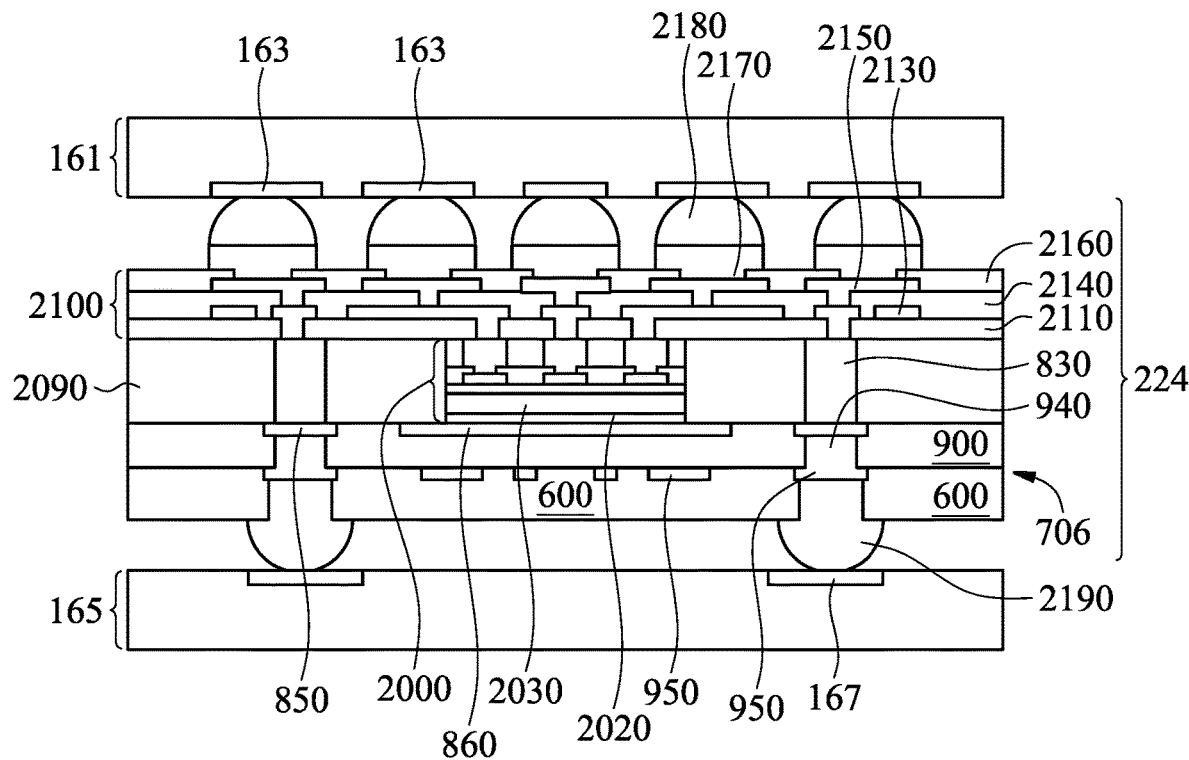

FIG. 47B illustrates a singulated InFO package 224 mounted to a substrate 161 using the conductive connectors 2180 and a second substrate 165 (similar to substrate 161) attached to the die connectors 2190 of InFO package 224. In some embodiments, structures such as that illustrated in FIGS. 46-47B may reduce warpage by increasing the amount of insulating layer 900.

Figure 48A:
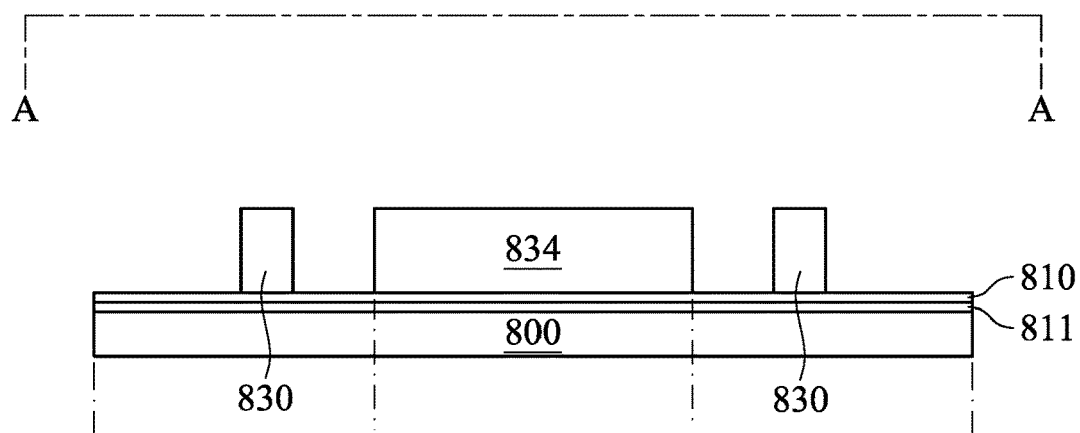
FIGS. 48A through 54B illustrate cross-sectional views of intermediate steps for forming integrated fan-out packages, in accordance with some embodiments.
Figure 48B:
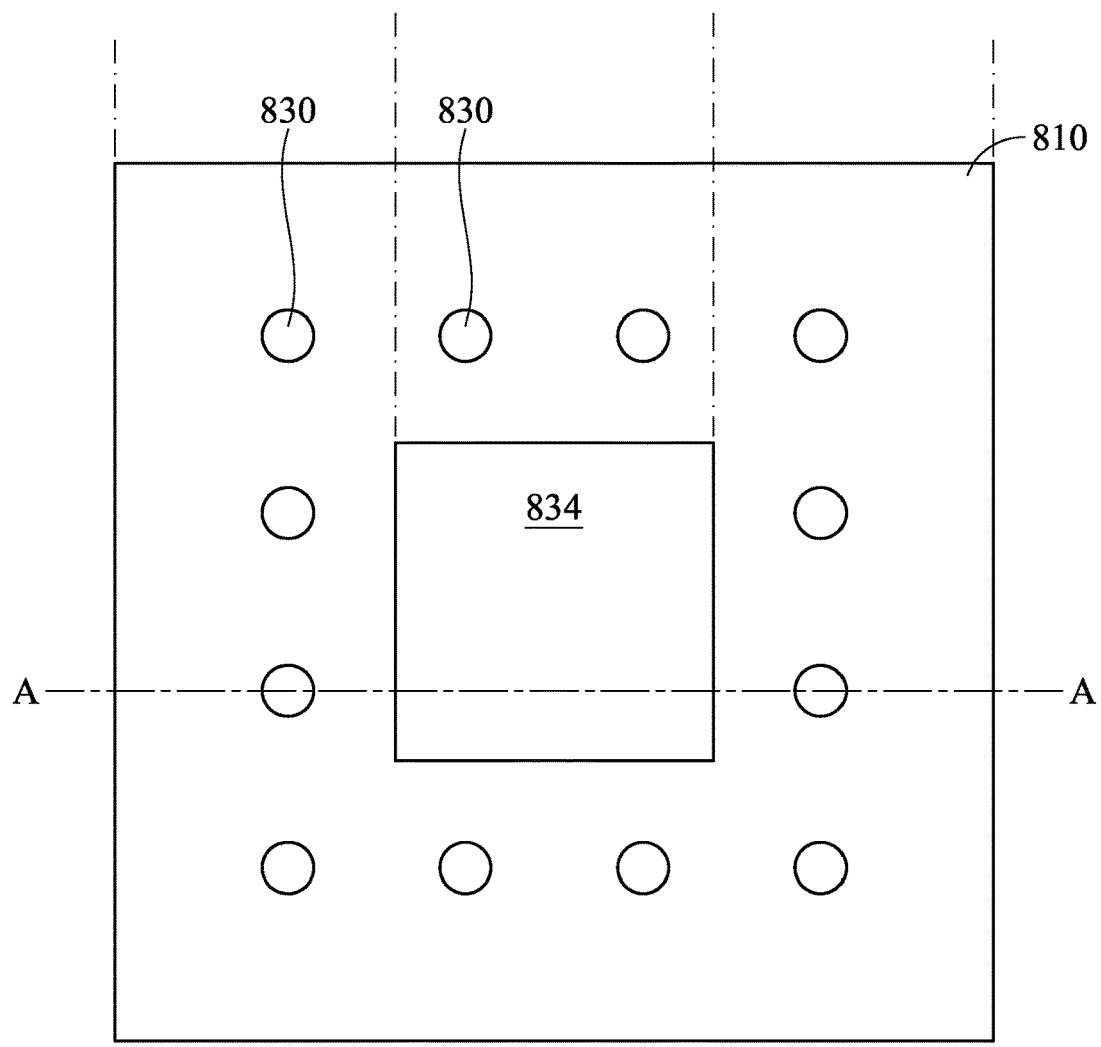

FIGS. 48A-54B illustrate cross-sectional views of forming an InFO package in accordance with some embodiments. Referring first to FIG. 48A, conductive pillars 830 and the sacrificial conductive region 834 are formed over a carrier substrate 800 and the seed layer 810 using, for example, similar materials and processes as discussed above with reference to FIGS. 32 through 34, wherein like reference numerals refer to like elements. The sacrificial conductive region 834 may be formed simultaneously as the conductive pillars 830. The sacrificial conductive region 834 represents a region in which a cavity will be formed in subsequent processing, as discussed below. A top view of trace 834, illustrated in FIG. 48B, indicates the region where the cavity opening will be subsequently formed. The line A-A indicates the axis corresponding to the cross-sectional view illustrated in FIG. 36A. It is seen from the cross-sectional view (FIG. 48A) in conjunction with the top view (FIG. 48B) that the conductive seed layer 810 electrically shorts the conductive pillars 830 and the conductive trace 834. As described in greater detail below, the seed layer 810 may be removed at a subsequent processing step to isolate the various conductive features such as the conductive pillars 830 and the conductive trace 834.

Figure 49:
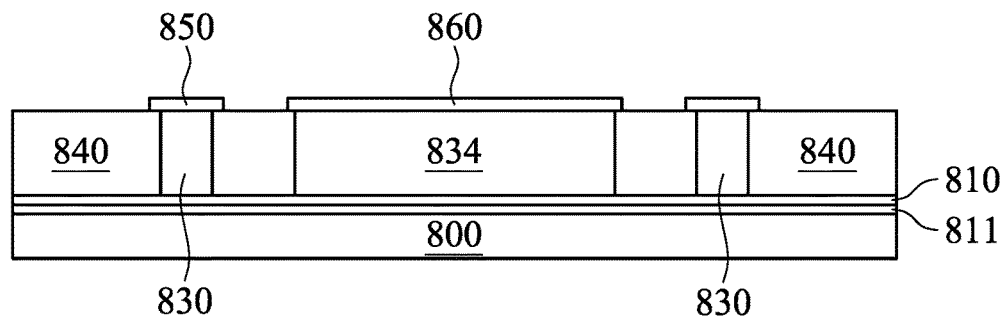

FIG. 49 illustrates forming an insulating sacrificial build-up layer 840 over the seed layer Bio and adjacent the conductive pillars 830 and the sacrificial conductive region 834 in accordance with some embodiments. The sacrificial build-up layer 840 may be formed using, for example, similar materials and processes as the sacrificial layer 840 discussed above with reference to FIG. 35.

FIG. 49 further illustrates conductive traces 850 and 860 formed over the conductive pillars 830 and the sacrificial conductive region 834. The conductive traces 850 and 860 may be formed simultaneously using, for example, processes and materials discussed above with reference to FIGS. 35 and 36, wherein like reference numerals refer to like elements. The planar dimensions of conductive traces 850 and 860 may be designed to be larger than those of the underlying respective conductive pillars 830 and the sacrificial conductive region 834 to allow some margin for misalignment.

Figure 50:
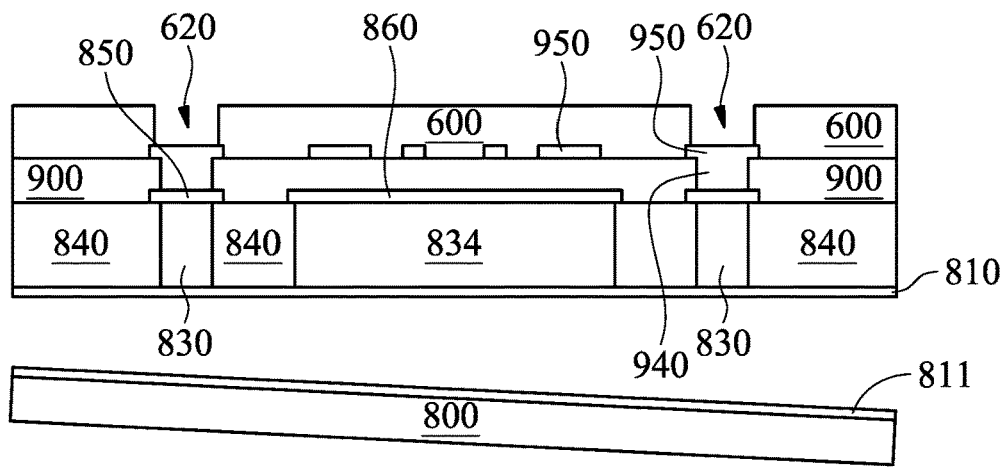

FIG. 50 illustrates the structure of FIG. 49 wherein the conductive traces 850 and 860 are covered by an insulating layer 900; conductive plugs 940 extend through the insulating layer 900, and conductive traces 950 are formed over selected regions of insulating layer goo; a protective layer 600 is formed over insulating layer 900 and conductive traces 950; openings 620 are formed in the protective layer 600 exposing selective conductive traces 950; and the carrier substrate 800 is removed, leaving the seed layer Bio exposed. The structure illustrated in FIG. 50 may be formed from the structure shown in FIG. 49 using, for example, processes and materials similar to those described above with reference to FIGS. 37 through 40, wherein like reference numerals refer to like elements.

Figure 51:
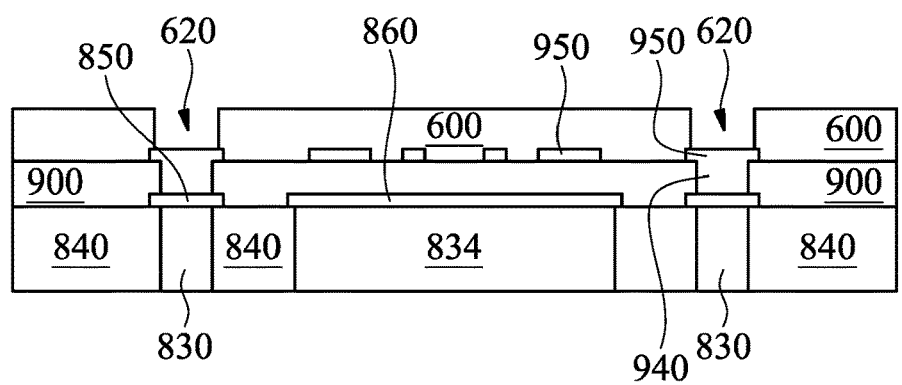

In FIG. 51 it is shown that the seed layer 810 may be removed by dissolving the unwanted metal in a wet chemical, or by dry etching, or any other suitable etching technique. Removing the seed layer 810 exposes the sacrificial conductive region 834.

Figure 52:
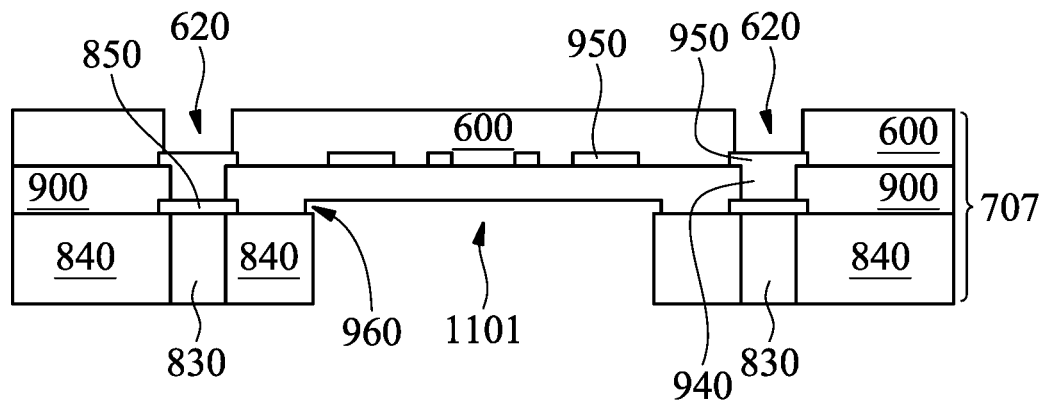

In FIG. 52 a cavity 1101 is formed by selectively removing sacrificial conductive region 834 and the conductive trace 860 using, for example, a patterned photoresist mask (not shown) and a suitable metal etching process (e.g., wet etch, or dry etch, or the like). In some embodiments, the exposed conductive trace 860 may include the same conductive material as the sacrificial conductive region 834 and may be removed during the processing step used to remove sacrificial conductive region 834. Removing the conductive trace 860 creates a recess in the insulation layer 900, because of which the depth of cavity 1101 exceeds the height of the insulating sacrificial build-up layer 840. The recessed portion of insulation layer 900 may extend beyond the sidewalls of the insulating sacrificial build-up layer 840, thereby forming an indent 960 reflecting the larger footprint of the now removed conductive trace 860. In some embodiments, the indent 960 may have a width from about 1 microns to about 10 microns. The resulting structure illustrated in FIG. 52 may be referred to as a cavity substrate 707.

Figure 53:
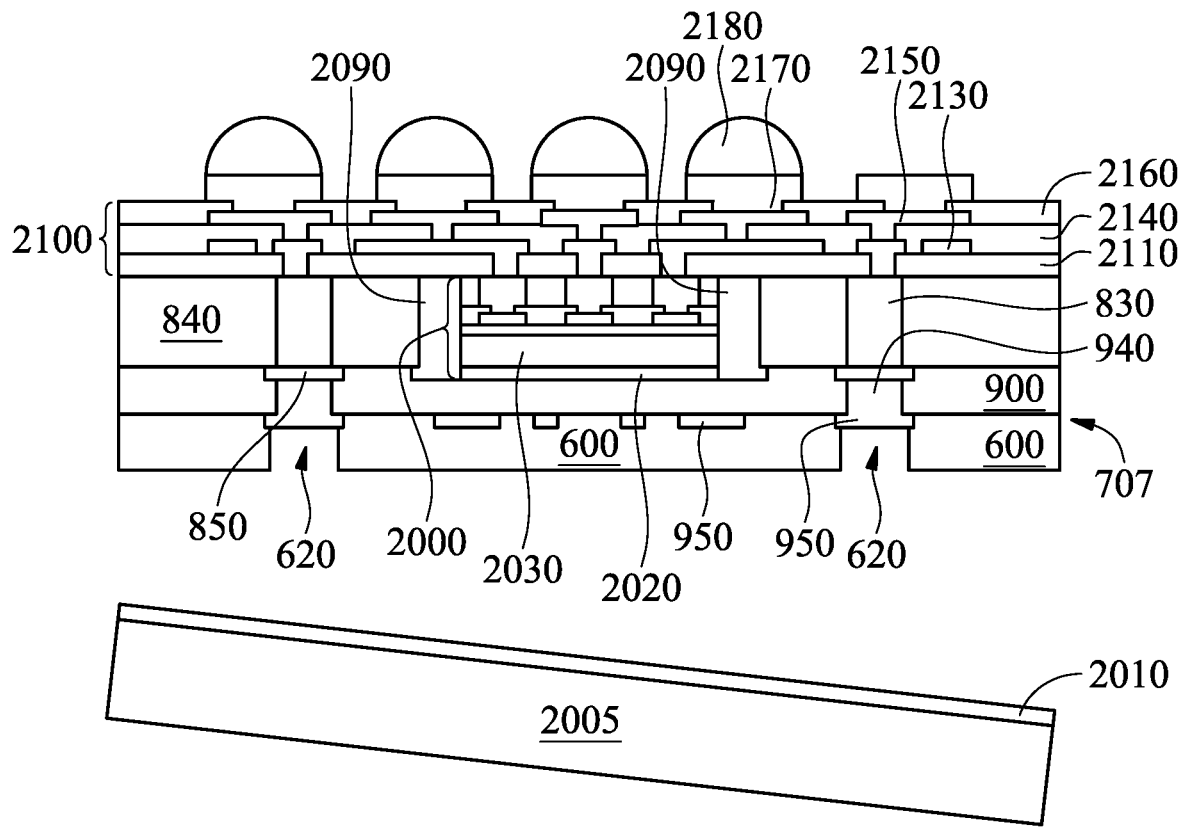

FIG. 53 illustrates that several processing steps may be performed after cavity substrate 707 is formed. In some embodiments, similar processes as those discussed above with reference to FIGS. 19 and 20 may be performed to obtain the structure illustrated in FIG. 53. For example, the cavity substrate 707 (see FIG. 52) may be attached to a carrier substrate 2005 and a device 2000 placed in the cavity 1101 (see FIG. 52) of the cavity substrate 707 as discussed above with reference to FIG. 19. The device 2000 may be encapsulated using encapsulant 2090. Encapsulant 2090 may also be formed in the shape of a ring filling the space between the sidewalls of device 2000 and the sidewalls of the cavity 1101 (shown in FIG. 52), as discussed above with reference to FIG. 19. Since the encapsulant 2090 fills the portion of the recess in the insulation layer 900 not occupied by the device 2000 (and the adhesive layer 2020), a topmost surface of the insulating layer 900 is higher than a bottommost surface of the encapsulant 2090, as illustrated in FIG. 53. The thickness of the encapsulant 2090 is about the same as the height of the device 2000. The backside of the device 2000 is attached to the insulating layer 900 using the adhesive layer 2020, and is isolated from the conductive traces 950 on the opposite side of insulating layer 900. Additionally, an active-side redistribution structure 2100 may be formed over the cavity substrate 707 and the device 2000, conductive die connectors 2180 formed on the UBMs 2170, and the carrier substrate 2005 detached from the cavity substrate 707 using similar processes as those discussed above with reference to FIG. 20.

Figure 54A:
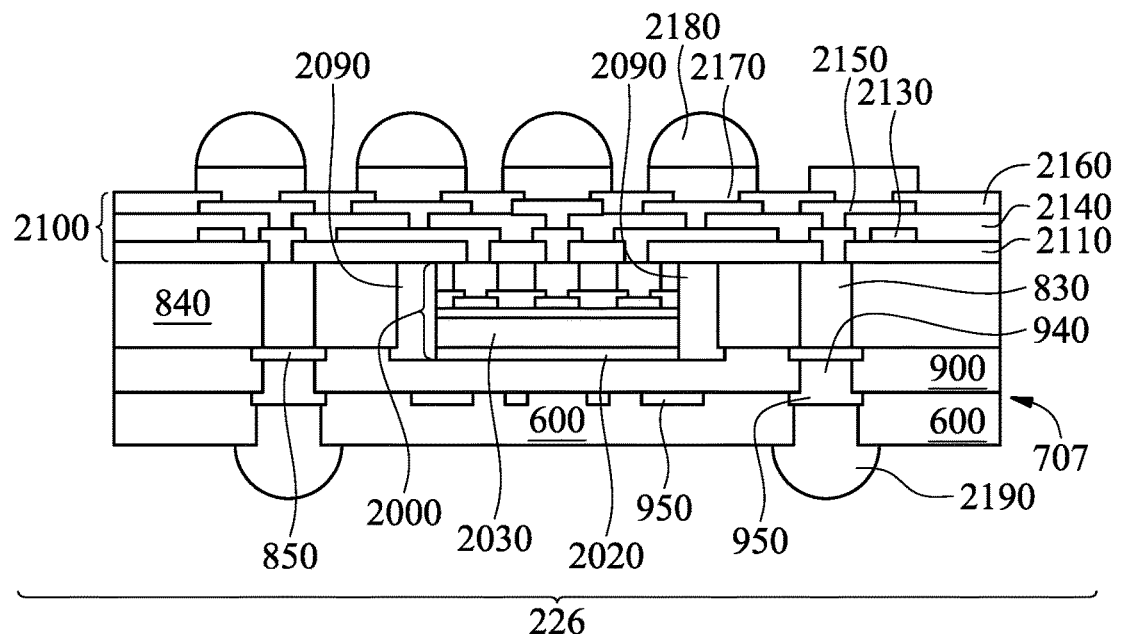

FIG. 54A illustrates that, after detaching the carrier substrate 2005, die connectors 2190 have been attached to respective die connector pads 950 of cavity substrate 707 and may be electrically connected to the active-side redistribution structure 2100 via the conductive plugs 940 and the conductive pillars 830, in accordance with some embodiments. Die connectors 2190 may be formed using processes and materials similar to those discussed above with reference to FIG. 17. The structure shown in FIG. 54A may be referred to as an InFO package die 226 including cavity substrate 707, device 2000, active-side redistribution structure 2100, conductive connectors 2180, and die connectors 2190.

Figure 54B:
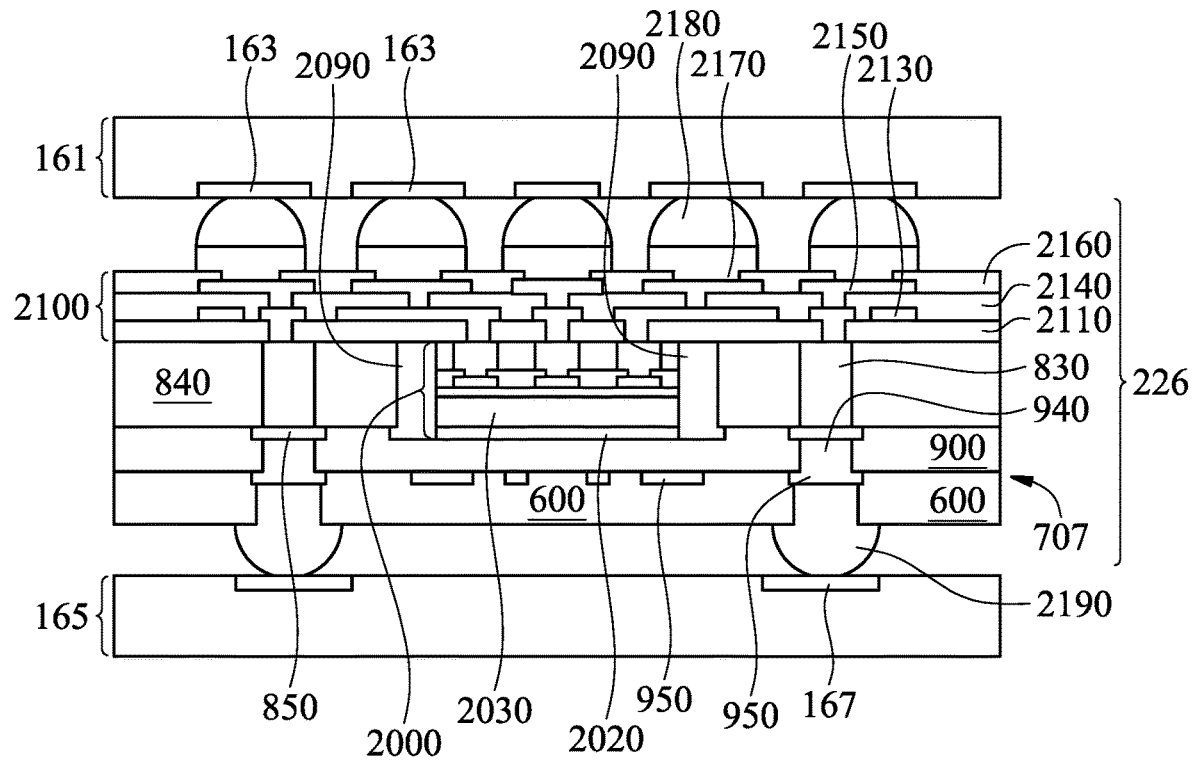

FIG. 54B illustrates a singulated InFO package 226 mounted to a substrate 161 using the conductive connectors 2180 and a second substrate 165 (similar to substrate 161) attached to the die connectors 2190 of InFO package 226.

Figure 55:
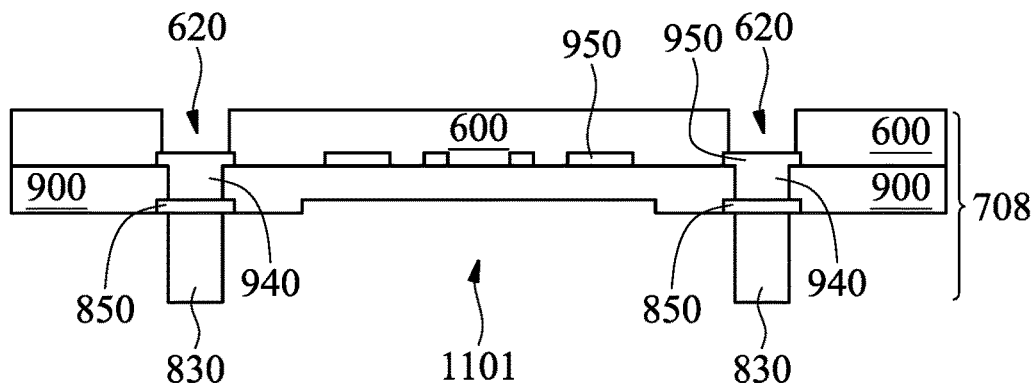
FIGS. 55 through 57B illustrate cross-sectional views of intermediate steps for forming integrated fan-out packages, in accordance with some embodiments.

FIGS. 55-57B illustrate cross-sectional views of forming an InFO package in accordance with some embodiments. The process illustrated in FIGS. 55-57 assume the structure discussed above with reference to FIG. 52, wherein like reference numerals refer to like elements, have been formed. Accordingly, FIG. 55 illustrates a cavity substrate 708 formed by removing the sacrificial insulating layer 840 (shown in FIG. 52) subsequent to forming cavity 1101 (also illustrated in FIG. 52). In some embodiments, the sacrificial insulating layer 840 may be removed using similar processes and materials as discussed above for removing sacrificial layer 400 with reference to FIG. 8.

Figure 56:
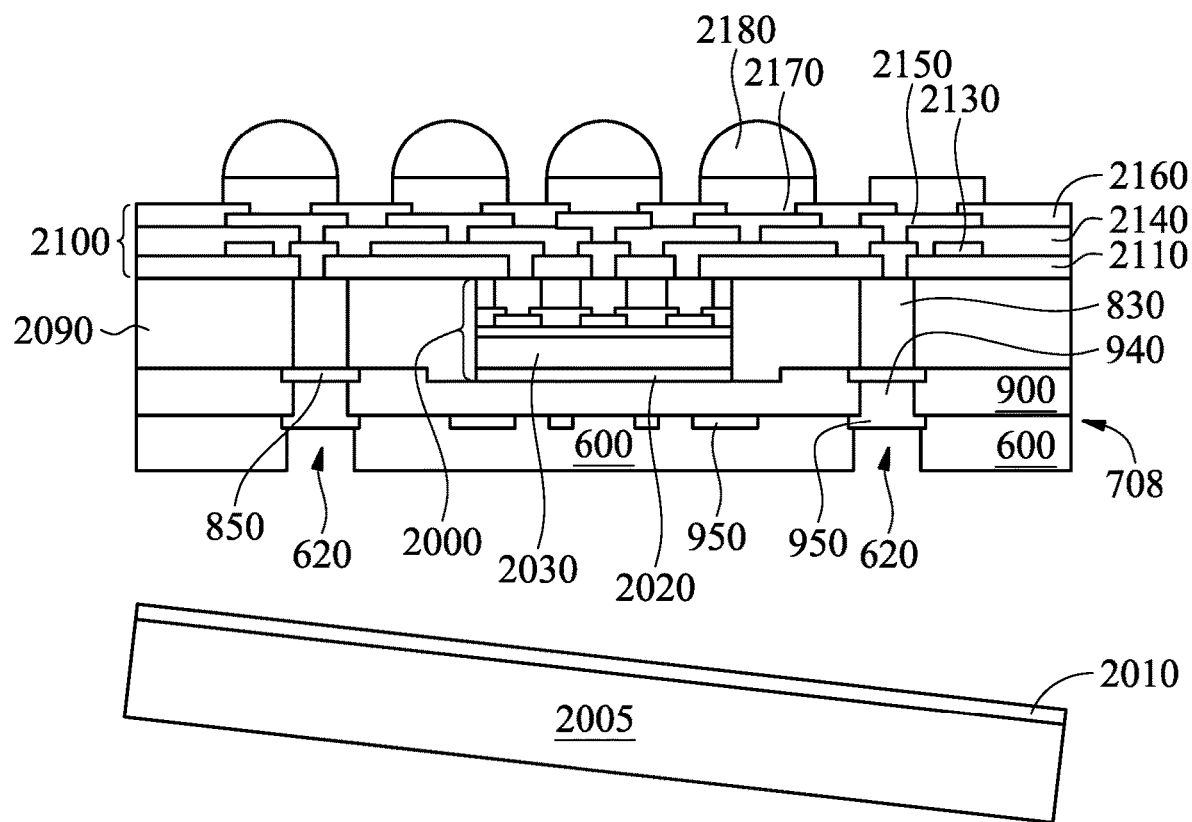

FIG. 56 illustrates that several processing steps may be performed after cavity substrate 708 is formed. In some embodiments, similar processes as those discussed above with reference to FIGS. 9-16 may be performed to obtain the structure illustrated in FIG. 56. For example, the cavity substrate 708 (see FIG. 55) may be attached to a carrier substrate 2005 and a device 2000 placed in the cavity 1101 (see FIG. 55) of the cavity substrate 708 using similar processes as those discussed above with reference to FIG. 9. The device 2000 may be encapsulated using encapsulant 2090 as discussed above with reference to FIG. 10. As illustrated in FIG. 56, the encapsulant 2090 fills the portion of the cavity 1101 (shown in FIG. 55) of cavity substrate 708 that is not occupied by the device 2000 and the adhesive 2020. In addition, in InFO packages using the cavity substrate 708 (e.g., InFO package 228 illustrated in FIG. 57A), the encapsulant 2090 fills the additional space vacated when the sacrificial insulating layer 840 (shown in FIG. 52) is removed. The encapsulant layer 2090 may have a nonuniform thickness. For example, the encapsulant 2090 adjacent to the sides of device 2000 is thicker than the encapsulant 2090 adjacent to the conductive pillars 830. Additionally, a redistribution structure 2100 may be formed over the cavity substrate 708 and the device 2000, conductive die connectors 2180 formed on the UBMs 2170, and the carrier substrate 2005 detached from the cavity substrate 703 using similar processes as those discussed above with reference to FIG. 11-16.

Figure 57A:
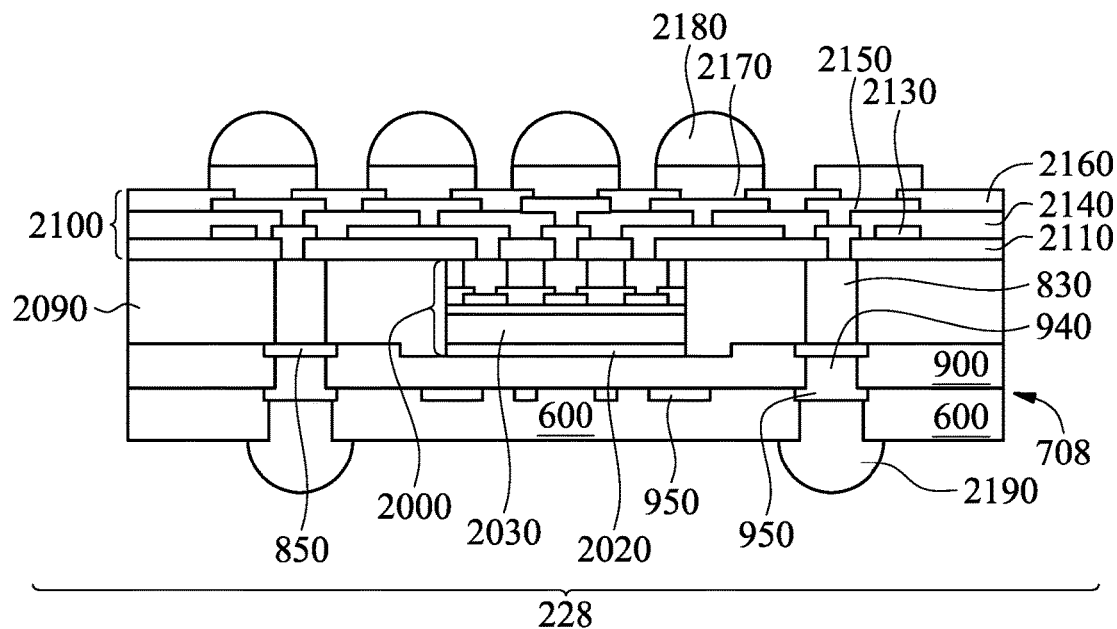

FIG. 57A illustrates that after detaching the carrier substrate 2005 die connectors 2190 have been attached to respective die connector pads 950 of cavity substrate 708, in accordance with some embodiments. Die connectors 2190 may be formed using processes and materials similar to those discussed above with reference to FIG. 17. The structure shown in FIG. 57A, after die connectors 2190 are formed, is an InFO package die 228 including cavity substrate 708, device 2000, active-side redistribution structure 2100, conductive connectors 2180, and die connectors 2190.

Figure 57B:
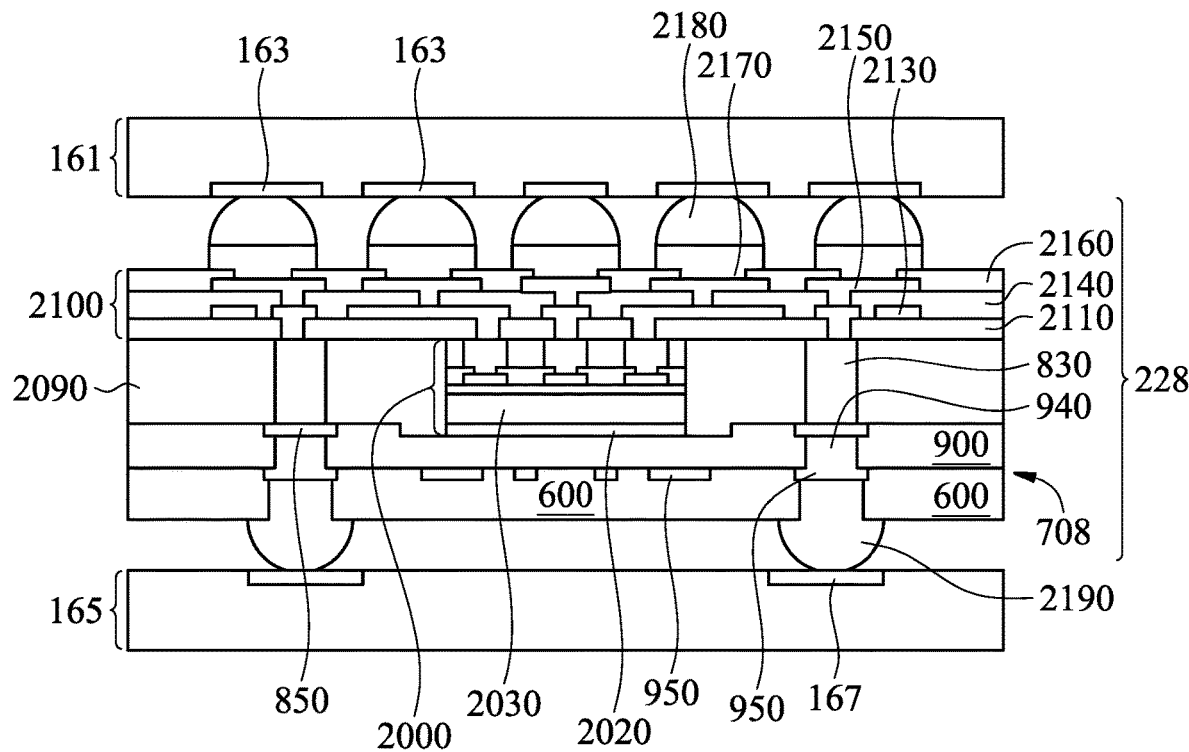

FIG. 57B illustrates a singulated InFO package 228 mounted to a substrate 161 using the conductive connectors 2180 and a second substrate 165 (similar to substrate 161) attached to the die connectors 2190 of InFO package 228.

The process flow described above in this disclosure with reference to FIGS. 9 through 17 is referred to as an example of an RDL-last flow because, in this example, the processing is done in the following sequence. First, cavity substrates are attached to a releasable carrier substrate. Next, one or more substrates are placed in each cavity of the cavity substrates with the active side of each substrate facing away from the carrier substrate (see FIG. 9). Then, an encapsulation layer is formed over the structure and etched back to expose a conductive surface of the die connectors of the cavity substrates and the substrates; and then a first RDL of an active-side redistribution structure is formed and connected to the die connectors of the substrates. This sequence is illustrated with reference to the process flows described above to form InFO packages 112, 114, 116, 118, 222, 224, 226, and 228.

In other embodiments, an RDL-first flow may be used. For example, first, an active-side redistribution structure is formed on a releasable carrier substrate. Next, one or more substrates are placed with the active side of each substrate attached to the RDL of the redistribution structure by die connectors of the substrates. Then, cavity substrates are attached to the RDL of the redistribution structure by die connectors with the cavity oriented to enclose the substrates. Examples of RDL-first process flows are discussed in greater detail below in this disclosure.

FIGS. 58A through 73 illustrate cross-sectional views of forming an InFO package, in accordance with some embodiments. An RDL-first flow is used in this example.

The processes illustrated in FIGS. 58A through 73 assume that the processes discussed above with reference to FIGS. 1 through 3, wherein like reference numerals refer to like elements, are performed first.

Figure 58A:
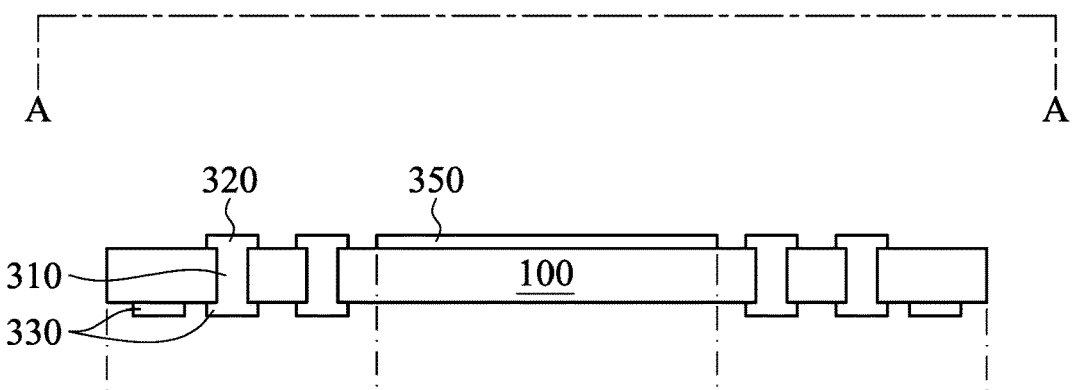
FIGS. 58A through 73 illustrate cross-sectional views of intermediate steps for forming integrated packages, in accordance with some embodiments.
Figure 58B:
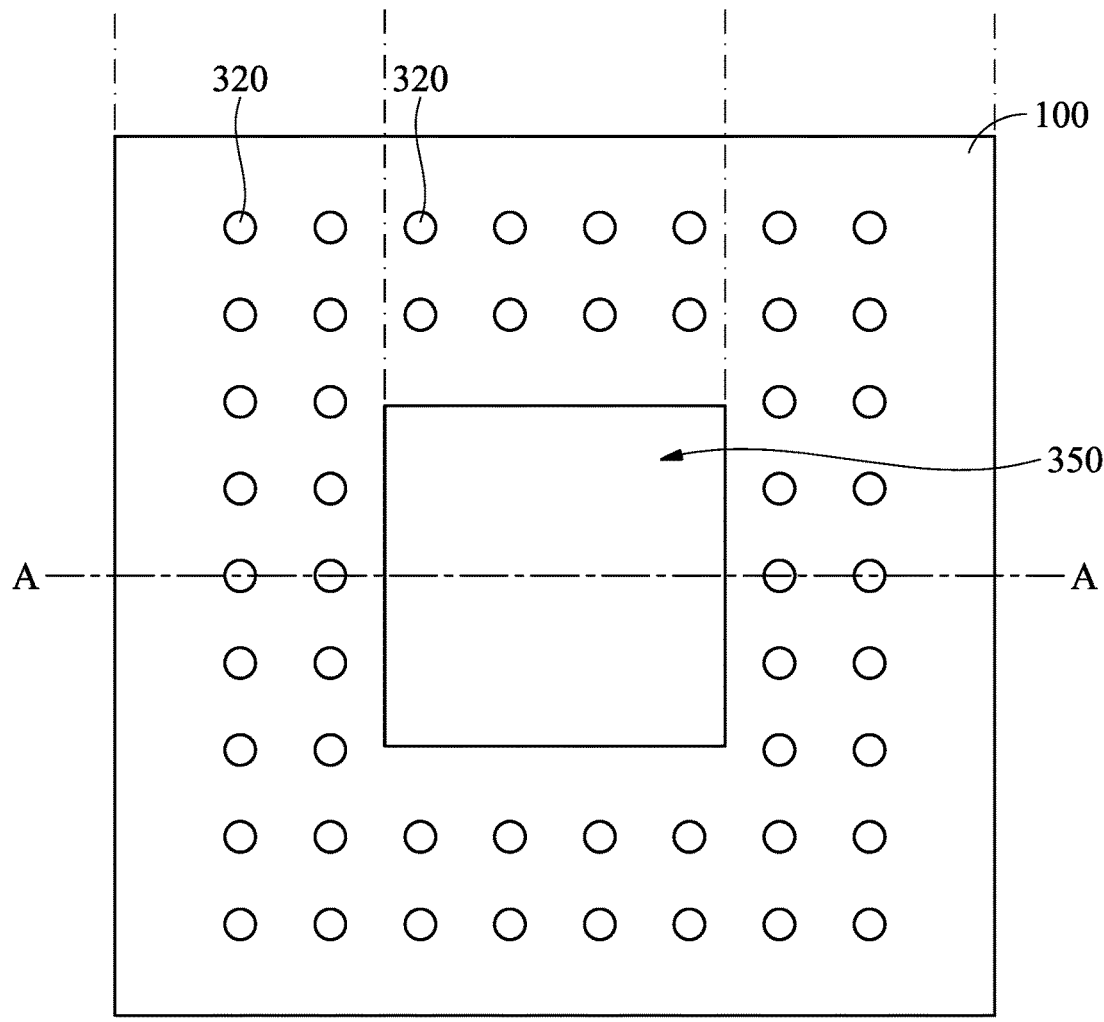

Referring to FIG. 58A, it is shown that a sacrificial etch-stop conductive trace 350 is formed over an area that is substantially coincident (within process variations) with the location where a cavity is formed in a subsequent processing step wherein the sacrificial etch-stop conductive trace 350 may be utilized as an etch-stop layer. A top view of the sacrificial etch-stop conductive trace 350 is illustrated in FIG. 58B. The planar dimensions of the region covered by the sacrificial etch-stop conductive trace 350 may be designed to be larger than the respective dimensions of the cavity opening that would be formed over it to allow some margin for misalignment. The line A-A indicates the axis corresponding to the cross-sectional view illustrated in FIG. 58A. Conductive traces 320 and the sacrificial etch-stop conductive trace 350 are formed simultaneously and are located on the opposite side of the insulation layer 100 relative to the side over which the cavity opening is formed subsequently. As discussed in greater detail below, the sacrificial etch-stop conductive trace 350 is a sacrificial conductive trace which may be removed when forming the cavity. The structures illustrated in FIG. 58 (e.g., conductive plugs 310, and conductive traces 320 and 350, and 330) may be formed using materials and processes similar to those discussed above with reference to FIGS. 1 through 3.

Figure 59:
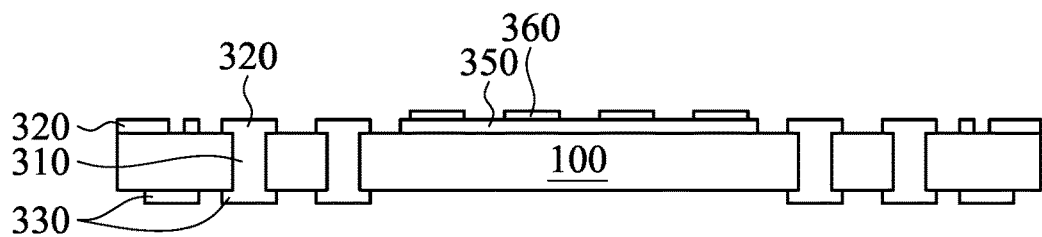

As illustrated in FIG. 59, another patterned layer of conductive traces 360 may be formed on the surface of the sacrificial etch-stop conductive trace 350. The conductive traces 360 in FIG. 59 are shown to be in physical contact with the surface of the sacrificial etch-stop conductive trace 350. Patterned conductive traces 360 may be formed, for example, by metal electroplating technique wherein the sacrificial etch-stop conductive trace 350 is used as the seed layer over which a patterned mask, for example a patterned photoresist layer, is formed by suitable photolithography techniques. Metal may be selectively deposited over the regions of the conductive trace 350 that are exposed by the patterned photoresist mask. As discussed in greater detail below, the sacrificial etch-stop conductive trace 350 is a sacrificial layer that may be removed selectively such that the conductive traces 360 may remain adhered to the cavity substrate structure when the sacrificial etch-stop conductive trace 350 is removed.

Figure 60:
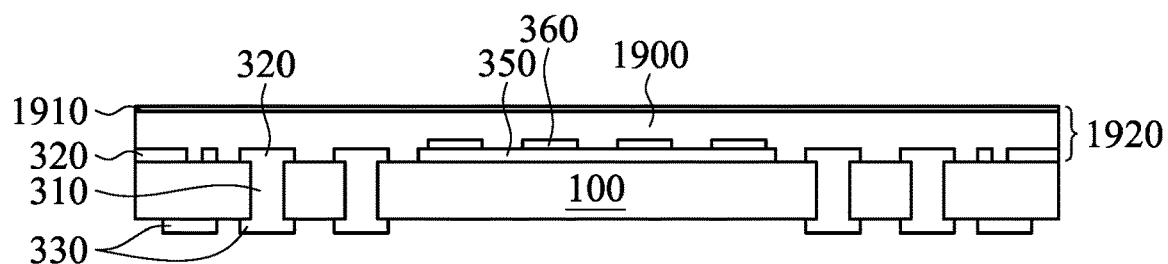
Figure 61:
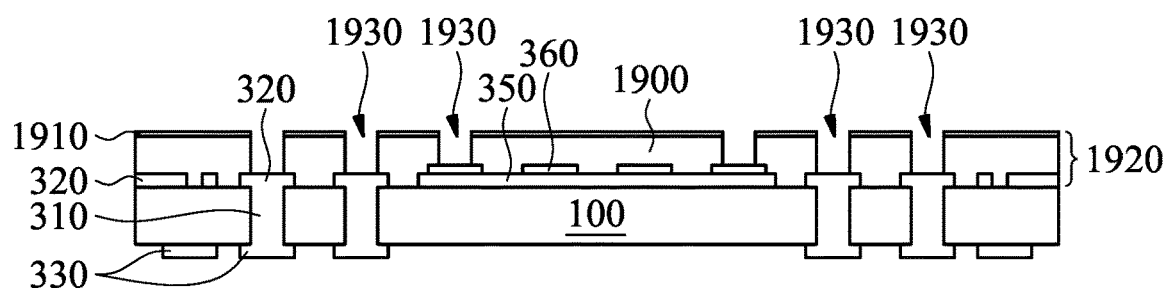

In FIGS. 60 and 61, a first single-sided metal-clad laminate 1920 and openings 1930 in the laminate 1920 are formed. FIG. 60 illustrates laminate 1920 formed over the conductive traces 320, the sacrificial etch-stop conductive trace 350, and the conductive traces 360. The laminate layer 1920 comprises an insulation layer 1900 and an exposed conductive layer 1910 (e.g., a metal foil) over insulation layer 1900. FIG. 61 illustrates openings 1930 extending through laminate 1920 to expose a portion of the conductive surface of selective conductive traces of layers 320 and 360. The materials and processes used to form the first single-sided metal-clad laminate 1920 and openings 1930 in FIGS. 60 and 61 may be similar to those discussed above with reference to FIG. 37 to form single-sided metal-clad laminate 920 and openings 930 extending through laminate 920.

Figure 62:
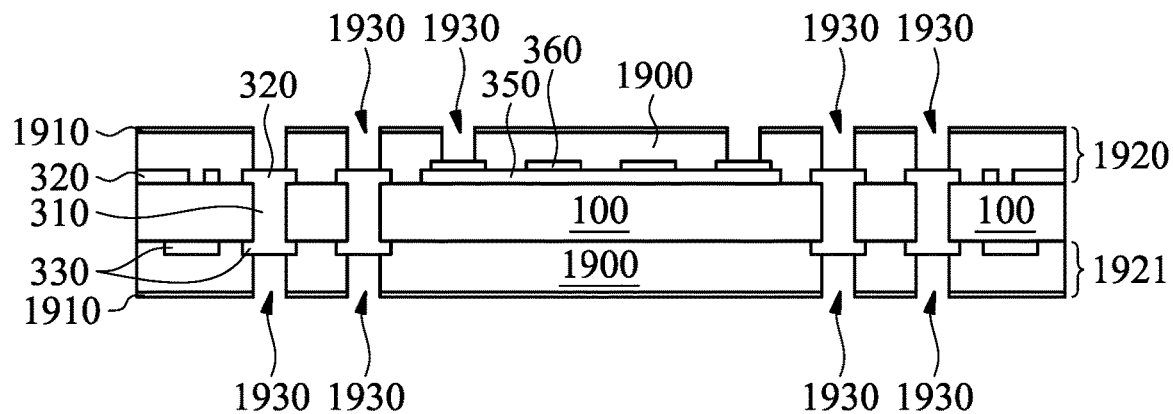

As illustrated in FIG. 62, a second single-sided metal-clad laminate 1921 and openings 1930 therein, may be formed on the opposite side of insulating layer 100 (relative to the side over which layer 1920 is formed). Openings 1930 in second laminate 1921 extend through the insulation layer 1900 to expose a portion of the conductive surface of selective conductive traces layer 330. FIG. 62 illustrates a structure with laminates 1920 and 1921 including identical insulation and conductive materials on either side of insulation layer 100, in accordance with some embodiments. In some embodiments the laminates 1920 and 1921 may have different structures and comprise different materials. The materials and processes used to form the second single-sided metal-clad laminate 1920 and openings 1930 therein may be the same as those used to form first single-sided metal-clad laminate 1920 and openings 1930 therein.

Figure 63:
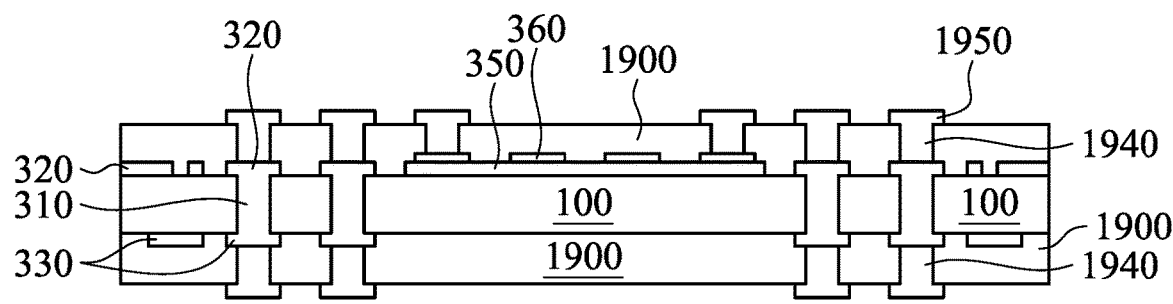

FIG. 63 illustrates a pair of layers of conductive plugs 1940 embedded in patterned insulation layers 1900 (of first and second laminates 1920 and 1921, respectively) and a pair of layers of conductive traces 1950 formed over patterned insulation layer 1900 (of first and second laminates 1920 and 1921, respectively). Although one pair of patterned insulation layers 1900, conductive plugs 1940, and conductive traces 1950 are illustrated in FIG. 63, it is understood that several such structures may be formed, stacked vertically over either or both sides of insulation layer 100. The materials and processes used to form the conductive plugs 1940, and the conductive traces 1950 in FIG. 63 may be the same or similar as those discussed above with reference to FIGS. 1 through 3 to form conductive plugs 310 and conductive traces 320 and 330. Additionally, the insulating layers 1900 may be formed on a single side of the insulating layer 100, rather than pairs of insulating layers 1900 formed on opposing sides of the insulating layer 100, in some embodiments.

Figure 64:
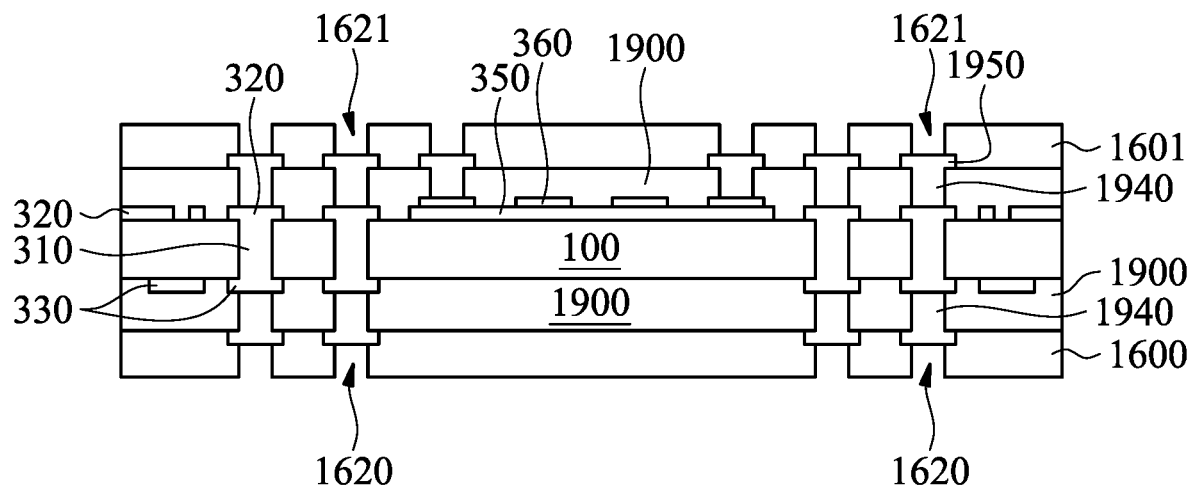

Referring now to FIG. 64, in some embodiments, patterned protective layers 1600 and 1601 (e.g., solder resist) with openings 1620 and 1621 are formed over the conductive traces 1950 to protect areas of the insulation layers 1900 from external damage. Openings 1620 and 1621 expose underlying portions of selected conductive traces 1950 that may be used as die connector pads to which die connectors can be attached. The protective layer 1600 and openings 1620 may be formed using, for example, processing techniques such as those described earlier in reference to protective layer 600 and openings 620 illustrated in FIG. 6.

Figure 65:
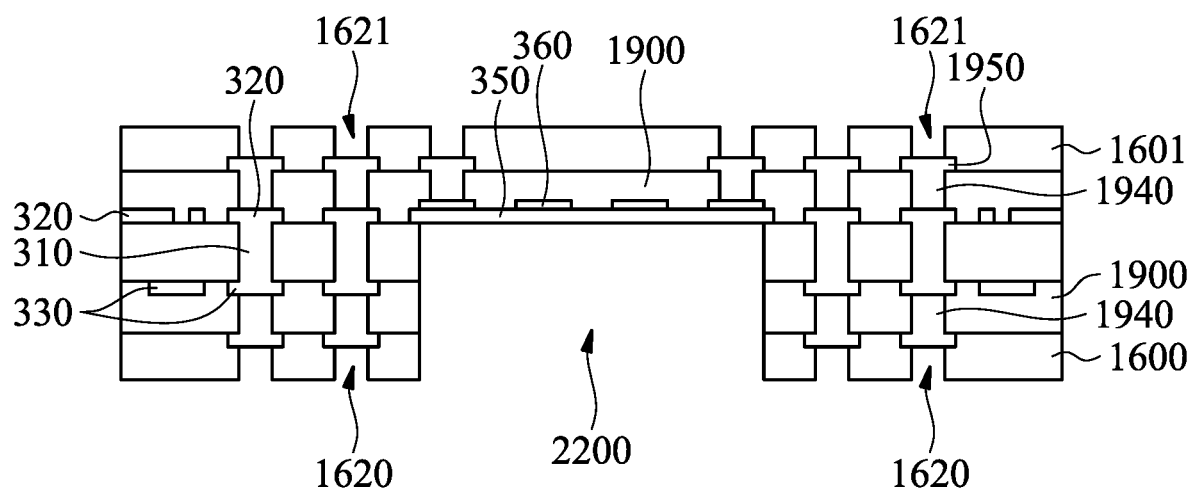

As illustrated in FIG. 65, cavity 2200 may be formed by removing portions of the insulating layers 1600, 1900, and 100 that are vertically adjacent to the sacrificial etch-stop conductive trace 350. The cavity 2200 exposes a surface of the sacrificial etch-stop conductive trace 350 which was in physical contact with the first insulating layer 100. Removal of material to form cavity 2200 may be performed by a laser drilling processing technique wherein the sacrificial etch-stop conductive trace 350 is used as an etch stop layer. As described with reference to FIGS. 58A and 58B, the planar dimensions of the sacrificial etch-stop conductive trace 350 may be designed to be sufficiently large to ensure that the entire region exposed to the drilling process is included within the area covered by the sacrificial etch-stop conductive trace 350.

Figure 66A:
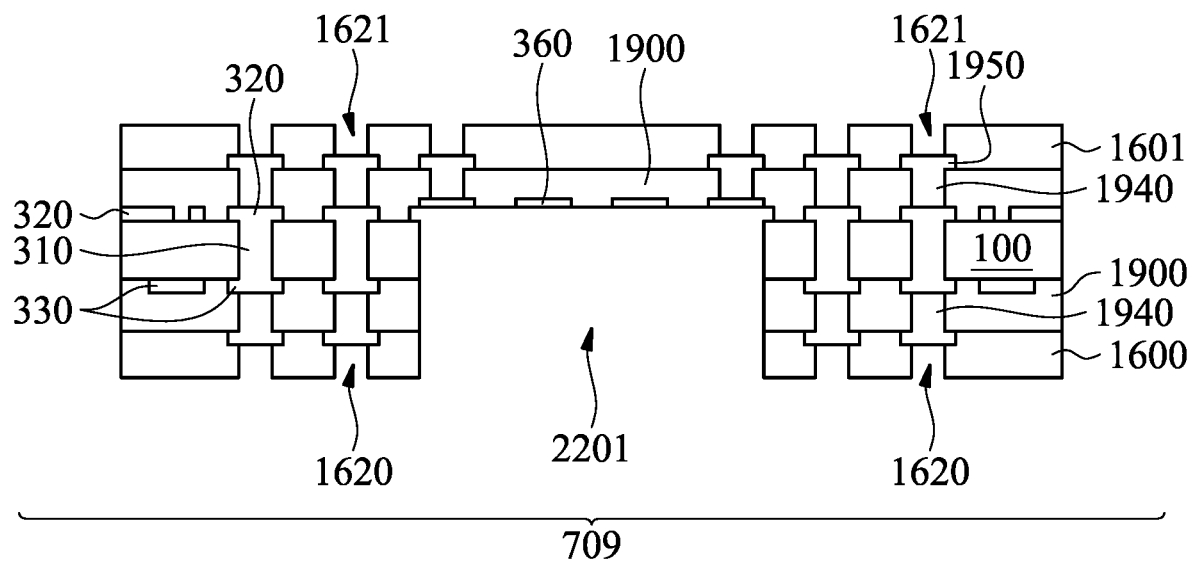
Figure 66B:
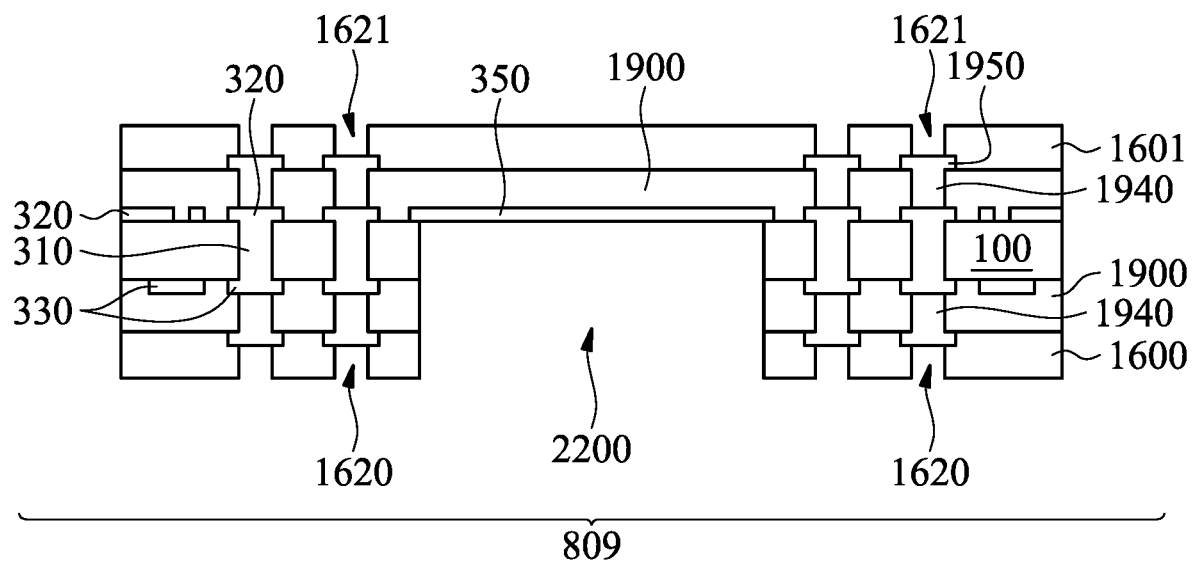

In FIG. 65, the sacrificial etch-stop conductive trace 350 electrically connects the conductive traces 360. An etch process may be performed to disconnect these electrical shorts. In FIG. 66A, the sacrificial etch-stop conductive trace 350 has been removed using a suitable metal etching technique (e.g., wet etch, or dry etch, or the like) thereby removing the undesirable electrical shorts. In embodiments in which the conductive traces 360 are utilized to route signals or to form physical and electrical connections to die connectors of a device (not shown), the sacrificial conductive trace 350 may be removed to form cavity 2201. The processing parameters (e.g., time period, end-point detection) for etching sacrificial etch-stop conductive trace 350 are adjusted such that the undesired electrical shorts are removed without causing excessive loss of material from any of the conductive traces of patterned conductive layer 360. Excessive loss of material from a conductive trace may cause the electrical resistance of the trace to be unacceptably high and may even result in an electrical open. The resulting structure may be referred to as a cavity substrate 709. In other embodiments in which the conductive traces 360 are not formed, the sacrificial etch-stop conductive trace 350 may remain, thereby allowing the sacrificial etch-stop conductive trace 350 to act, for example, as a heat sink, as illustrated in FIG. 66B. The resulting structure may be referred to as a cavity substrate 809.

FIGS. 67 through 73 illustrate a sequence of processing steps that may be used to fabricate a multi-chip module (MCM) wherein cavity substrate 709 (illustrated in FIG. 66A) is used as an interposer in an MCM fan-out package. It is understood that, in some other embodiments, other cavity substrate structures may be likewise used to form other MCM fan-out packages.

Figure 67:
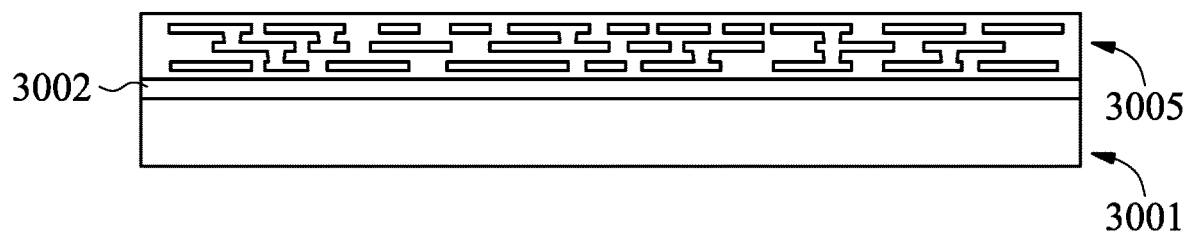

Referring first to FIG. 67, there is shown a carrier substrate 3001 having a release layer 3002, similar to the carrier substrate 2005 and the release layer 2010 (shown in FIG. 9).

Also shown in FIG. 67, there is shown a first fan-out redistribution structure 3005 formed on the surface of carrier substrate 3001. The redistribution structure 3005 may be formed over carrier substrate 3001 using a fabrication method similar to the fabrication method used to form the redistribution structure 2100 described earlier using FIGS. 11 through 14.

Figure 68:
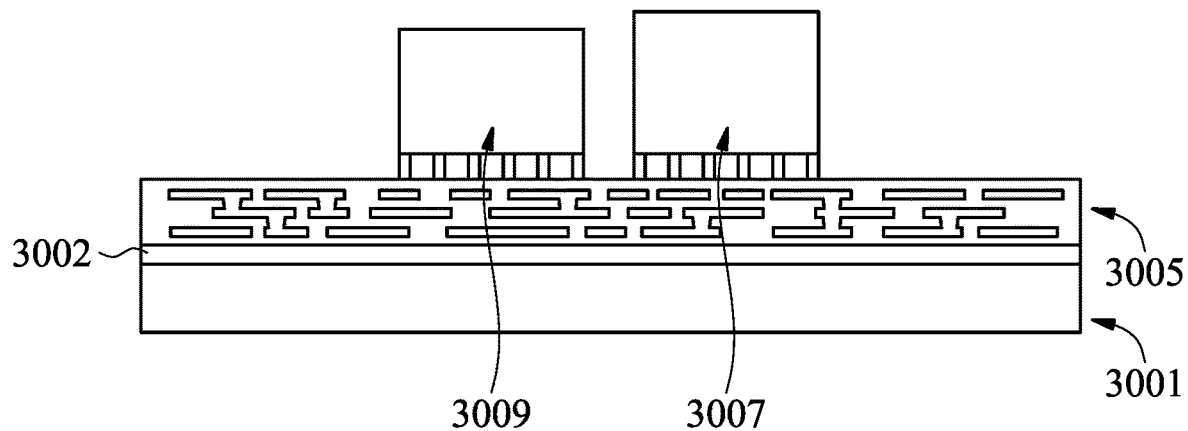

FIG. 68 illustrates that one or more semiconductor devices (such as semiconductor devices 3007 and 3009) may be placed side-by-side on the redistribution structure 3005 by, for example, a pick-and-place (PnP) method, and attached to the redistribution structure 3005 using any suitable conductive die connectors. The devices 3007 and 3009 may include an integrated circuit die, a packaged die, an integrated passive device (IPD), an interposer, an antenna-in-package (AIP), a micro-electro-mechanical system (MEMS) package, combinations thereof, or the like. In the example illustrated in FIG. 68, a first device 3007 (e.g., an SoC) and a second device 3009 (e.g., a DRAM) are shown connected to the redistribution structure 3005 with micro bumps (e.g., solder micro bumps) used as die connectors. Other bonding techniques, such as direct metal-to-metal bonding, hybrid bonding, or the like, may also be used.

Figure 69:
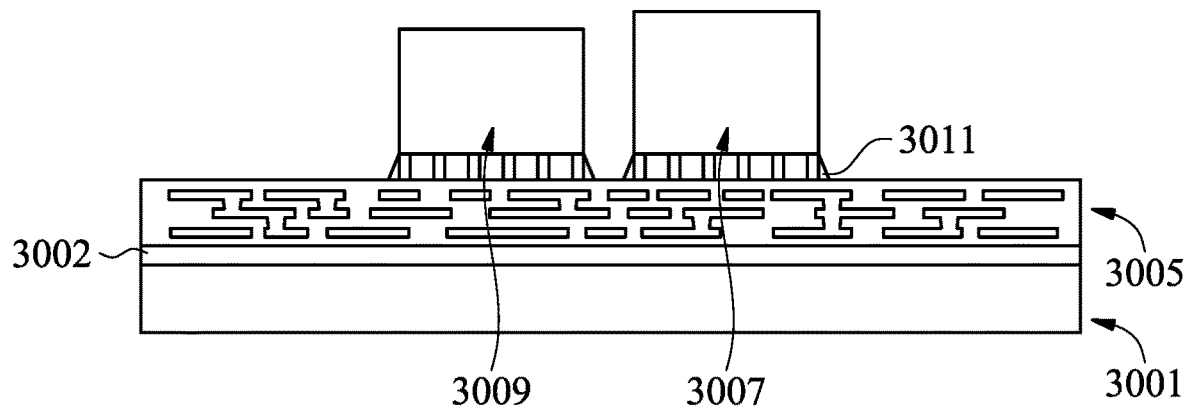

FIG. 69 illustrates that, after the devices 3007 and 3009 have been attached to redistribution structure 3005, an underfill 3011 may be applied between the devices 3007 and 3009 and the first redistribution structure 3005. In the example illustrated in FIG. 70, an underfill 3011 is dispensed surrounding the micro bumps that are used as die connectors to connect the devices 3007 and 3009. However, any suitable material may be utilized. The underfill may reduce stress resulting from the reflowing of the solder of the micro bumps and protect the joints. In some embodiments, the underfill may be formed by a capillary flow process or may be formed by any suitable deposition technique.

Figure 70:
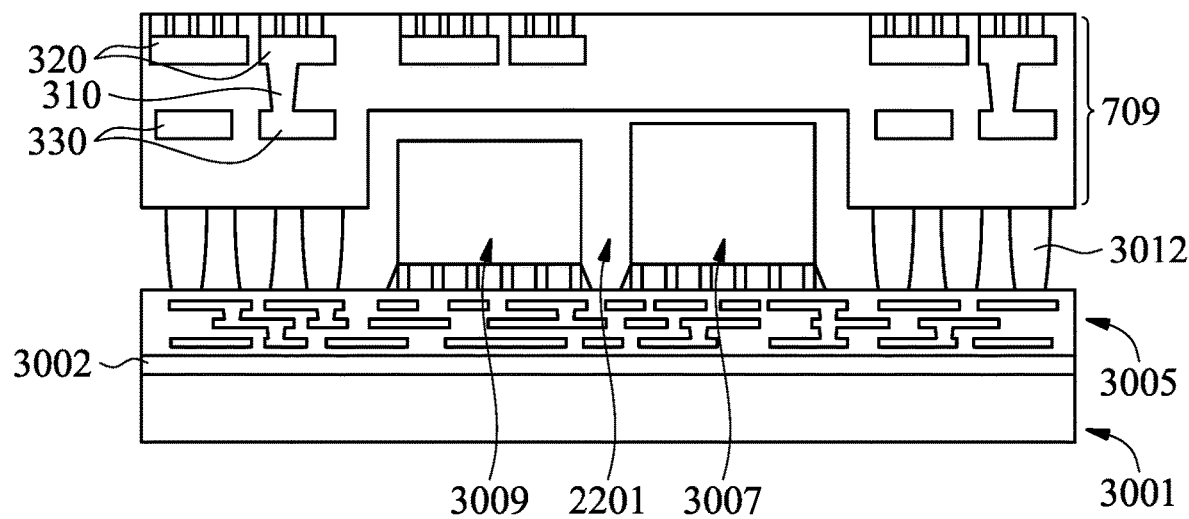

FIG. 70 illustrates that cavity substrate 709 may be placed on the redistribution structure 3005 by a PnP method, and the cavity substrate 709 may be attached to the redistribution structure 3005 using any suitable conductive die connectors 3012, such as solder micro bumps. In the example illustrated in FIG. 70, cavity substrate 709 is intended for use as an interposer to make electrical connections between the redistribution structure 3005 and devices that would subsequently be placed over the top side of cavity substrate 709. The schematic illustration of FIG. 70 indicates that these electrical connections utilize a redistribution structure of cavity substrate 709 (as described earlier in more detail and shown in FIG. 66A) including one or more layers of conductive traces separated by insulation layers and connected by conductive plugs extending through the insulation layers.

As illustrated in FIG. 70, the relative placements of cavity substrate 709 and of devices 3007 and 3009 may be such that the devices 3007 and 3009 are inside the cavity 2201 of the cavity substrate 709. The cavity 2201 of cavity substrate 709 has continuous sidewalls and a bottom wall. Because of that, this structure may limit the maximum vertical dimension of the devices 3007 and 3009 so that devices 3007 and 3009 may be accommodated within the space of cavity 2201.

Figure 71:
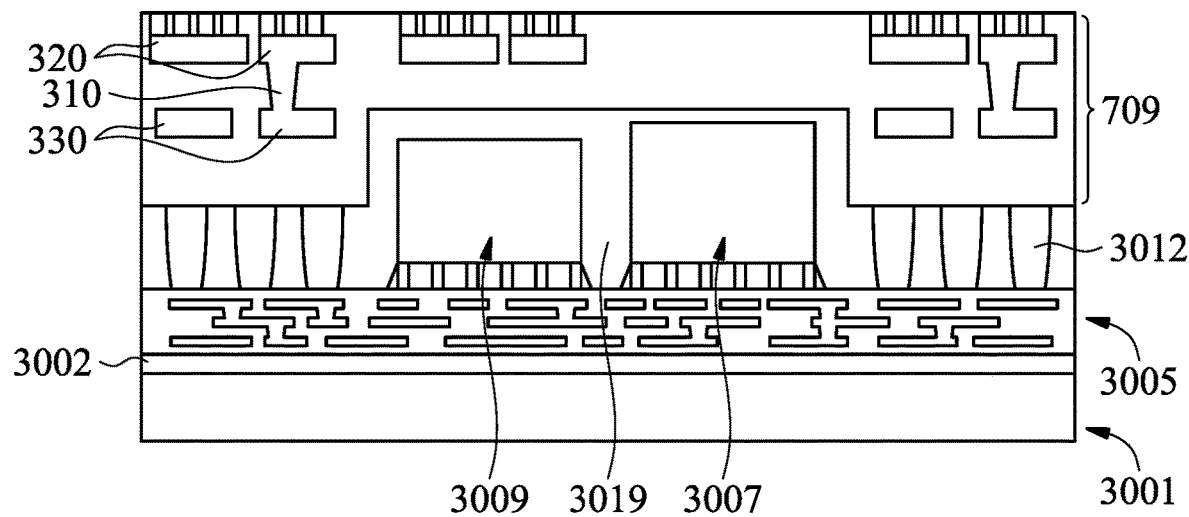

Next, as illustrated in FIG. 71, the various components (e.g., cavity substrate 709 and devices 3007 and 3009) may be encapsulated by encapsulant 3019. The encapsulant layer 3019 is shown to fill the unfilled space of cavity 2201 and the gaps between the cavity structure 709 and the redistribution structure 3005, including the regions between the various components (e.g., cavity substrate 709, and devices 3007 and 3009). The encapsulant 3019 may be an underfill, or molding compound, epoxy, or the like, and may be applied by compression molding, transfer molding, or the like, and cured after application.

Figure 72:
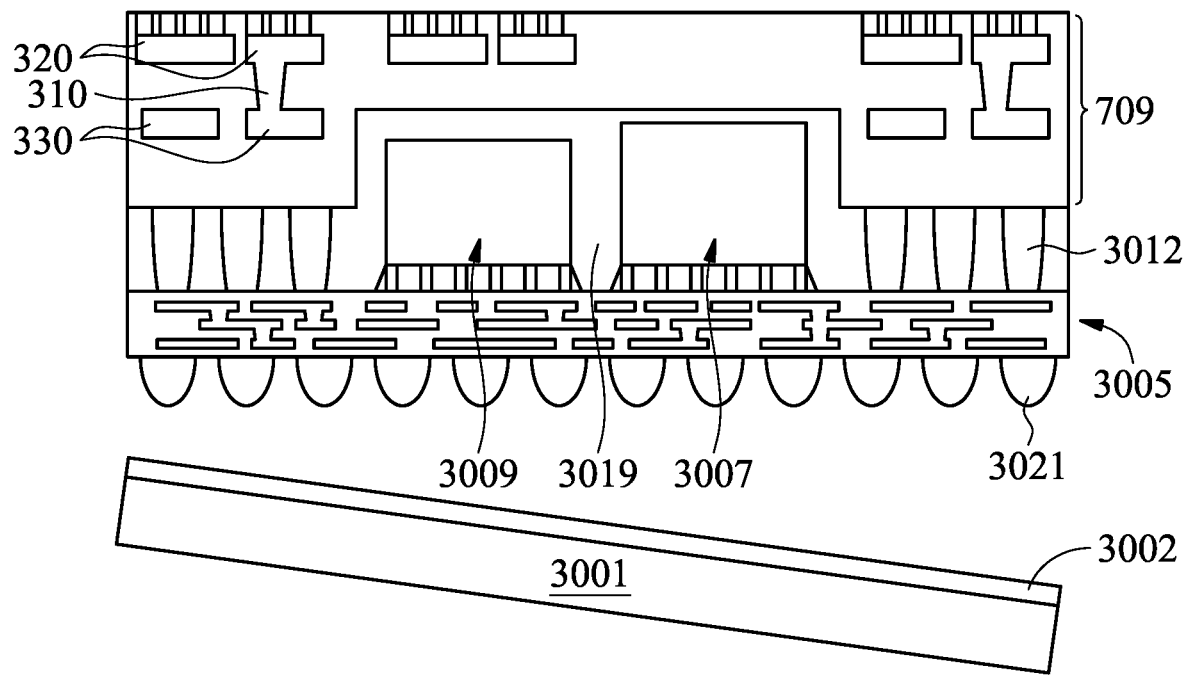

In FIG. 72, a carrier substrate de-bonding is performed (using a method similar to that described above with reference to FIG. 16) to detach the carrier substrate 3001 from the redistribution structure 3005 utilizing the release layer 3002. Removing the carrier substrate 3001 exposes the outermost dielectric layer of the redistribution structure 3005. After de-bonding, openings may be formed through the outermost dielectric layer of redistribution layer 3005 to selectively reveal the conductive traces of the vertically adjacent metallization pattern. The openings through the outermost dielectric layer of redistribution layer 3005 may be formed, for example, using laser drilling, etching, or the like. In some embodiments, an additional UBM layer may be formed by depositing one or more conductive layers over the outermost dielectric layer and extending to the outermost conductive traces. As illustrated in FIG. 72, conductive connectors 3021 may be formed on exposed portions of the conductive traces of the redistribution structure 3005 using a method similar to the methods described above with reference to FIGS. 15 and 17 to form conductive connectors 2180 and 2190, respectively. In some embodiments, a UBM feature may be formed on exposed portions of the conductive traces.

Figure 73:
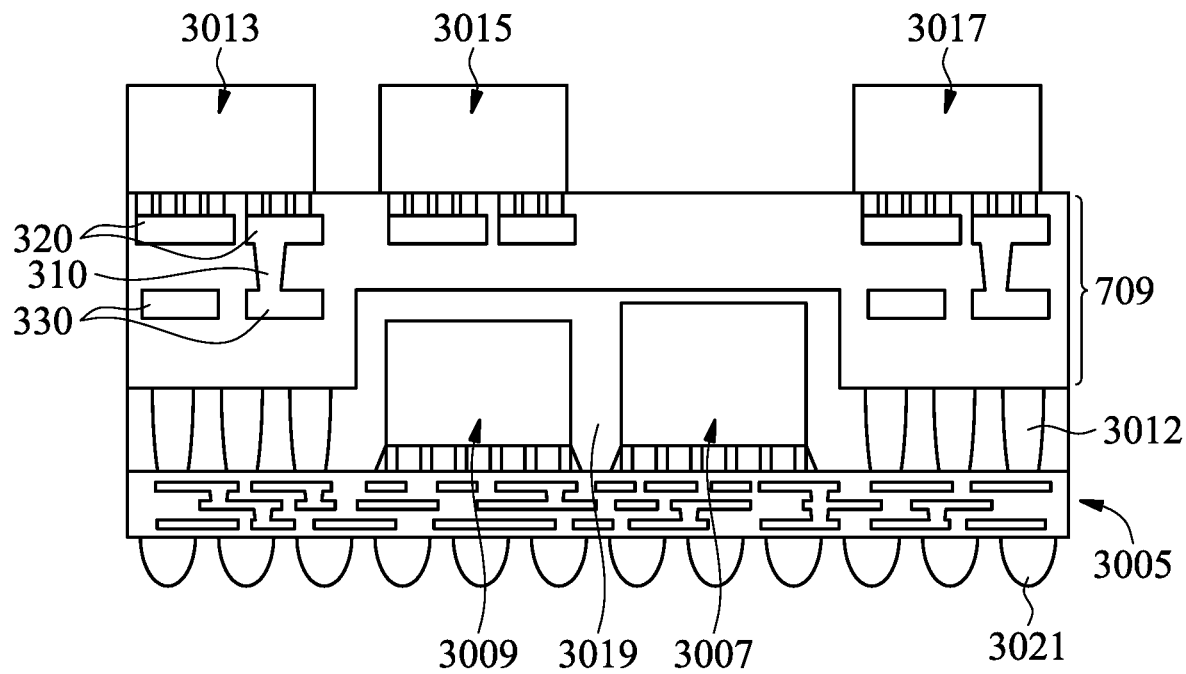

FIG. 73 shows that additional devices (e.g., semiconductor devices 3013, 3015, and 3017) may be stacked on the opposite side of the cavity substrate 709 (the side opposite to the redistribution structure 3005). The devices 3013, 3015, and 3017 may be other package structures, in which case a PoP structure is formed. The devices 3013, 3015, and 3017 may also be integrated circuit dies (e.g., DRAMs, RFICs, and the like), or IPD, or antenna-in-package (AIP), or interposer, or PCB, and/or the like. Other structures, such as integrated antennas, inductors and the like may also be formed directly on the surface of a cavity substrate, as discussed in greater detail below. In the example illustrated in FIG. 73, the devices 3013, 3015, and 3017 may be attached to cavity substrate 709 by, for example, forming die connectors over respective die connector pads of conductive traces 1950 in cavity substrate 709 (see FIG. 66A), and connecting the die connectors to the respective pads of devices 3013, 3015, and 3017. The connections may be made using for example, micro solder bumps. Other suitable bonding techniques such as direct metal-to-metal bonding, hybrid bonding, or the like, may also be used. Electrical connections between the multiple devices may be formed via the redistribution structure of cavity substrate 709 and the redistribution structure 3005. The die connectors 3021 (e.g., solder balls or the like) can be used to connect to other substrates (not shown) such as integrated circuit dies, package structures, IPD, AIP, interposer, PCB, or the like.

The cavity depth is related to the maximum height of a device placed in a cavity substrate. The cavities 700, 710, 1100, 1101, and 2201, described above with reference to FIGS. 7, 26, 42, 52, and 66A, respectively, are shown to have sidewalls and a bottom wall; the cavity does not extend all the way from one side of the cavity substrate to the opposite side. The height of the sidewalls of the cavities 700, 710, 1100, 1101, and 2201 may be from about 50 microns to about 300 microns. Devices, such as device 2000 (e.g., FIGS. 17, 21A, 28A, 31A, 44A, 47A, 54A, and 57A), may be placed within a cavity substrate (e.g., cavity substrates 701-708) with a backside of the device attached to the bottom wall of the cavity, and for example, an RDL structure formed over an active side of the device. In some embodiments, such as illustrated in FIG. 70, an active side of devices (e.g., devices 3007 and 3009) may be first attached to an RDL structure and then a cavity substrate (e.g., cavity substrate 709) with its cavity positioned over the backside of the devices may be connected to the same RDL structure. In all these instances (illustrated in FIGS. 17, 21A, 28A, 31A, 44A, 47A, 54A, 57A, and 70) a deeper cavity may accommodate a taller device placed in a cavity substrate. The maximum depth of the cavity is limited by the thickness of material (e.g., insulation layers 100, or 1900, and protective layers 600, or 1601, illustrated in FIGS. 7 and 66A) remaining between the bottom of the cavity and the bottom of the cavity substrate. The height of the device in the cavity substrate is limited by the difference between the total thickness of the cavity substrate and the thickness of the material remaining between the bottom of the cavity and the bottom of the cavity substrate.

The cavities (e.g., cavities 700, 710, 1100, 1101, and 2201) described hitherto have a bottom wall. However, a taller device may be accommodated in a cavity substrate if the bottom wall is eliminated as described below. It is understood that the parameters of an etching process used to form a cavity can be adjusted such that the cavity extends all the way through to the opposite surface of the respective cavity substrate to form a hole. The hole may have a rectangular shape with a continuous ring of material on all four sides of the rectangular hole, or a rectangular hole may have continuous material on three or fewer sides. The hole may have a circular shape, some other geometrical shape, or the like.

Figure 74A:
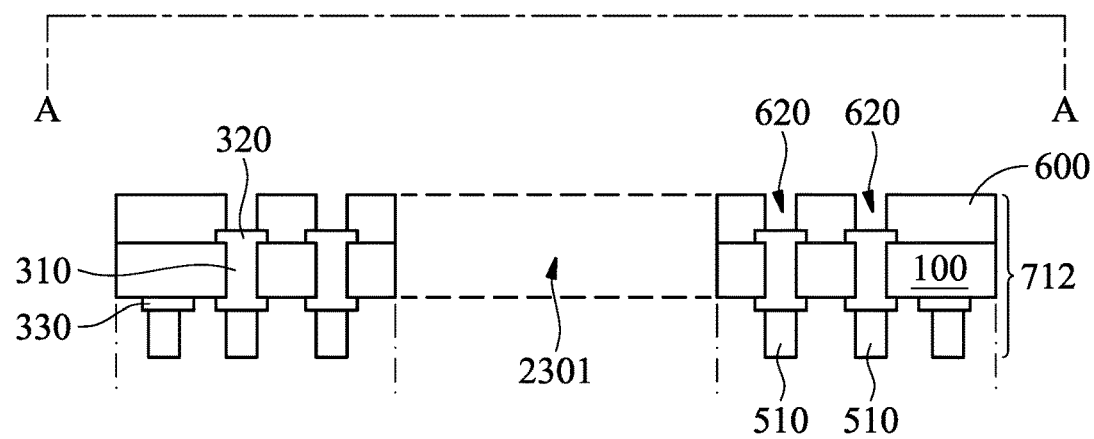
FIGS. 74A through 79 illustrate cross-sectional views of intermediate steps for forming integrated packages, in accordance with some embodiments.
Figure 74B:
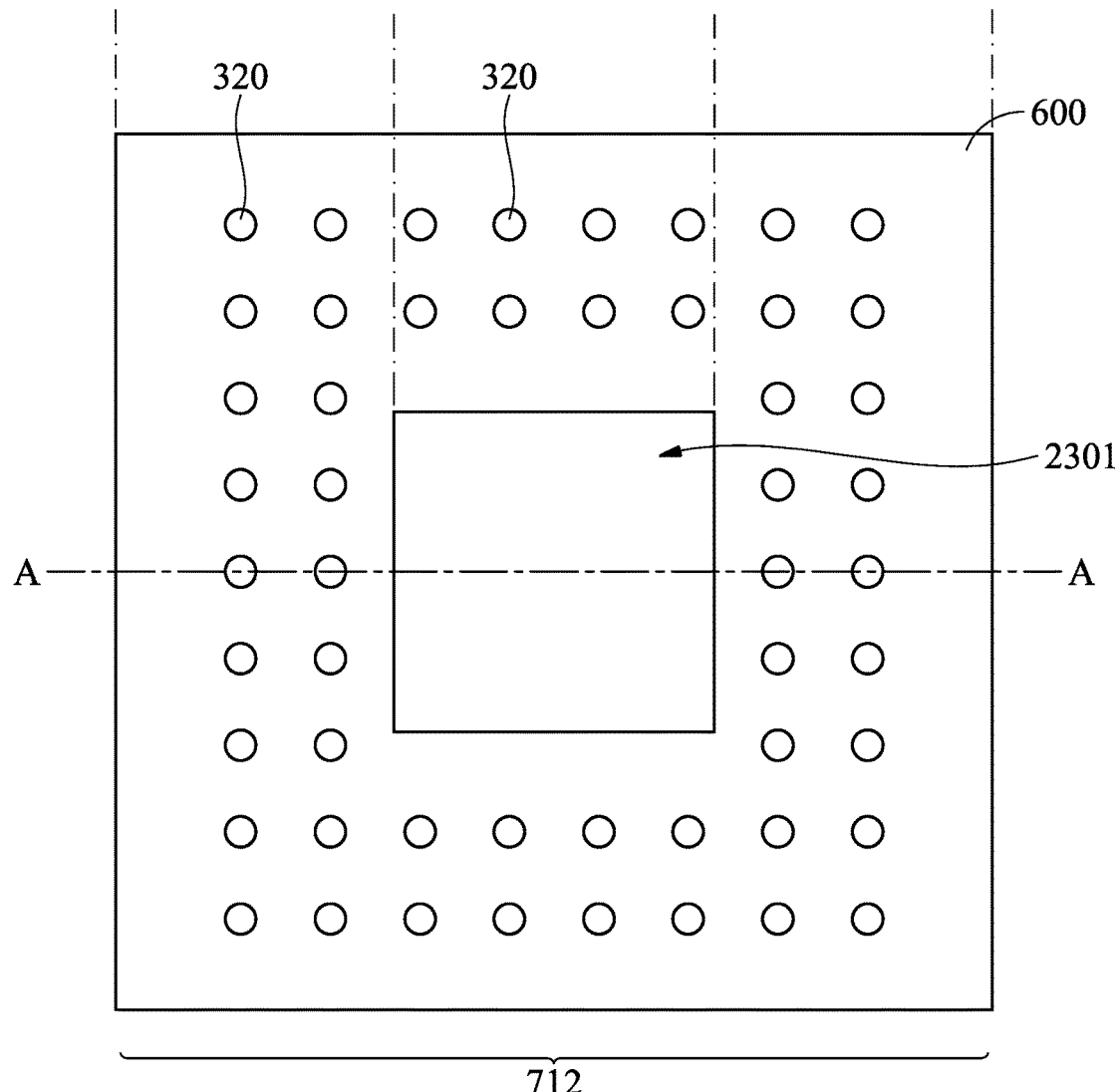

FIGS. 74A through 79 illustrate intermediate steps in fabricating a semiconductor device including a cavity substrate having a hole in accordance with some embodiments. Referring first to FIGS. 74A and 74B, there is shown a cavity substrate 712 wherein a cavity hole 2301 is formed, in accordance with some embodiments, wherein FIG. 74B is a plan view and FIG. 74A is a cross-sectional view taken along the A-A line of FIG. 74B. The structure illustrated in FIG. 74A assumes that the processing steps described above with reference to FIGS. 1 through 6 are first performed. Thereafter, the cavity 2301 in FIG. 74A is formed by using an etching technique similar to that described with reference to FIG. 7, but with the processing parameters adjusted to remove sufficient material such that the cavity extends from one side of the cavity substrate 712 to the opposite side to form a hole cavity 2301. The height of the cavity substrate 712 (total thickness of protective layer 600, insulation layer 100 and the conductive plugs 510) may be from about 70 microns to about 800 microns. In the example illustrated in FIG. 74A, the sacrificial layer (not shown) corresponding to sacrificial layer 400 in FIG. 7, is removed using an etching technique similar to that described above with reference to FIG. 8. The resulting structure is cavity substrate 712 illustrated in FIGS. 74A and 74B. The method hereby described to form cavity substrate 712 corresponds to the method described above to form cavity substrate 702 (shown in FIG. 8) except the processing parameters of the etching technique to form cavity 700 of cavity substrate 702 is modified to form the cavity hole 2301. It is understood that other cavity substrates with a hole may be fabricated likewise by modifying the respective etching process parameters used to form corresponding cavity substrates discussed above wherein the cavity is not a hole.

FIGS. 75 through 79 illustrate a sequence of processing steps that may be used to fabricate an MCM fan-out package wherein cavity substrate 712 (illustrated in FIGS. 74A and 74B) is used as an interposer. It is understood that, in some other embodiments, other cavity substrate structures with a cavity hole may be likewise used to form other MCM fan-out packages.

Figure 75:
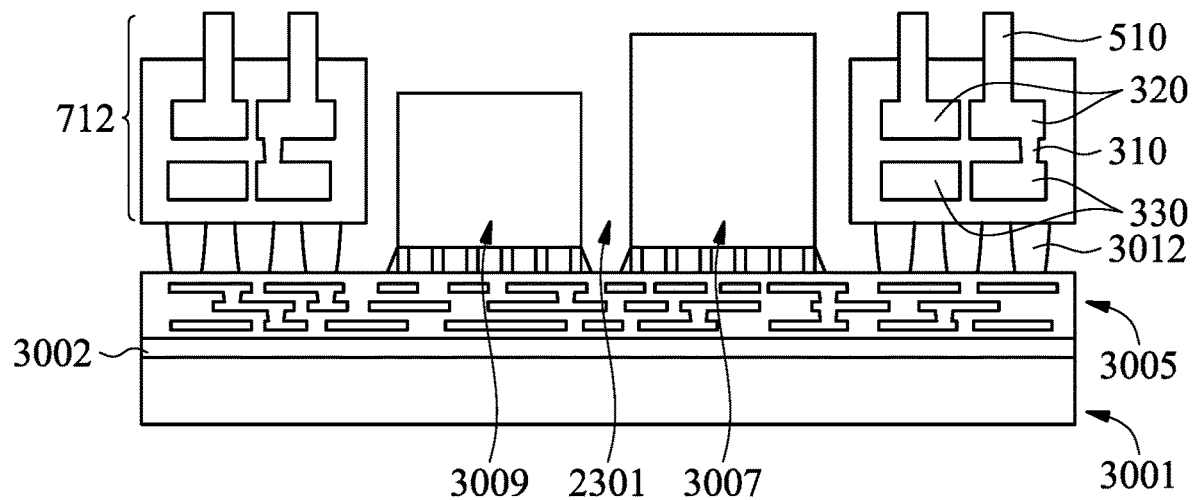

In FIG. 75 it is assumed that the processing steps described above with reference to FIGS. 67 through 69 may be performed first. Referring now to FIG. 75, it is shown that a cavity substrate 712 may be placed on and attached to the first redistribution structure 3005 via conductive die connectors 3012 using techniques that were described above in corresponding processing steps with reference to FIG. 70. In the example illustrated in FIG. 75, the cavity substrate 712 may be shaped as a ring surrounding a rectangular hole 2301 (see FIG. 74B) and is placed such that devices 3007 and 3009 are located inside the hole 2301 of cavity substrate 712. In a cavity substrate, such as cavity substrate 712, the cavity is a hole formed by removing all the material between a portion of the top and bottom surfaces of the cavity substrate. The additional space created by forming a cavity extending through the cavity substrate may be utilized to accommodate a taller device without increasing the height of the cavity substrate.

Figure 76:
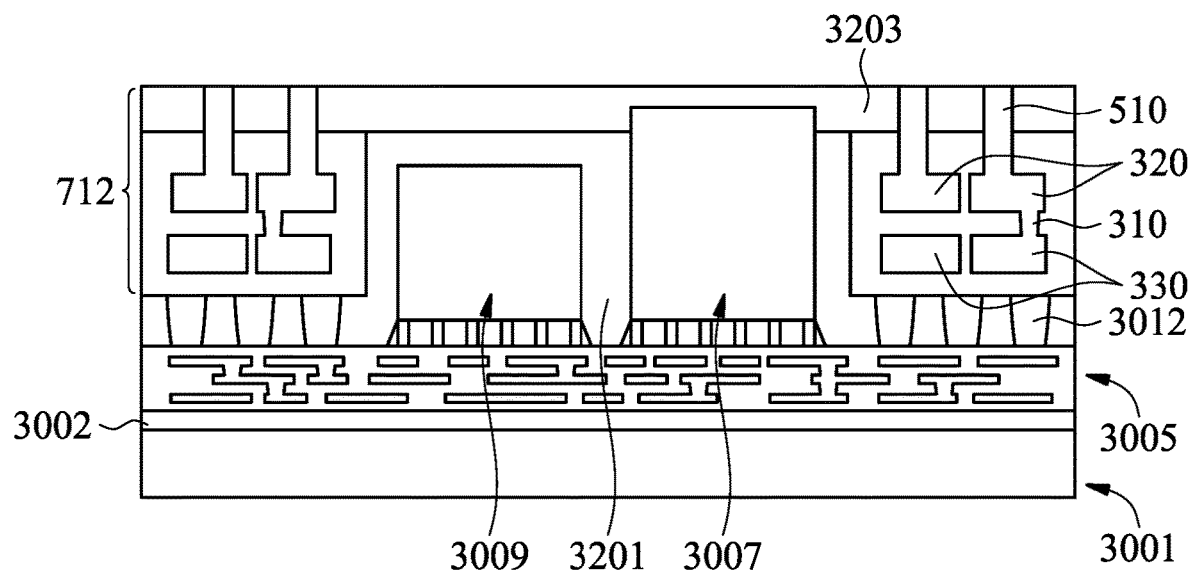

Referring now to FIG. 76, the various components (e.g., cavity substrate 712 and devices 3007 and 3009) may be encapsulated by one or more encapsulation layers. In FIG. 76, two encapsulation layers are shown, in accordance with some embodiments. Other embodiments may use, for example, a single encapsulation layer. In the example shown in FIG. 76, first encapsulation layer 3201 may be formed using, for example, a transfer molding technique. In a transfer molding process the encapsulation layer is self-planarizing because the molding compound may be applied in liquid form. The second encapsulation layer 3203 in FIG. 76 may be formed using, for example, a compression molding technique. Encapsulation layer 3201 fills the space between the various components (e.g., cavity substrate 712 and devices 3007 and 3009) and the redistribution layer 3005 up to a maximum level such that a top portion of the top layer of conductive plugs 510 (shown in FIG. 74A and described above with reference to FIG. 8) is exposed. Encapsulation layer 3203 is formed over encapsulation layer 3201 such that the conductive plugs 510 and the backsides of the devices 3007 and 3009 are covered. A curing process followed by a planarization process using, for example, a CMP or grinding technique, may then be performed on the surface of layer 3203 to expose a top conductive surface of conductive plugs 510 but without exposing any of the backsides of the devices 3007 and 3009.

Figure 77:
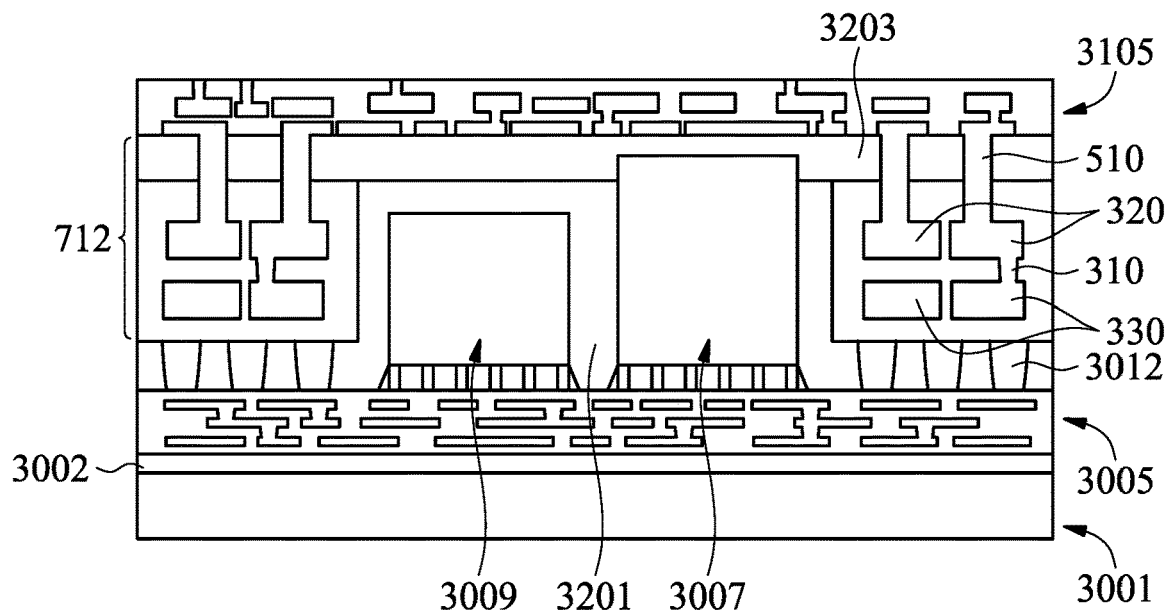

FIG. 77 illustrates a second redistribution structure 3105 formed over the top surface of the structure in FIG. 76. Redistribution structure 3105 is electrically connected to the conductive plugs 510. The second redistribution structure 3105 may be formed using the method described earlier with reference to FIGS. 11 through 14 to form a redistribution structure 2100 in InFO package 111. As illustrated in FIG. 77, the first redistribution structure 3005 may be electrically connected to the second redistribution structure 3105 through a redistribution structure of cavity substrate 712 including conductive features therein (e.g., conductive traces 320 and 330, and conductive plugs 310 shown in FIG. 74A).

Figure 78:
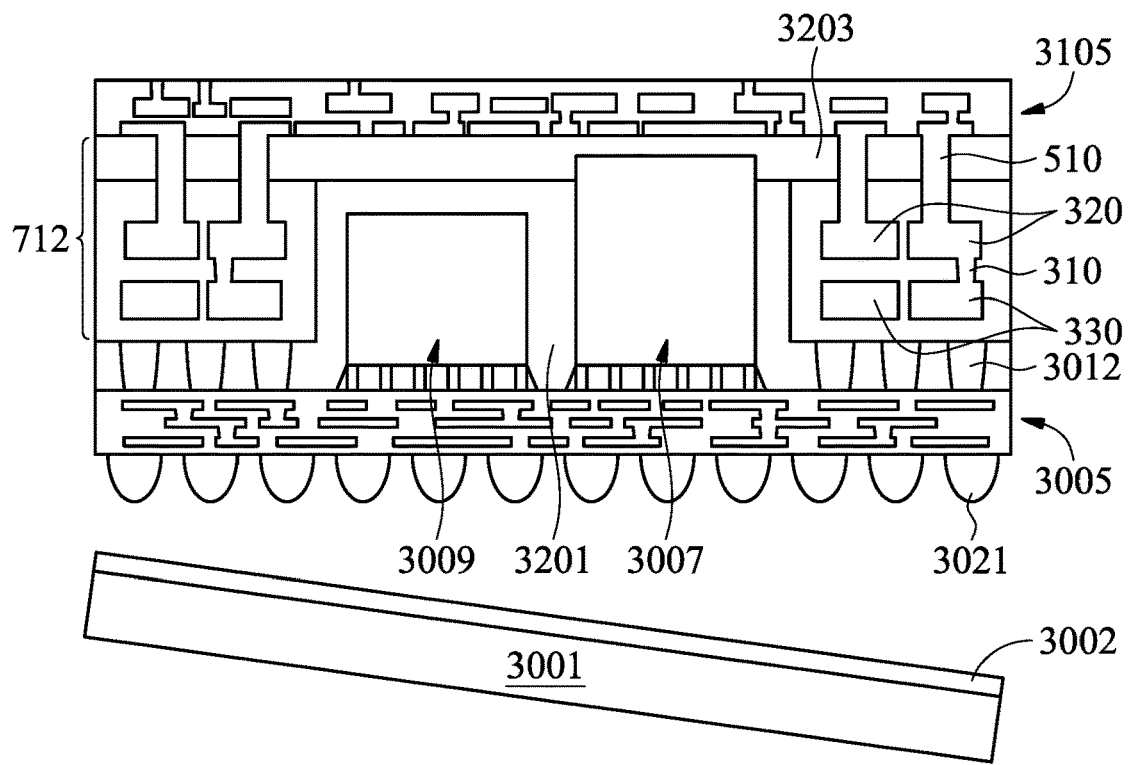

FIG. 78 illustrates the fan-out package structure after a carrier substrate de-bonding is performed to detach (de-bond) the carrier substrate 3001 (seen in FIG. 77) from the redistribution structure 3005. In FIG. 78 conductive connectors 3021 are formed over the surface exposed by de-bonding carrier substrate 3001. The processing techniques and materials described above with reference to FIG. 72 may be used for de-bonding and forming conductive connectors 3021.

Figure 79:
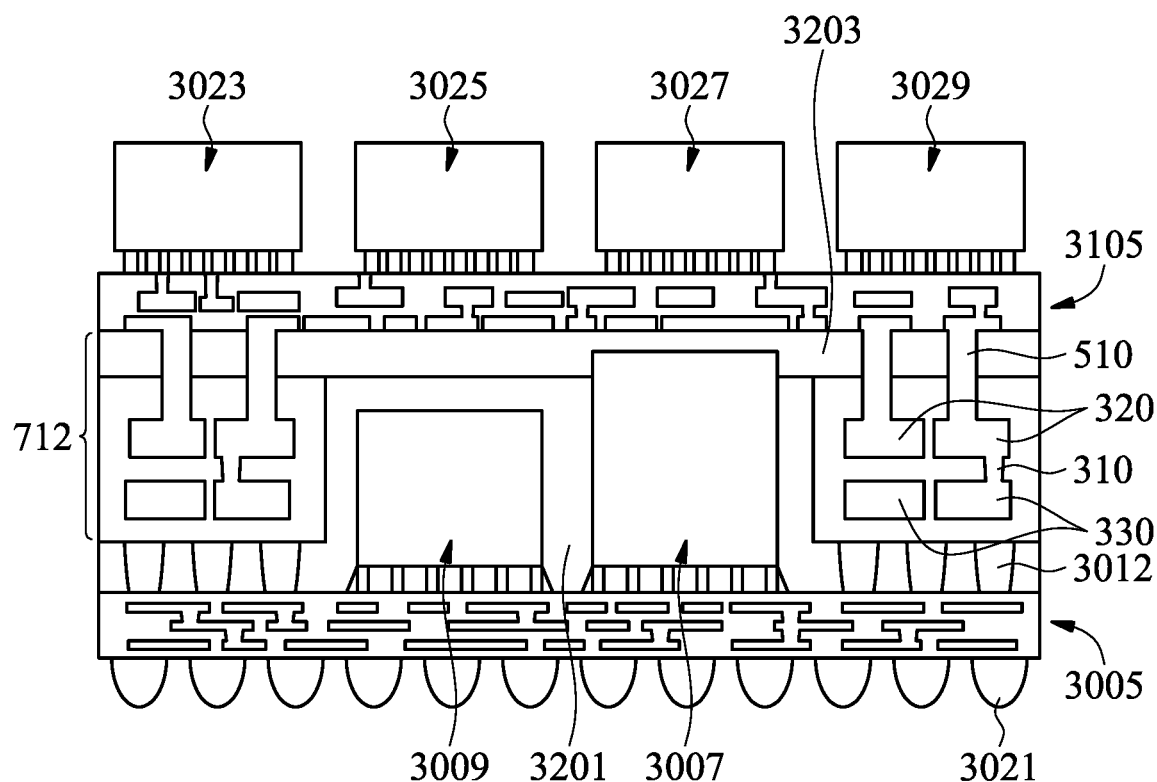

FIG. 79 shows that additional devices (e.g., devices 3023, 3025, 3027, and 3029) may be stacked on the second redistribution structure 3105 of the cavity substrate 712. The devices 3023, 3025, 3027, and 3029 may be other package structures, in which case a PoP structure is formed. The devices 3023, 3025, 3027, and 3029 may also be integrated circuit dies (e.g., DRAMs, RFICs, and the like), or AIP, or interposer, or PCB, and/or the like. The devices 3023, 3025, 3027, and 3029 may be attached to the second redistribution structure 3105 using the method described above with reference to FIG. 68 to attach devices 3007 and 3009 to the first redistribution structure 3005. Electrical connections between the multiple devices may be accomplished via the redistribution structure of cavity substrate 712 and the redistribution structures 3005 and 3105. The die connectors 3021 (e.g., solder balls or the like) can be used to connect to other substrates (not shown) such as integrated circuit dies, package structures, IPD, AIP, interposer, PCB, or the like.

FIGS. 80A through 84A illustrate cross-sectional views of forming an InFO package, in accordance with some embodiments. In FIGS. 80 through 84A a cavity substrate with a composite cavity including a hole and an overhang is used as an interposer. An RDL-first flow is used in this example.

Figure 80A:
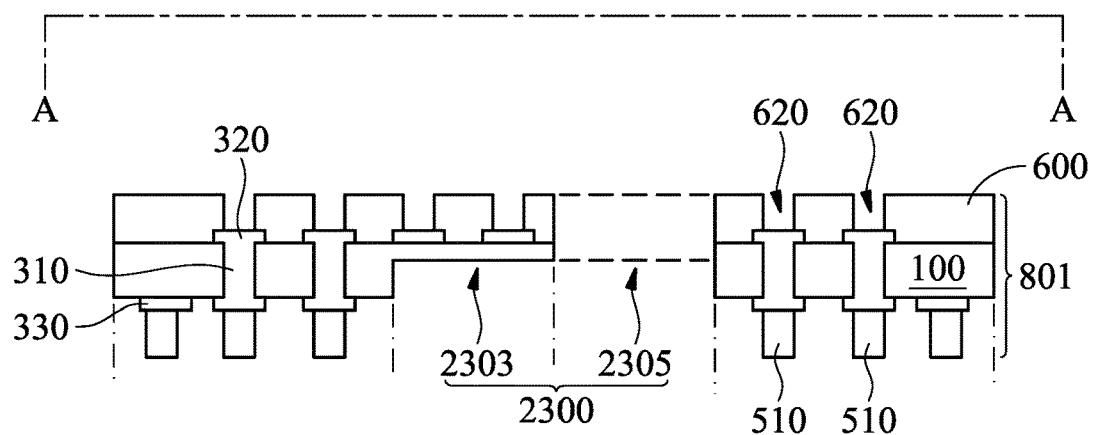
Figure 80B:
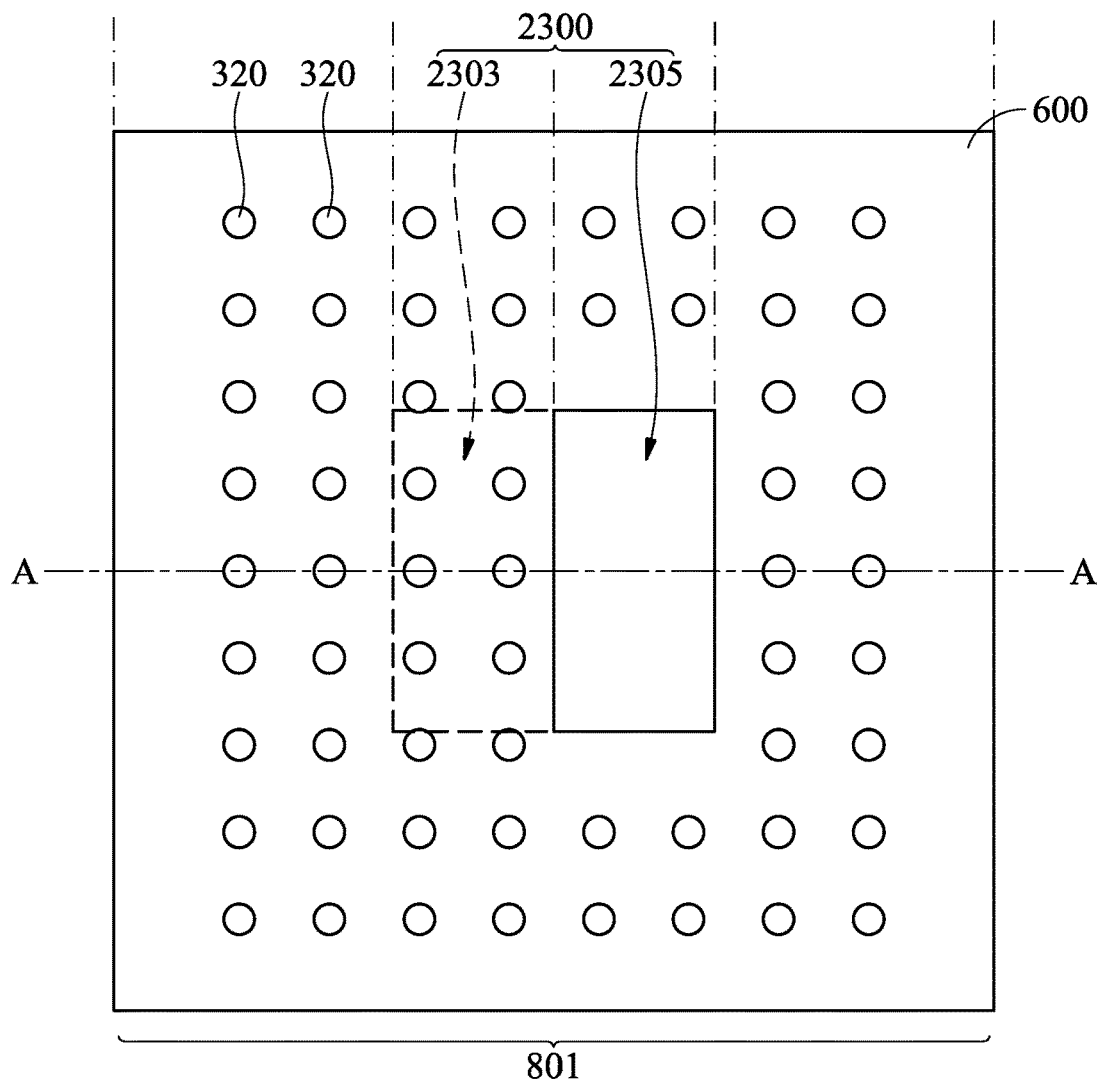

FIGS. 80A and 80B illustrate a cavity substrate 801 wherein the composite cavity 2300 is shaped as a hole with an overhang. FIG. 80B is a plan view and FIG. 80A is a cross-sectional view taken along the A-A line of FIG. 80B. Composite cavity 2300 may be considered as a combination of two cavity structures 2303 and 2305. As illustrated in FIG. 80A, first cavity structure 2303 includes a sidewall and bottom wall (similar to cavities 700, 710, 1100, 1101, and 2201, described above with reference to FIGS. 7, 26, 42, 52, and 66A, respectively), whereas second cavity structure 2305 is a hole (similar to cavity 2301 shown in FIGS. 74A and 74B). Cavity 2300 may be formed using a sequence of two processing steps, a first processing step to form first cavity structure 2303 using an etching process described earlier to form cavities with a continuous, unbroken bottom wall (e.g., cavities 700, 710, 1100, 1101, and 2201, described above with reference to FIGS. 7, 26, 42, 52, and 66A, respectively), and a second processing step to form second cavity structure 2305 using an etching process described earlier with reference to FIG. 74A to form the hole 2301 of cavity substrate 712. In FIGS. 80A and 80B the two cavity structures 2303 and 2305 of the composite cavity 2300 are shown to be contiguous. However, it is understood that, in some embodiments, a region without a recess or a hole may be interposed between the recess cavity 2303 and the hole cavity 2305.

FIGS. 81 through 84A illustrate a sequence of processing steps that may be used to fabricate an MCM fan-out package wherein cavity substrate 801 (illustrated in FIG. 80) is used as an interposer. It is understood that, in some other embodiments, other cavity substrate structures with a composite cavity hole and an overhang may be likewise used to form other MCM fan-out packages.

The process sequence illustrated in FIGS. 81 through 84A is similar to the process sequence described above with reference to FIGS. 70 through 73. Processes and materials used in processing steps performed in FIGS. 81 through 84A may be similar to those used for corresponding processing steps in FIGS. 70 through 73, respectively.

Figure 81:
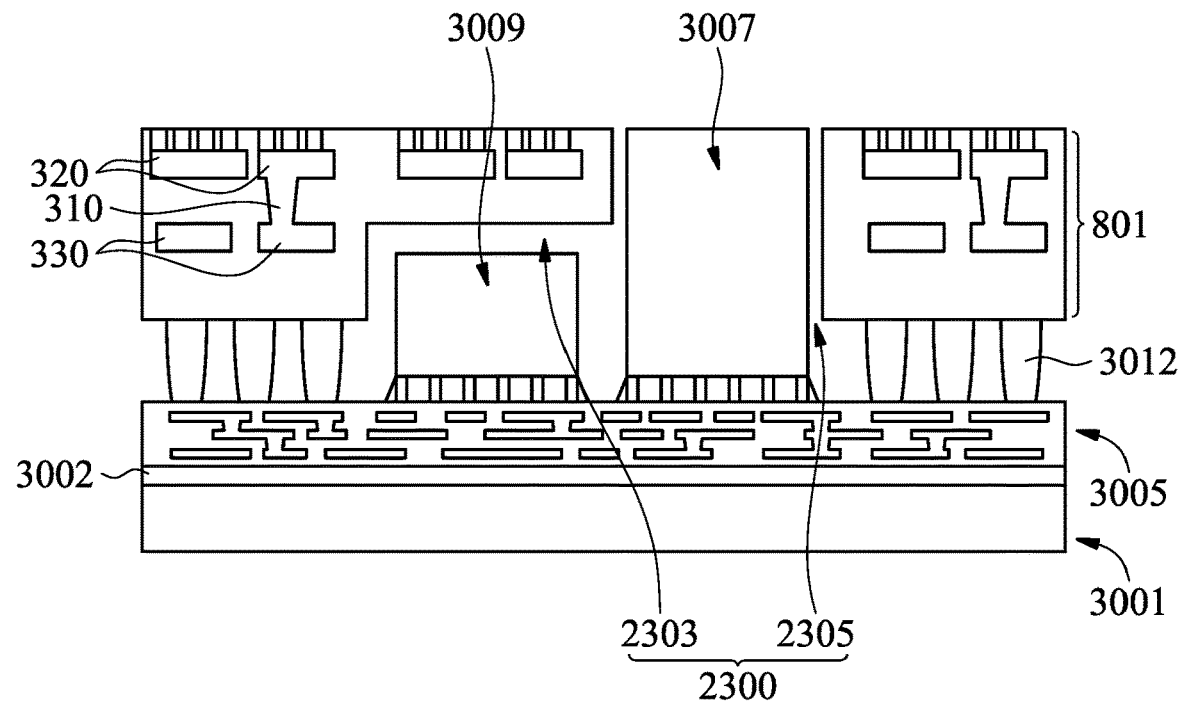

In FIG. 81 it is assumed that the processing steps described above with reference to FIGS. 67 through 69 may be performed first. Referring now to FIG. 81, cavity substrate 801 is placed on and attached to the top surface of redistribution structure 3005 via conductive die connectors 3012. A comparison of FIGS. 81 and 70 reveals that, because of the hole 2305 in composite cavity 2300, the maximum vertical dimension of a device located in cavity 2300 can potentially be greater than the maximum vertical dimension of a device located in a corresponding cavity 2201 of cavity substrate 709 (see FIG. 70). This advantage of a cavity with a hole may also be understood by considering the maximum height of a device that can be accommodated in the region of cavity 2300 which has a cavity structure 2303 (shown in FIG. 81) and comparing that to the maximum height of a device that can be accommodated in the region of cavity 2300 which has a cavity structure 2305 (also shown in FIG. 81).

Figure 82:
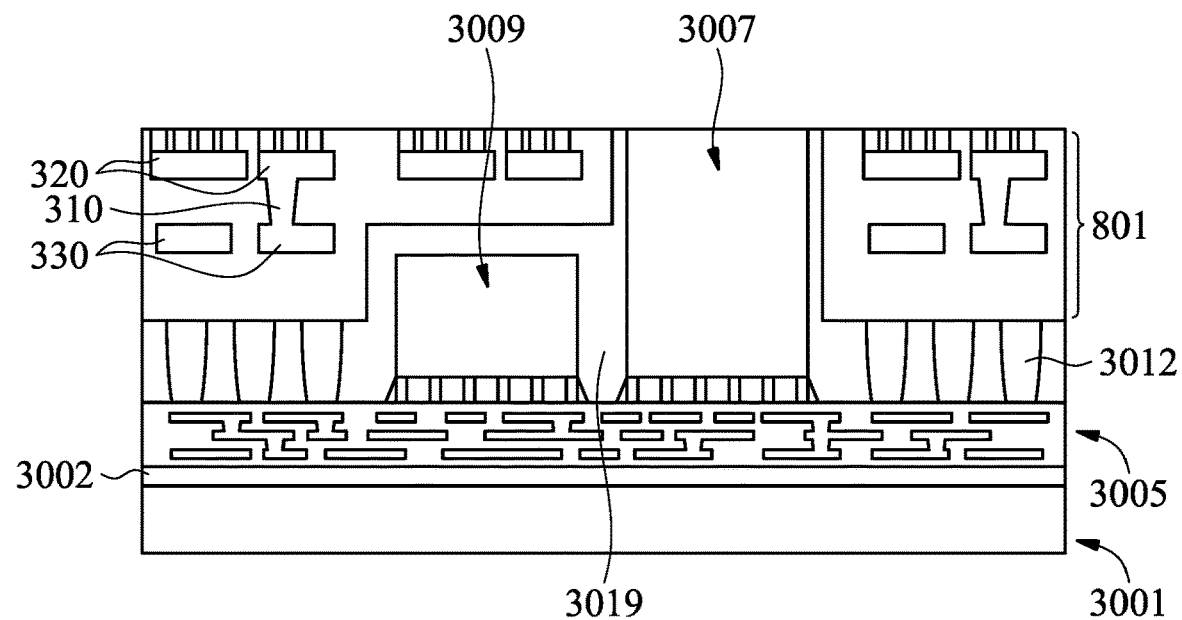
Figure 83:
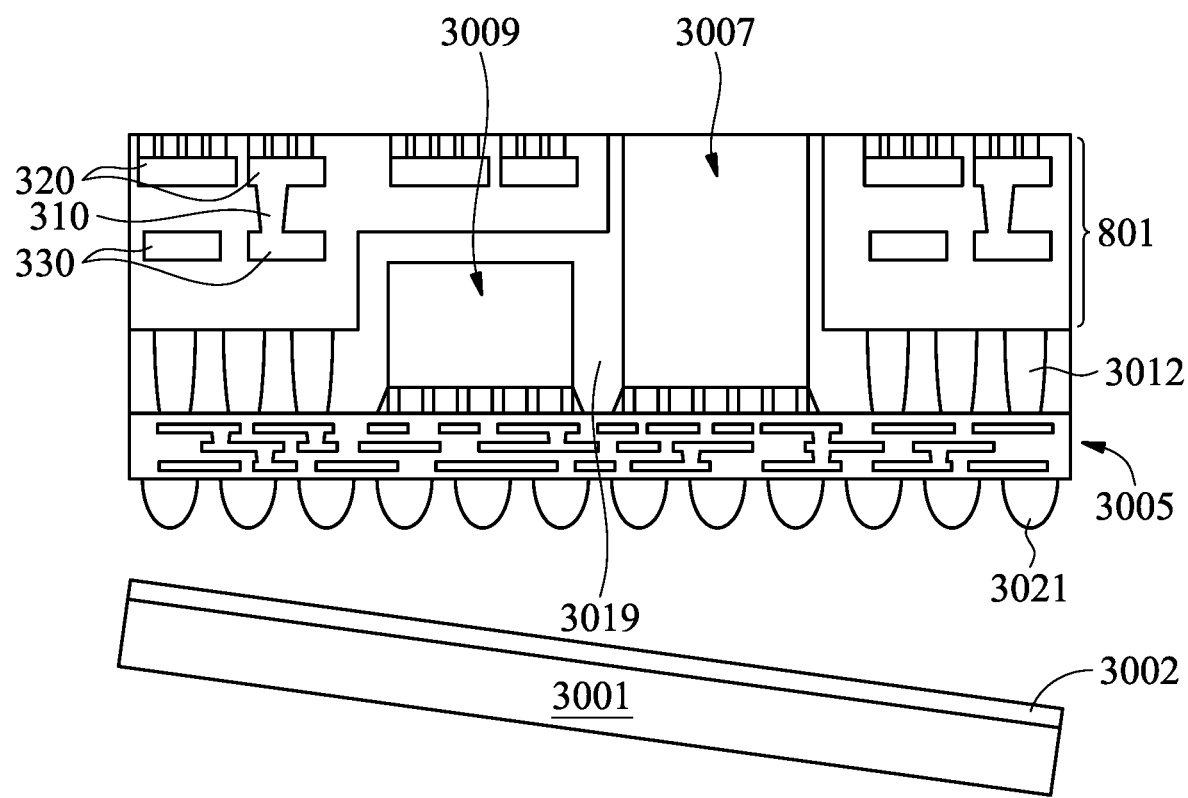
Figure 84A:
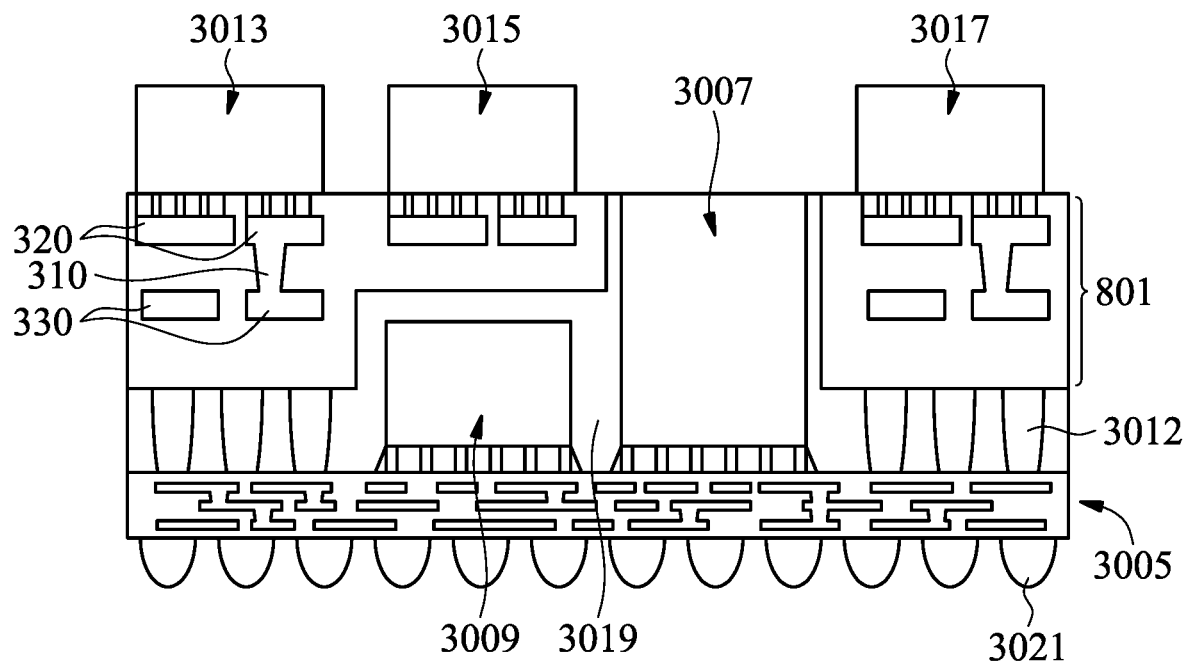

FIG. 82 illustrates the processing steps for encapsulating the devices 3007 and 3009 in encapsulant 3019. FIG. 83 illustrates the processing steps for detaching the carrier substrate 3001 from the redistribution structure 3005 utilizing the release layer 3002, and forming die connectors 3021. In FIG. 84A additional devices 3013, 3015, and 3017 are shown placed and attached on an upper surface of cavity substrate 801 (the surface on the side opposite to the redistribution structure 3005). The processes illustrated in FIGS. 82 through 84A may be performed using materials and processing techniques described earlier with reference to FIGS. 71 through 73 in respective processing steps. A top view of the resulting structure illustrated in FIG. 84A is shown in FIG. 84B.

Figure 85A:
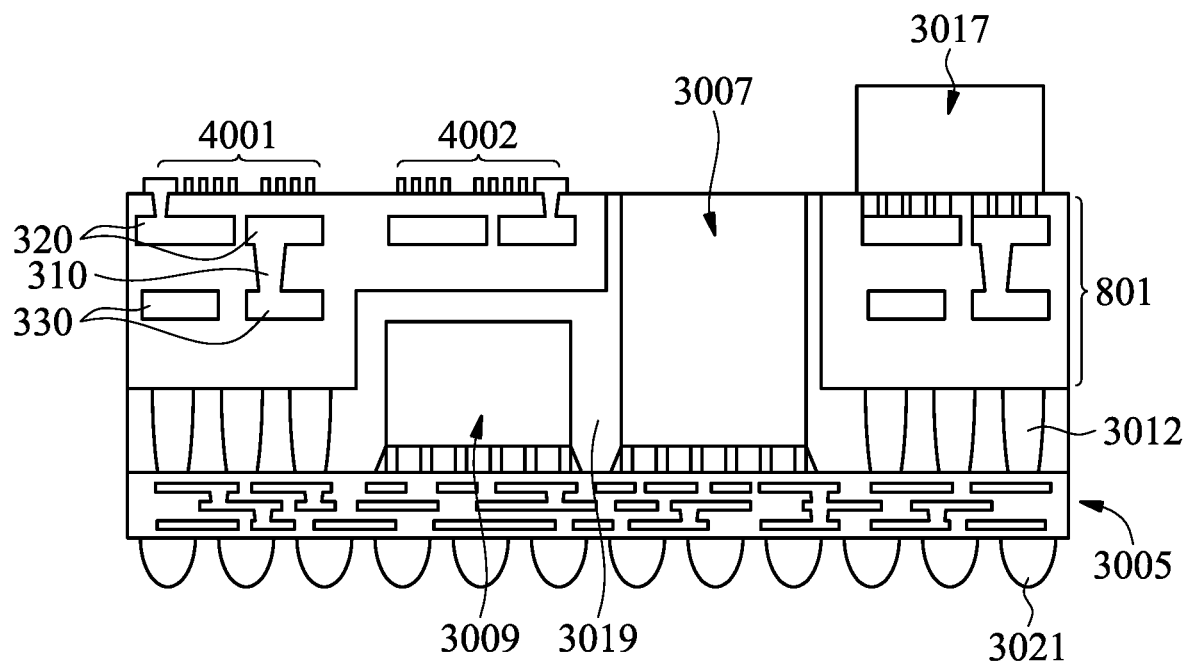
FIG. 85A illustrates a cross-sectional view of an intermediate step for forming integrated packages, in accordance with some embodiments.

An additional device 3017 is seen attached to the upper surface of cavity substrate 801 in FIG. 85A, similar to the structure illustrated in FIG. 84A. In addition, FIG. 85A illustrates integrated passive electronic components 4001 and 4002 (e.g., integrated antennas, inductors, and the like) formed directly on the upper surface of cavity substrate 801, in accordance with some embodiments. The integrated passive electronic components 4001 and 4002 include conductive traces of a patterned conductive layer formed on the upper surface. In some embodiments, the patterned layer of conductive traces of integrated passive electronic components 4001 and 4002 may be formed after the top dielectric layer of cavity substrate 801 is etched to form openings 620 (shown in FIG. 80A) to reveal conductive pads of conductive traces 320 (also shown in FIG. 80A). In some embodiments, first a conductive seed layer may be deposited over the top dielectric surface of cavity substrate 801, the sidewalls of the openings 620, and exposed portions of conductive traces 320. The conductive seed layer may be deposited using any suitable technique such as PVD, CVD, or the like. A patterned mask may be formed over the seed layer to selectively expose the seed layer over conductive pads of conductive traces 320 and over the regions where conductive traces may be used to form the integrated passive electronic components 4001 and 4002 and also to connect to respective conductive pads of conductive traces 320. In some embodiments, the masking layer may be a patterned photoresist layer formed using suitable photolithography techniques. Conductive material may be then deposited over the exposed portions of the seed layer using a suitable deposition technique (e.g., electroplating, electroless plating, or the like). After deposition of the conductive material is completed, the patterned masking layer may be removed using, for example, an ashing process to strip the photoresist. Formation of the patterned conductive layer used to form passive electronic components 4001 and 4002 may be completed by removing the portions of the seed layer that are exposed from below the patterned masking layer after the masking layer is removed; for example, from below the photoresist mask after the ashing process is completed. The conductive traces that are formed extending through the top dielectric layer to the conductive pads of conductive traces 320 may be used to electrically connect electrodes of integrated passive components 4001 and 4002 to respective conductive pads 320 of cavity substrate 801.

Figure 84B:
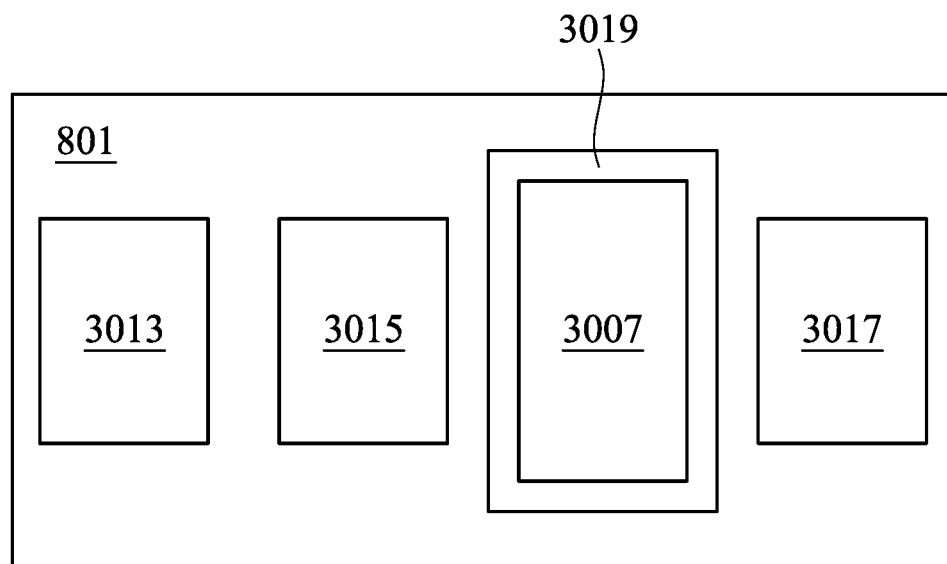
FIG. 84B illustrates a plan view of the integrated package structure of FIG. 84A, in accordance with some embodiments.
Figure 85B:
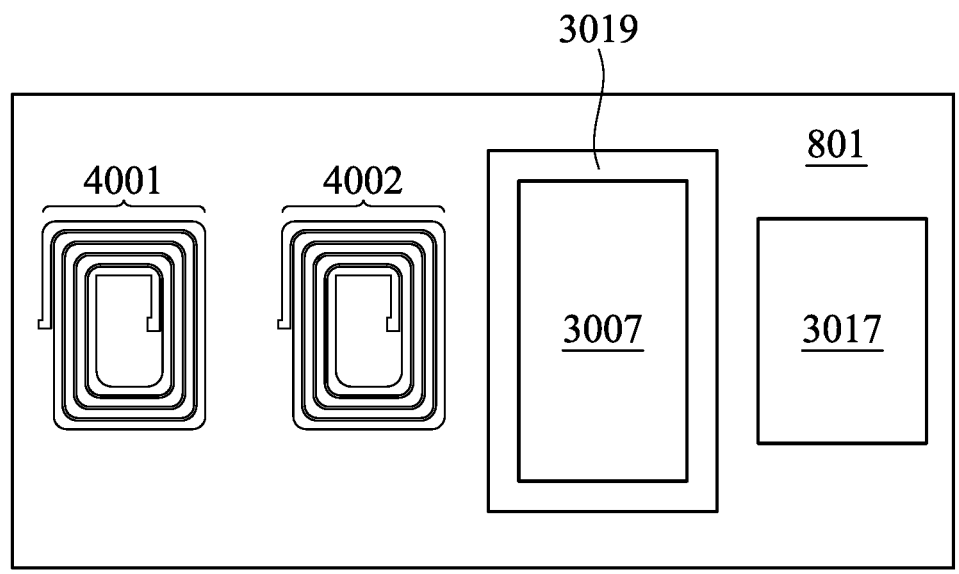
FIG. 85B illustrates a plan view of the integrated package structure of FIG. 85A, in accordance with some embodiments.

The MCM fan-out package structure illustrated in FIGS. 84A and 84B, as well as the MCM fan-out package structure illustrated in FIGS. 85A and 85B incorporate the cavity substrate 801 including the composite cavity 2300 illustrated in FIG. 80. Electrical connections between the multiple devices of the MCM fan-out package illustrated in FIG. 84A may be accomplished via the redistribution structure of cavity substrate 801 and the redistribution structure 3005. Similarly, electrical connections between the integrated passive components and the multiple devices of the MCM fan-out package illustrated in FIG. 85A may be accomplished via the redistribution structure of cavity substrate 801 and the redistribution structure 3005.

Embodiments of structures and methods for forming InFO packages described above are compatible with WLP technology. In some embodiments, the packages utilize cavity substrates with one or more devices encapsulated within a cavity of the cavity substrates. For example, the cavity may include a recess having a bottom wall, or a hole extending through the cavity substrate. Additionally, the cavity may be a composite structure wherein one portion of the cavity is a hole while the other portion of the cavity includes a recess having a bottom wall. Creating a recess or hole in which devices may be located facilitates forming thinner InFO packages. A thinner package die has the advantage of reduced warpage during processing as explained below. Increasing the thickness of a package increases the thickness of the molding material used to encapsulate the devices placed in the package. Because of mismatch between the CTE of the substrates and the molding compound, a thinner package having less molding compound is less prone to warping during a thermal curing step. Packages with less warpage, such as those using cavity substrates, are better suited to form 3D MCMs where devices may be stacked vertically, thereby forming PoP structures.

Embodiments such as those discussed above may further provide structures utilizing heterogeneous substrates. The heterogeneous substrates itself helps control the amount of warpage. For example, as discussed above, the heterogeneous substrates utilize less molding compound as compared to those using only molding compound. As the materials used to form the pre-formed substrates (such as ABF, prepreg, etc.) typically exhibit a CTE closer to that of a semiconductor die than the molding compound, the CTE mismatch will be less, resulting in less warpage.

Embodiments such as those discussed herein further provide greater integration capabilities by allowing multiple devices (e.g., dies, packages, etc.) having the same or different functionality to be integrated into a single package. For example, one or more memory dies or packages may be integrated in a single package, with or without other devices such as system-on-chip (SOC) devices, providing a higher memory capacity.

In an embodiment, a method of forming a semiconductor structure includes placing a semiconductor device in a cavity of a cavity substrate and, after placing the semiconductor device in the cavity, forming a molding compound along sidewalls of the semiconductor device; and forming a redistribution structure over the cavity substrate, the molding compound, and the semiconductor device. In an embodiment the method further includes forming the cavity substrate, wherein forming the cavity substrate includes forming a masking layer on a substrate, patterning the masking layer to form pillar openings over the substrate, forming conductive pillars in respective ones of the pillar openings; after forming the conductive pillars, patterning the masking layer to form a cavity opening over the substrate, and forming the cavity in the substrate below the cavity opening in the masking layer, wherein the cavity substrate includes the substrate and the patterned masking layer. In this embodiment, the molding compound is interposed between sidewalls of the semiconductor device and sidewalls of the masking layer. In an embodiment, the method further includes forming the cavity substrate, wherein forming the cavity substrate includes forming a masking layer on a substrate; patterning the masking layer to form pillar openings and a recess opening, forming conductive pillars in respective ones of the pillar openings and a sacrificial conductive plug in the recess opening, and removing the sacrificial conductive plug and forming the cavity in the substrate within the recess opening, wherein the cavity substrate includes the substrate and the masking layer. In this embodiment, the molding compound is interposed between sidewalls of the semiconductor device and sidewalls of the masking layer. In an embodiment, the method further includes forming the cavity substrate, wherein forming the cavity substrate includes forming a first masking layer on a first carrier substrate, patterning the first masking layer to form pillar openings, forming conductive pillars in respective ones of the pillar openings; after forming the conductive pillars, removing the first masking layer, forming a second masking layer over the first carrier substrate, forming conductive traces over the second masking layer and the conductive pillars, the conductive traces include a first conductive trace; placing a first substrate over the second masking layer and the conductive traces; removing the first carrier substrate, and patterning the second masking layer to form the cavity in the second masking layer, wherein the cavity substrate includes the first substrate and the second masking layer. In this embodiment, the molding compound is interposed between the semiconductor device and the second masking layer. In this embodiment, the cavity extends into the first substrate. In an embodiment, the method further includes forming the cavity substrate, wherein forming the cavity substrate includes forming a first masking layer on a first carrier substrate, patterning the first masking layer to form pillar openings and a recess opening, forming conductive pillars in respective ones of the pillar openings and a sacrificial conductive region in the recess opening; after forming the conductive pillars, removing the first masking layer, forming a second masking layer over the first carrier substrate, forming conductive traces over the second masking layer and the conductive pillars, the conductive traces include a first conductive trace over the sacrificial conductive region; placing a first substrate over the second masking layer and the conductive traces; removing the first carrier substrate, and removing the sacrificial conductive region, wherein the cavity substrate comprises the first substrate and the second masking layer. In this embodiment, the removing the sacrificial conductive region include removing the first conductive trace. In this embodiment, the molding compound is interposed between the semiconductor device and the second masking layer.

In another embodiment, a method of forming a semiconductor structure includes forming a first redistribution structure over a carrier substrate, attaching a first semiconductor device to the first redistribution structure, attaching a cavity substrate to the first redistribution structure, forming a molding compound between sidewalls of the cavity substrate and sidewalls of the first semiconductor device, and electrically coupling a second semiconductor device to the cavity substrate, wherein the cavity substrate is electrically interposed between the second semiconductor device and the first redistribution structure. In an embodiment, the method further includes, after forming the molding compound, forming a second redistribution structure over the molding compound, wherein the cavity substrate is interposed between the first redistribution structure and the second redistribution structure. In an embodiment, the cavity substrate covers the first semiconductor device. In an embodiment, the method further includes attaching a second semiconductor device to the first redistribution structure, wherein the cavity substrate at least partially covers the first semiconductor device, and wherein the cavity substrate does not cover the second semiconductor device. In an embodiment, the molding compound includes a first molding compound layer and a second molding compound layer over the first molding compound layer.

In an embodiment, a semiconductor structure includes a cavity substrate, where the cavity substrate incudes conductors extending from a first side of the cavity substrate to a second side of the cavity substrate; the semiconductor structure also includes a first semiconductor device, a molding compound extending between sidewalls of the first semiconductor device and sidewalls of the cavity substrate, and a first redistribution structure over the molding compound, the first semiconductor device, and the cavity substrate. In an embodiment, the cavity substrate extends over a backside of the first semiconductor device. In an embodiment, the first semiconductor device extends through the cavity substrate. In an embodiment, the semiconductor structure further includes a second semiconductor device, wherein the cavity substrate extends over a backside of the second semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   forming a cavity substrate, wherein forming the cavity substrate comprises:
   forming a masking layer on a substrate;
   patterning the masking layer to form pillar openings and a recess opening;
   forming conductive pillars in respective ones of the pillar openings and a sacrificial plug in the recess opening;
   removing the sacrificial plug and forming a cavity in the substrate within the recess opening, wherein the cavity substrate comprises the substrate and the masking layer;
   removing remaining portions of the masking layer;

attaching a back surface of a semiconductor device to a bottom surface of the cavity in the cavity substrate, a front surface of the semiconductor device having a contact pad;

after placing the semiconductor device in the cavity, forming a molding compound along sidewalls of the semiconductor device; and forming a first redistribution structure over the cavity substrate, the molding compound, and the semiconductor device, the first redistribution structure comprising a conductive line coupled to the contact pad.

2. The method of claim 1, wherein the molding compound extends into the cavity.

3. The method of claim 1, wherein the molding compound extends along sidewalls of the conductive pillars.

4. The method of claim 1, further comprising forming a second redistribution structure on the cavity substrate, wherein the cavity substrate is between the semiconductor device and the second redistribution structure.

5. The method of claim 4, wherein forming the second redistribution structure is performed after forming the first redistribution structure.

6. The method of claim 5, further comprising:

forming a first set of external connectors on the first redistribution structure; and forming a second set of external connectors on the second redistribution structure.

7. The method of claim 1, wherein the sacrificial plug comprises a sacrificial conductive plug.

8. The method of claim 1, wherein the semiconductor device has a thickness greater than a depth of the cavity.

9. A method of forming a semiconductor structure, the method comprising:

forming a cavity substrate, wherein forming the cavity substrate comprises:

forming conductive pillars and a first masking layer on a first carrier substrate;

forming conductive traces over the first masking layer and the conductive pillars, the conductive traces comprising a first conductive trace;

forming a first redistribution structure over the first masking layer and the conductive traces;

removing the first carrier substrate; and removing the first masking layer;

attaching a back surface of a semiconductor device to the first conductive trace, a front surface of the semiconductor device having a contact pad;

after placing the semiconductor device, forming a molding compound along sidewalls of the semiconductor device and the conductive pillars; and forming a second redistribution structure over the molding compound and the semiconductor device, the second redistribution structure comprising a conductive line coupled to the contact pad.

10. The method of claim 9, wherein forming the first redistribution structure comprises placing a single-sided metal-clad laminate over the first masking layer and the conductive traces.

11. The method of claim 9, further comprising forming a second redistribution structure on the first masking layer, wherein after forming the molding compound, the molding compound is between the first redistribution structure and the second redistribution structure.

12. The method of claim 11, further comprising forming a first external connector on the first redistribution structure.

13. The method of claim 12, further comprising forming a second external connector on the second redistribution structure.

14. The method of claim 9, wherein a width of the first conductive trace is greater than a width of the semiconductor device.

15. A method of forming a semiconductor structure, the method comprising:

forming a cavity substrate, wherein forming the cavity substrate comprises:

forming conductive pillars and a first masking layer on a first carrier substrate;

forming conductive traces over the first masking layer and the conductive pillars, the conductive traces comprising a first conductive trace;

forming a first redistribution structure over the first masking layer and the conductive traces;

removing the first carrier substrate;

removing the first masking layer; and removing the first conductive trace to form a cavity in the first redistribution structure;

attaching a back surface of a semiconductor device to a bottom surface of the cavity, a front surface of the semiconductor device having a contact pad; and after placing the semiconductor device in the cavity, forming a molding compound along sidewalls of the semiconductor device and the conductive pillars.

16. The method of claim 15, further comprising forming a second redistribution structure over the molding compound and the semiconductor device, the second redistribution structure comprising a conductive line coupled to the contact pad.

17. The method of claim 16, further comprising forming a first external connector on the first redistribution structure.

18. The method of claim 17, further comprising forming a second external connector on the second redistribution structure.

19. The method of claim 15, wherein the molding compound extends into the cavity.

20. The method of claim 15, wherein the semiconductor device has a thickness greater than a depth of the cavity.

* * * * *